United States Patent
Kawashima

(10) Patent No.: US 8,217,736 B2
(45) Date of Patent: Jul. 10, 2012

(54) QUARTZ CRYSTAL UNIT, AND MANUFACTURING METHOD OF THE SAME AND MANUFACTURING METHOD OF QUARTZ CRYSTAL OSCILLATOR HAVING QUARTZ CRYSTAL UNIT

(75) Inventor: Hirofumi Kawashima, Tokyo (JP)

(73) Assignee: Piedek Technical Laboratory (JP)

( * ) Notice: Subject to any disclaimer, the term of this patent is extended or adjusted under 35 U.S.C. 154(b) by 672 days.

(21) Appl. No.: 12/220,026

(22) Filed: Jul. 21, 2008

(65) Prior Publication Data

US 2008/0282521 A1    Nov. 20, 2008

Related U.S. Application Data

(60) Division of application No. 11/301,530, filed on Dec. 13, 2005, now Pat. No. 7,412,764, which is a continuation-in-part of application No. 10/749,182, filed on Dec. 30, 2003, now Pat. No. 7,071,794, which is a continuation-in-part of application No. 10/378,719, filed on Mar. 4, 2003, now abandoned.

(30) Foreign Application Priority Data

Mar. 6, 2002    (JP) .................. 2002-060827

(51) Int. Cl.
*H03H 9/215*    (2006.01)
*H03B 5/32*    (2006.01)
*H03B 5/36*    (2006.01)
*H01L 41/053*    (2006.01)

(52) U.S. Cl. .................... 333/187; 333/200; 331/107 A; 331/156; 310/370

(58) Field of Classification Search .................. 333/186, 333/200; 331/116 R, 107 A, 156, 158, 163; 310/348, 366, 367, 370
See application file for complete search history.

(56) References Cited

U.S. PATENT DOCUMENTS

| | | | |
|---|---|---|---|
| 6,541,897 B2 * | 4/2003 | Endoh ........................ | 310/344 |
| 6,587,009 B2 * | 7/2003 | Kitamura et al. ............ | 331/158 |
| 6,768,247 B2 * | 7/2004 | Kitamura et al. ............ | 310/370 |
| 6,791,243 B2 * | 9/2004 | Kawashima ................. | 310/370 |
| 6,897,743 B2 * | 5/2005 | Kawashima ................. | 333/187 |
| 6,903,618 B2 * | 6/2005 | Kawashima ................. | 331/158 |
| 6,915,548 B2 * | 7/2005 | Kawashima ................. | 29/25.35 |
| 6,959,472 B2 * | 11/2005 | Kawashima ................. | 29/25.35 |
| 7,071,794 B2 * | 7/2006 | Kawashima ................. | 333/187 |
| 7,170,218 B2 * | 1/2007 | Kawashima ................. | 310/370 |
| 7,779,530 B2 * | 8/2010 | Kawashima ................. | 29/594 |
| 7,845,063 B2 * | 12/2010 | Kawashima ................. | 29/594 |
| 7,944,131 B2 * | 5/2011 | Kawashima ................. | 310/370 |
| 8,091,189 B2 * | 1/2012 | Kawashima ................. | 29/25.35 |
| 8,096,042 B2 * | 1/2012 | Kawashima ................. | 29/594 |
| 2001/0022488 A1 * | 9/2001 | Kawauchi et al. ........... | 310/348 |

* cited by examiner

*Primary Examiner* — Barbara Summons
(74) *Attorney, Agent, or Firm* — Adams & Wilks

(57) ABSTRACT

A quartz crystal unit has a quartz crystal resonator, a case for housing the quartz crystal resonator, and a lid for covering an open end of the case. The quartz crystal resonator comprises a quartz crystal tuning fork resonator capable of vibrating in a flexural mode of an inverse phase and having at least one groove, and an electrode is disposed on at least one of opposite side surfaces of each of the first and second quartz crystal tuning fork tines. The quartz crystal tuning fork resonator has a capacitance ratio $r_2$ of a second overtone mode of vibration greater than 1500. The lid is connected to the case through a connecting member to cover the open end of the case.

38 Claims, 25 Drawing Sheets

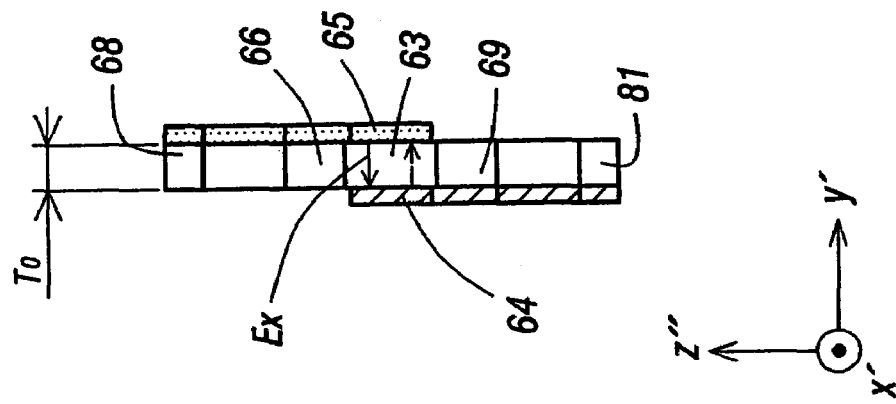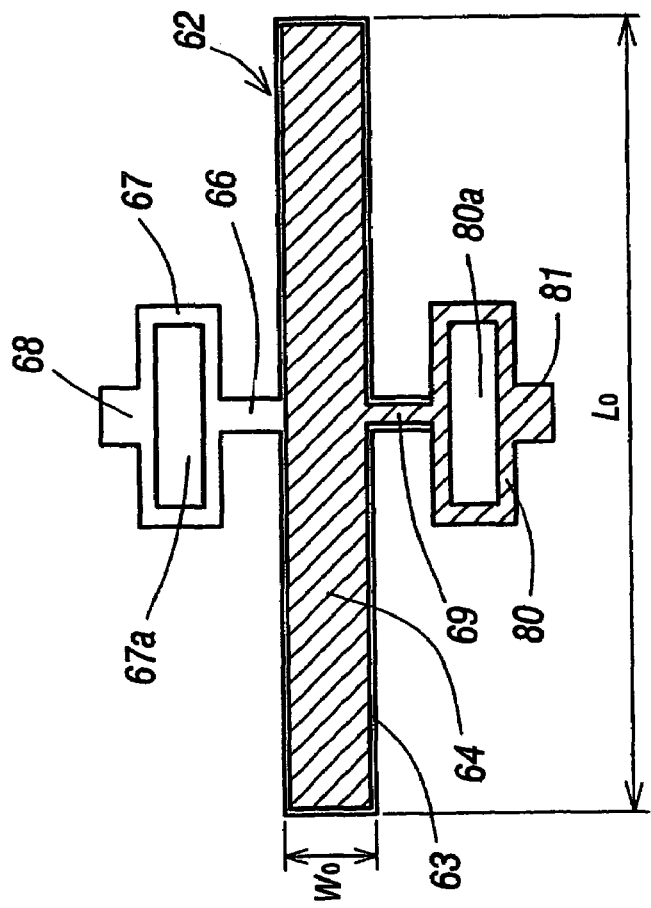

FIG. 19
(a)
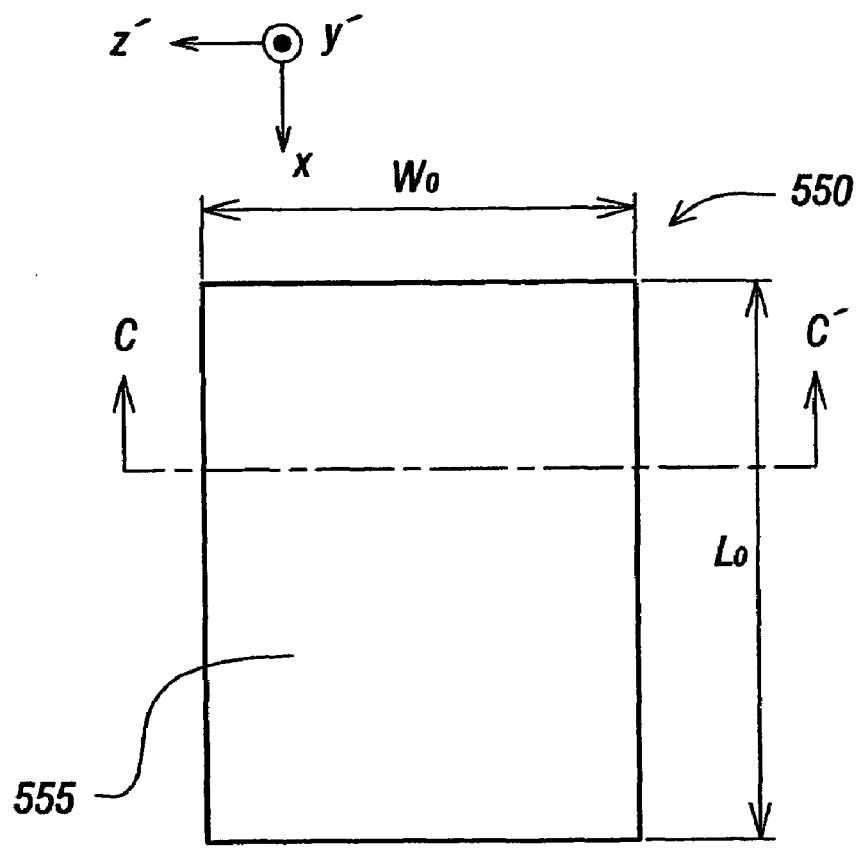
(b)
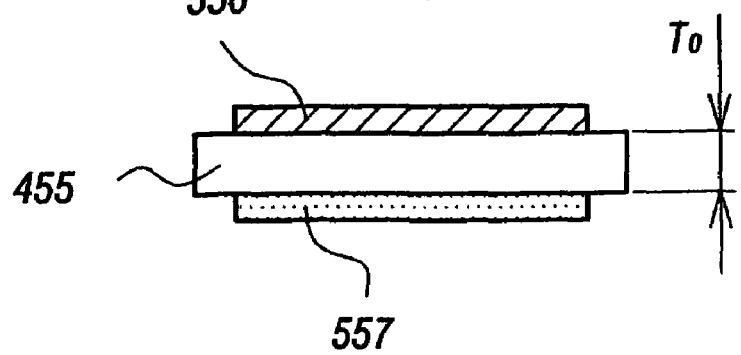

QUARTZ CRYSTAL UNIT, AND MANUFACTURING METHOD OF THE SAME AND MANUFACTURING METHOD OF QUARTZ CRYSTAL OSCILLATOR HAVING QUARTZ CRYSTAL UNIT

CROSS REFERENCE TO RELATED APPLICATIONS

This application is a division of application Ser. No. 11/301,530 filed Dec. 13, 2005 and now U.S. Pat. No. 7,412,764, which is a continuation-in-part of application Ser. No. 10/749,182 filed Dec. 30, 2003 and now U.S. Pat. No. 7,071,794, which is a continuation-in-part of application Ser. No. 10/378,719 filed Mar. 4, 2003 and now abandoned.

BACKGROUND OF THE INVENTION

1. Field of the Invention

The present invention relates to a quartz crystal resonator, a quartz crystal unit having the quartz crystal resonator, a quartz crystal oscillator having the quartz crystal unit, an electronic apparatus comprising a display portion and the quartz crystal oscillator at least, and their manufacturing methods.

2. Background Information

There are many electronic apparatus comprising a display portion and a quartz crystal oscillator at least. For example, cellular phones, wristwatches, facsimiles and pagers comprising a quartz crystal oscillator are well known. Recently, because of high stability for frequency, miniaturization and the light weight nature of these electronic apparatus, the need for an electronic apparatus comprising a smaller quartz crystal oscillator with a high frequency stability has arisen. For example, the quartz crystal oscillator with a quartz crystal tuning fork resonator, which is capable of vibrating in a flexural mode, is widely used as a time standard in an electronic apparatus such as the cellular phones, the wristwatches, the facsimiles and the pagers. Similar to this, the same need has also arisen for an electronic apparatus comprising a length-extensional mode quartz crystal resonator with a frequency of 1 MHz to 10 MHz to decrease an electric current consumption of the electronic apparatus.

Heretofore, however, it has been impossible to obtain an electronic apparatus comprising a smaller quartz crystal oscillator with a conventional miniaturized quartz crystal tuning fork resonator, capable of vibrating in a flexural mode, and having a high frequency stability, a small series resistance and a high quality factor. When miniaturized, the conventional quartz crystal tuning fork resonator, capable of vibrating in a flexural mode, as shown in FIG. 12 (which has electrodes on the obverse faces 203, 207, reverse faces 204, 208 and the four sides 205, 206, 209, 210 of each tuning fork tine, as also shown in FIG. 13—a cross-sectional view of tuning fork tines of FIG. 12), it has a smaller electromechanical transformation efficiency because the resonator shape and the electrode construction provide a small electric field (i.e. Ex becomes small), as a result of which the resonator has a low frequency stability, a large series resistance and a reduced quality factor. In FIG. 12, a conventional tuning fork resonator 200 is shown with tines 201, 202 and a base 230.

Moreover, for example, Japanese Patent Nos. P56-65517 and P2000-223992A and International Patent No. WO 00/44092 were published and teach grooves and electrodes constructed at tuning fork tines of a flexural mode, tuning fork, quartz crystal resonator. However, they teach nothing about a quartz crystal oscillator of the present invention having novel shape, novel electrode construction and figure of merit M for a quartz crystal tuning fork resonator, capable of vibrating in a flexural mode and about a relationship of an amplification circuit and a feedback circuit which construct a quartz crystal oscillating circuit.

Additionally, for example, there has been a big problem in the conventional oscillator with the conventional quartz crystal tuning fork resonator, such that a fundamental mode vibration of the resonator jumps to a second overtone mode vibration by shock or vibration.

Similarly, however, it has been impossible to obtain an electronic apparatus comprising a smaller quartz crystal oscillator with a conventional length-extensional mode quartz crystal resonator, capable of vibrating in a length-extensional mode, and having a frequency of 1 MHz to 10 MHz, a small series resistance and a high quality factor. As an example of a length-extensional mode quartz crystal resonator of the prior art, the length-extensional mode resonator comprising a vibrational portion, connecting portions and supporting portions, which is formed from a Z plate perpendicular to z axis, is well known, and this resonator is formed integrally by a chemical etching process. Also, electrodes are disposed opposite each other on sides of the vibrational portion formed by the chemical etching process so that the electrodes disposed opposite each other are of opposite electrical polarity.

Also, a cutting angle of the conventional length-extensional mode quartz crystal resonator is generally within a range of ZYw(0° to +5°), according to an IEEE notation. In detail, the connecting portions are connected opposite each other at both end portions of a width of the vibrational portion and at a central portion of the length direction thereof. Namely, the direction of the connecting portions constructed opposite each other corresponds to the direction of the electric field.

When an alternating current (AC) voltage is applied between the electrodes, an electric field occurs alternately in the width direction, as a result, the resonator is capable of vibrating in the length direction, but the electric field of between the electrodes becomes very small because quartz crystal is an anisotropic material and the sides of the vibrational portion have a complicated shape formed by the chemical etching process. Namely, the resonator has small electromechanical transformation efficiency because the resonator's shape and the electrode construction provide a small electric field, consequently, the resonator has a low frequency stability, a large series resistance and a reduced quality factor when it has the frequency of 1 MHz to 10 MHz.

It is, therefore, a general object of the present invention to provide embodiments of an electronic apparatus and a quartz crystal oscillator, which constructs an electronic apparatus of the present invention, comprising a quartz crystal oscillating circuit with a flexural mode, quartz crystal tuning fork resonator, capable of vibrating in a fundamental mode, and having a high frequency stability, a small series resistance and a high quality factor, or embodiments of a quartz crystal oscillator, which also constructs an electronic apparatus of the present invention, comprising a quartz crystal oscillating circuit with a length-extensional mode quartz crystal resonator having a frequency of 1 MHz to 10 MHz, a small series resistance and a high quality factor, which overcome or at least mitigate one or more of the above problems.

SUMMARY OF THE INVENTION

The present invention relates to a quartz crystal resonator, a quartz crystal unit having a quartz crystal resonator, a quartz crystal oscillator having a quartz crystal unit, and an electronic apparatus comprising a display portion and a quartz crystal oscillator at least, and their manufacturing methods. In particular, relates to the quartz crystal resonator which is a quartz crystal tuning fork resonator capable of vibrating in a flexural mode of an inverse phase, and having a groove and/or a through-hole at tuning fork tines, the quartz crystal unit having the quartz crystal tuning fork resonator, and the quartz crystal oscillator having the quartz crystal unit. In detail, the quartz crystal oscillator comprises a quartz crystal oscillating circuit having an amplification circuit and a feedback circuit, and in particular, relates to a quartz crystal oscillator having a flexural mode, quartz crystal tuning fork resonator capable of vibrating in a fundamental mode and having an output signal of a high frequency stability for the fundamental mode vibration of the resonator, and also to a quartz crystal oscillator having a suppressed second overtone mode vibration of the flexural mode, quartz crystal tuning fork resonator, in addition, relates to a quartz crystal oscillator comprising a length-extensional mode quartz crystal resonator. The quartz crystal oscillators are, therefore, available for the electronic apparatus requiring miniaturized and low priced quartz crystal oscillators with high time accuracy and shock proof.

It is an object of the present invention to provide an electronic apparatus comprising a quartz crystal oscillator with a miniature quartz crystal tuning fork resonator, capable of vibrating in a flexural mode, and having a high frequency stability, a small series resistance $R_1$ and a high quality factor $Q_1$, whose nominal frequency for a fundamental mode vibration is within a range of 10 kHz to 200 kHz.

It is an another object of the present invention to provide an electronic apparatus comprising a quartz crystal oscillator with a flexural mode, quartz crystal tuning fork resonator, capable of vibrating in a fundamental mode, and having a high frequency stability which gives a high time accuracy.

It is a further object of the present invention to provide an electronic apparatus comprising a quartz crystal oscillator with a length-extensional mode quartz crystal resonator.

According to one aspect of the present invention, there is provided an electronic apparatus comprising a display portion and a quartz crystal oscillator at least, and said electronic apparatus having one quartz crystal oscillator, said one quartz crystal oscillator comprising: a quartz crystal oscillating circuit comprising; an amplification circuit comprising an amplifier at least and a feedback circuit comprising a quartz crystal resonator and capacitors at least, said quartz crystal resonator being a quartz crystal tuning fork resonator, capable of vibrating in a flexural mode, and said quartz crystal tuning fork resonator comprising: tuning fork tines each of which has a length, a width and a thickness and the length greater than the width and the thickness; and a tuning fork base; said tuning fork tines and said tuning fork base that are formed integrally; and electrodes disposed facing each other on sides of said tuning fork tines so that the electrodes disposed facing each other are of opposite electrical polarity and said tuning fork tines are capable of vibrating in inverse phase, According to a second aspect of the present invention there is provided an electronic apparatus comprising a display portion and a quartz crystal oscillator at least, and said electronic apparatus comprises at least one quartz crystal oscillator comprising: an oscillating circuit comprising; an amplification circuit comprising an amplifier at least, and a feedback circuit comprising a length-extensional mode quartz crystal resonator which is one of a contour mode quartz crystal resonator.

According to a third aspect of the present invention, there is provided a method for manufacturing an electronic apparatus comprising a display portion and a quartz crystal oscillator at least, and said electronic apparatus comprising at least one quartz crystal oscillator, said at least one oscillator comprising: a quartz crystal oscillating circuit comprising; an amplification circuit comprising an amplifier at least, and a feedback circuit comprising a quartz crystal resonator and capacitors at least, said quartz crystal resonator being a quartz crystal tuning fork resonator, capable of vibrating in a flexural mode, said quartz crystal tuning fork resonator comprising the steps of: forming integrally tuning fork tines each of which has a length, a width and a thickness and the length greater than the width and the thickness and a tuning fork base; disposing electrodes facing each other on sides of said tuning fork tines so that the electrodes disposed facing each other are of opposite electrical polarity and said tuning fork tines vibrate an in inverse phase; and adjusting resonance frequency of said quartz crystal tuning fork resonator after mounting it at a mounting portion by conductive adhesives or solder so that a frequency deviation is within a range of −100 PPM to +100 PPM.

According to a fourth aspect of the present invention, there are provided a quartz crystal resonator, a quartz crystal unit and a quartz crystal oscillator, each of which has a piezoelectric constant $e_{12}$ that is within a range of 0.095 C/m² to 0.19 C/m².

Preferably, said tuning fork resonator is constructed so that figure of merit $M_1$ of a fundamental mode vibration is larger than figure of merit $M_2$ of a second overtone mode vibration.

Preferably, the quartz crystal oscillator with said tuning fork resonator is constructed so that a ratio of an amplification rate $\alpha_1$ of the fundamental mode vibration and an amplification rate $\alpha_2$ of the second overtone mode vibration of said amplification circuit is larger than that of a feedback rate $\beta_2$ of the second overtone mode vibration and a feedback rate $\beta_1$ of the fundamental mode vibration of said feedback circuit, and a product of the amplification rate $\alpha_1$ and the feedback rate $\beta_1$ of the fundamental mode vibration is larger than 1.

Preferably, the quartz crystal oscillator with said tuning fork resonator is constructed so that a ratio of an absolute value of negative resistance, $|-RL_1|$ of the fundamental mode vibration of said amplification circuit and series resistance $R_1$ of the fundamental mode vibration is larger than that of an absolute value of negative resistance, $|-RL_2|$ of the second overtone mode vibration of said amplification circuit and series resistance $R_2$ of the second overtone mode vibration.

Preferably, the length-extensional mode quartz crystal resonator comprises a vibrational portion, connecting portions and supporting portions, which are formed integrally by a particle method.

The present invention will be more fully understood by referring to the following detailed specification and claims taken in connection with the appended drawings.

BRIEF DESCRIPTION OF THE DRAWINGS

FIG. 8a and FIG. 8b show a top view and a side view of a length-extensional mode quartz crystal resonator constructing a quartz crystal oscillator, which constructs an electronic apparatus of the third embodiment of the present invention;

FIG. 19 shows a top view (a) and a C-C' cross-sectional view (b) of a vibrational portion of a thickness shear mode quartz crystal resonator constructing a quartz crystal unit, and which constructs an electronic apparatus of the present invention.

DETAILED DESCRIPTION OF THE PREFERRED EMBODIMENTS

Figure 1:
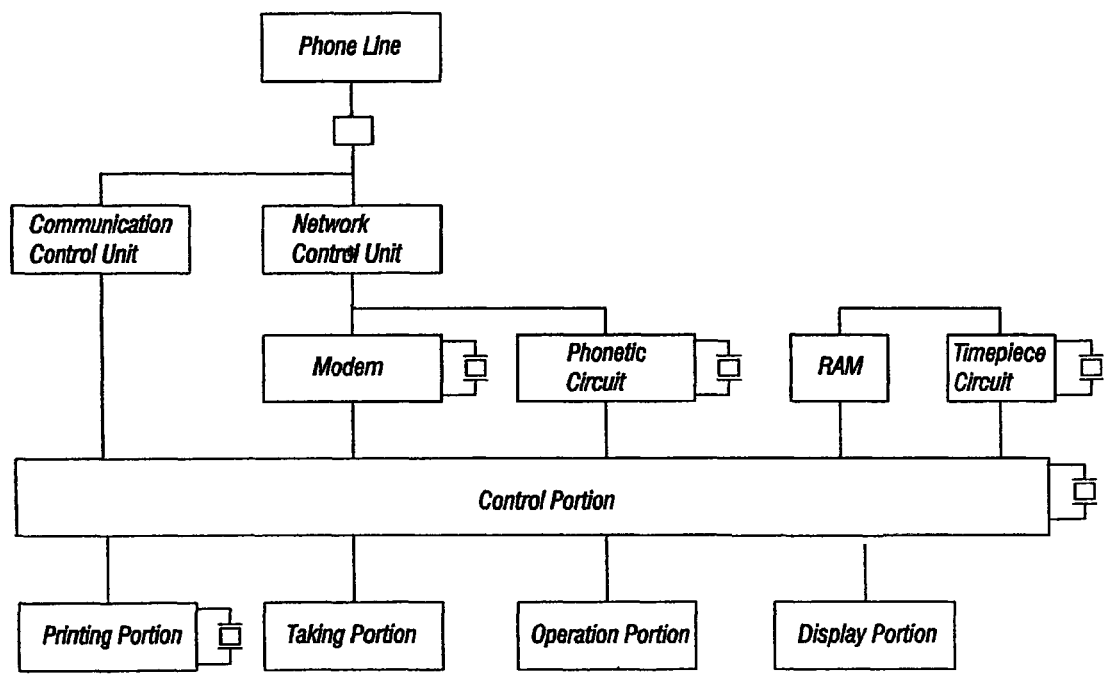
FIG. 1 shows a block diagram of an embodiment of an electronic apparatus of the present invention, and illustrating the diagram of a facsimile apparatus.

Referring now to the drawings, the embodiments of the present invention will be described in more detail.

FIG. 1 shows a block diagram of an embodiment of an electronic apparatus of the present invention, and illustrating the diagram of a facsimile apparatus. As is shown in FIG. 1, the apparatus generally comprises a modem, a phonetic circuit, a timepiece circuit, a printing portion, a taking portion, an operation portion and a display portion. In this principle, perception and scanning of reflection light of light projected on manuscript in the taking portion are performed by CCD (Charge Coupled Device), in addition, light and shade of the reflection light are transformed into a digital signal, and the signal is modulated by the modem and is sent to a phone line (Communication line). Also, in a receiving side, a received signal is demodulated by the modem and is printed on a paper in the print portion by synchronizing the received signal with a signal of a sending side.

As shown in FIG. 1, a quartz crystal resonator which is one of piezoelectric resonators made of piezoelectric materials is used as a CPU clock of the control portion and the printing portion, as a clock of the phonetic circuit and the modem, and as a time standard of the timepiece. Namely, the resonator constructs a quartz crystal oscillator and an output signal of the oscillator is used. For example, it is used as a signal to display time at the display portion. In this case, a quartz crystal tuning fork resonator, capable of vibrating in a flexural mode is used, and e.g. as the CPU clock, a contour mode quartz crystal resonator such as a length-extensional mode quartz crystal resonator or a thickness shear mode quartz crystal resonator is used. In order to get the facsimile apparatus of this embodiment which operates normally, an accuracy output signal of the oscillator is required for the facsimile apparatus, which is one of the electronic apparatus of the present invention. Also, a digital display and an analogue display are included in the display of the present invention. In this embodiment, two quartz crystal resonators each of which vibrates in a different mode are used in the electronic apparatus of the present invention. But, the present invention is not limited to this, two quartz crystal resonators each of which vibrates in the same mode may be used in the electronic apparatus of the present invention. Namely, one of the two quartz crystal resonators is used as a signal for use in operation of the electronic apparatus to display time information at the display portion of the electronic apparatus. One of the two quartz crystal resonators which is used as a signal for use in operation of the electronic apparatus to display time information at the display portion has a frequency of oscillation of a fundamental mode of vibration. In more detail, a piezoelectric resonator has a fundamental mode of vibration and an overtone mode of vibration. It is needless to say that the fundamental mode of vibration and the overtone mode of vibration thereof are defined as the same mode of vibration. For example, a thickness shear mode quartz crystal resonator has a fundamental mode of vibration and a third overtone mode of vibration, the fundamental mode of vibration of the thickness shear mode quartz crystal resonator is, therefore, the same mode of vibration as the third overtone mode of vibration thereof. In stead of the quartz crystal, such a piezoelectric material may be used as $LiTaO_3$, $LiNbO_3$, $GaPO_4$, and so on.

In this embodiment, though the facsimile apparatus is shown as an example of an electronic apparatus, the present invention is not limited to this, namely, the present invention includes all electronic apparatus, each of which comprises a quartz crystal oscillator and a display portion at least, for example, cellar phones, telephones, a TV set, cameras, a video set, video cameras, pagers, personal computers, printers, CD players, MD players, electronic musical instruments, car navigators, car electronics, timepieces, IC cards and so forth.

Figure 2:
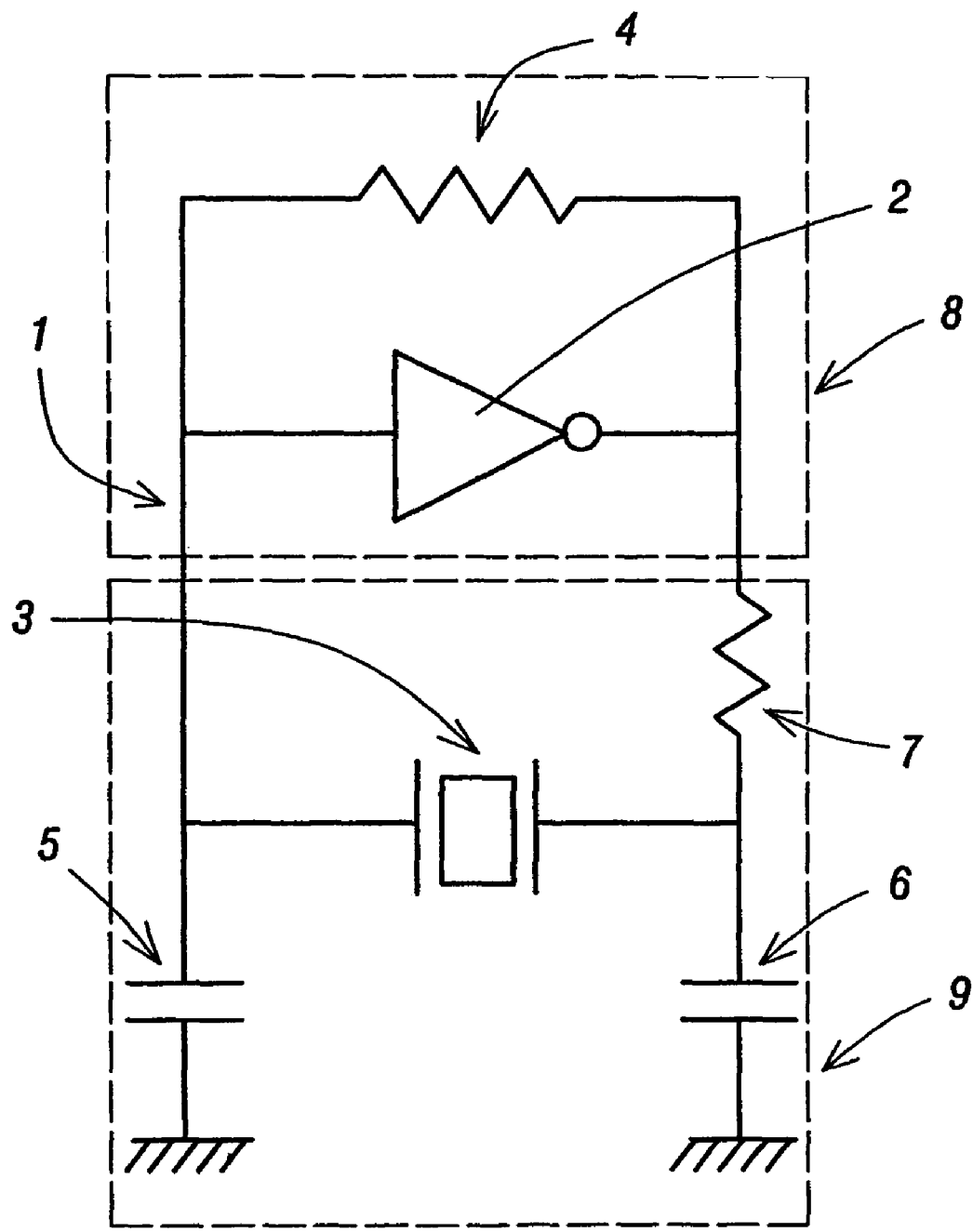
FIG. 2 shows a diagram of an embodiment of a quartz crystal oscillating circuit constructing a quartz crystal oscillator, which constructs an electronic apparatus of the present invention.

FIG. 2 shows a diagram of an embodiment of a quartz crystal oscillating circuit constructing a quartz crystal oscillator, which constructs an electronic apparatus of the present invention. The quartz crystal oscillating circuit 1 comprises an amplifier (CMOS Inverter) 2, a feedback resistor 4, a drain resistor 7, capacitors 5, 6 and a flexural mode, quartz crystal tuning fork resonator 3. Namely, the oscillating circuit 1 comprises an amplification circuit 8 having the amplifier 2 and the feedback resistor 4, and a feedback circuit 9 having the drain resistor 7, the capacitors 5, 6 and the quartz crystal tuning fork resonator 3. In addition, an output signal of the oscillating circuit 1 comprising the quartz crystal tuning fork resonator 3, capable of vibrating in a fundamental mode, is outputted through a buffer circuit (not shown in FIG. 2).

In detail, an oscillation frequency of the fundamental mode vibration is outputted through a buffer circuit as an output signal. According to the present invention, a nominal frequency of the fundamental mode vibration of the resonator is within a range of 10 kHz to 200 kHz. Especially, 32.768 kHz is an important frequency. In general, the output signal has an oscillation frequency which is within a range of −100 PPM to +100 PPM to the nominal frequency, e.g. 32.768 kHz. In more detail, the quartz crystal oscillator in this embodiment comprises a quartz crystal oscillating circuit and a buffer circuit, namely, the quartz crystal oscillating circuit comprises an amplification circuit and a feedback circuit, and the amplification circuit comprises an amplifier and a feedback resistor, and the feedback circuit comprises a flexural mode, quartz crystal tuning fork resonator, a drain resistor and capacitors. Also, flexural mode, quartz crystal tuning fork resonators which are used in a quartz crystal oscillator will be described in FIG. 4-FIG. 7 in detail. Instead of the flexural mode, quartz crystal tuning fork resonator, a contour mode resonator such as a length-extensional mode quartz crystal resonator, a width-extensional mode quartz crystal resonator and a Lame mode quartz crystal resonator or a thickness shear mode quartz crystal resonator may be used.

Figure 3:
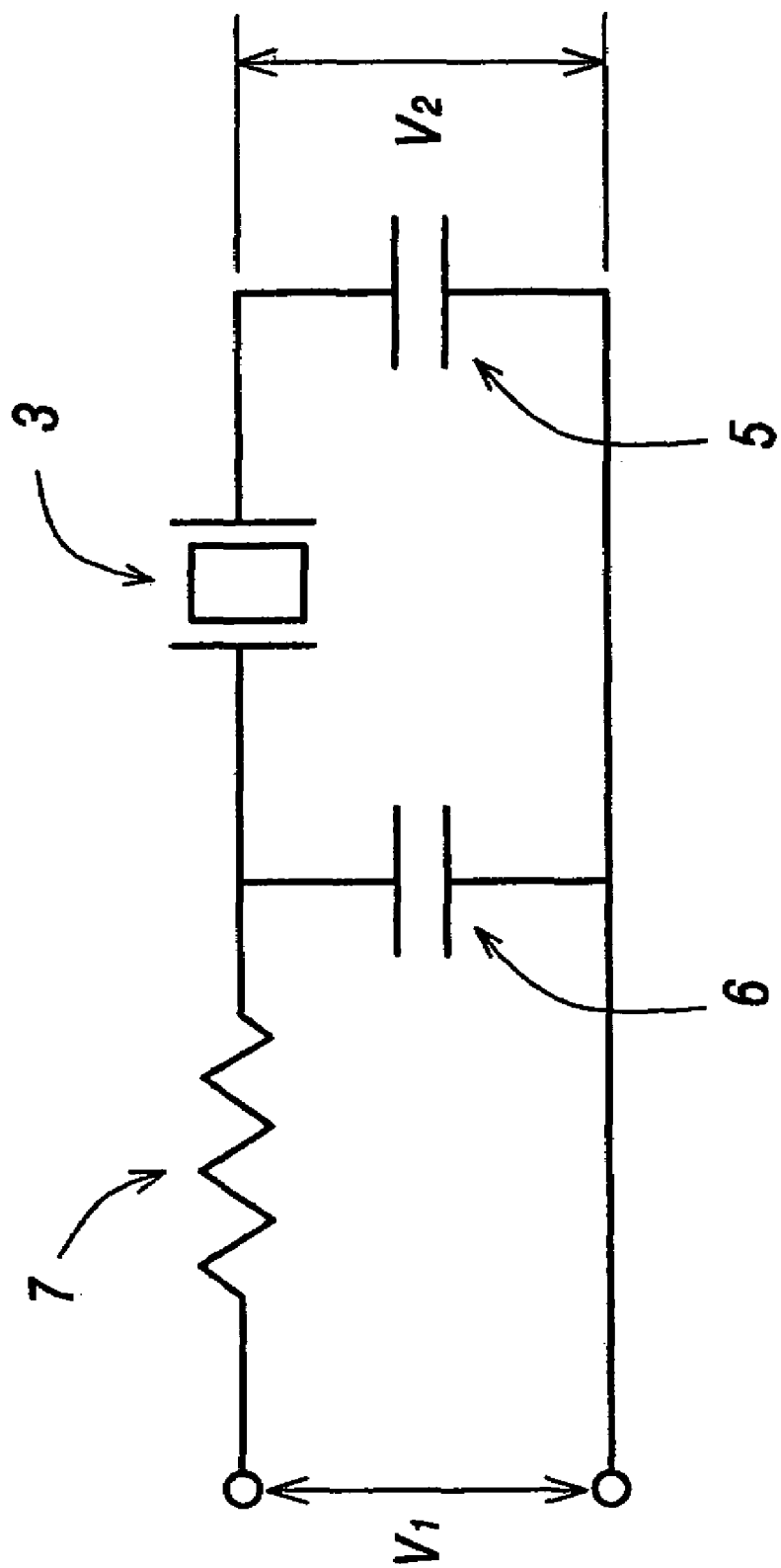
FIG. 3 shows a diagram of the feedback circuit of FIG. 2.

FIG. 3 shows a diagram of the feedback circuit of FIG. 2. Now, when angular frequency $\omega_i$ of the flexural mode, quartz crystal tuning fork resonator 3, capable of vibrating in a flexural mode, a resistance $R_d$ of the drain resistor 7, capacitance $C_g$, $C_d$ of the capacitors 5, 6, crystal impedance $R_{ei}$ of the quartz crystal resonator 3, an input voltage $V_1$, and an output voltage $V_2$ are taken, a feedback rate $\beta_i$ is defined by $\beta_i=|V_2|_i/|V_1|_i$, where i shows vibration order, for example, when i=1 and 2, they are for a fundamental mode vibration and a second overtone mode vibration.

In addition, load capacitance $C_L$ is given by $C_L=C_gC_d/(C_g+C_d)$, and when $C_g=C_d=C_{gd}$ and $Rd>>R_{ei}$, the feedback rate $\beta_i$ is given by $\beta_i=1/(1+kC_L^2)$, where k is expressed by a function of $\omega_i$, $R_d$ and $R_{ei}$. Also, $R_{ei}$ is approximately equal to series resistance $R_1$.

Thus, it is easily understood from a relationship of the feedback rate $\beta_i$ and load capacitance $C_L$ that the feedback rate of resonance frequency for a fundamental mode vibration and an overtone mode vibration becomes large, respectively, according to decrease of load capacitance $C_L$. Therefore, when $C_L$ has a small value, an oscillation of the overtone mode occurs very easily, instead of that of the fundamental mode. This is the reason why a maximum amplitude of the overtone mode vibration becomes smaller than that of the fundamental mode vibration, and the oscillation of the overtone mode satisfies an amplitude condition and a phase condition simultaneously which are the continuous condition of an oscillation in an oscillating circuit.

As it is also one object of the present invention to provide a quartz crystal oscillator having a flexural mode, quartz crystal tuning fork resonator, capable of vibrating in a fundamental mode and having a high frequency stability (high time accuracy) of an output signal, and having reduced electric current consumption, in this embodiment, load capacitance $C_L$ is less than 25 pF to reduce electric current consumption. To get much reduced electric current consumption, $C_L$ is preferably less than 15 pF because electric current consumption is proportional to $C_L$.

In addition, in order to suppress a second overtone mode vibration and to obtain a quartz crystal oscillator having an output signal of an oscillation frequency of a fundamental mode vibration, the quartz crystal oscillator in this embodiment is constructed so that it satisfies a relationship of $\alpha_1/\alpha_2>\beta_2/\beta_1$ and $\alpha_1\beta_1>1$, where $\alpha_1$ and $\alpha_2$ are, respectively, an amplification rate of the fundamental mode vibration and the second overtone mode vibration of an amplification circuit, and $\beta_1$ and $\beta_2$ are, respectively, a feedback rate of the fundamental mode vibration and the second overtone mode vibration of a feedback circuit.

In other words, the quartz crystal oscillator is constructed so that a ratio of the amplification rate $\alpha_1$ of the fundamental mode vibration and the amplification rate $\alpha_2$ of the second overtone mode vibration of the amplification circuit is larger than that of the feedback rate $\beta_2$ of the second overtone mode vibration and the feedback rate $\beta_1$ of the fundamental mode vibration of the feedback circuit, and also a product of the amplification rate $\alpha_1$ and the feedback rate $\beta_1$ of the fundamental mode vibration is larger than 1. A description of the high frequency stability will be performed later.

Also, characteristics of the amplifier of the amplification circuit constructing the quartz crystal oscillating circuit of this embodiment can be expressed by negative resistance $-RL_i$. For example, when i=1, negative resistance $-RL_1$ is for a fundamental mode vibration and when i=2, negative resistance $-RL_2$ is for a second overtone mode vibration. In this embodiment, the quartz crystal oscillating circuit is constructed so that a ratio of an absolute value of negative resistance, $|-RL_1|$ of the fundamental mode vibration of the amplification circuit and series resistance $R_1$ of the fundamental mode vibration is larger than that of an absolute value of negative resistance, $|-RL_2|$ of the second overtone mode vibration of the amplification circuit and series resistance $R_2$ of the second overtone mode vibration. That is to say, the oscillating circuit is constructed so that it satisfies a relationship of $|-RL_1|/R_1>|-RL_2|/R_2$. By constructing the oscillating circuit like this, an oscillation of the second overtone mode can be suppressed, as a result of which an output signal of a frequency of the fundamental mode vibration can be provided because an oscillation of the fundamental mode generates easily in the oscillating circuit.

Figure 4:
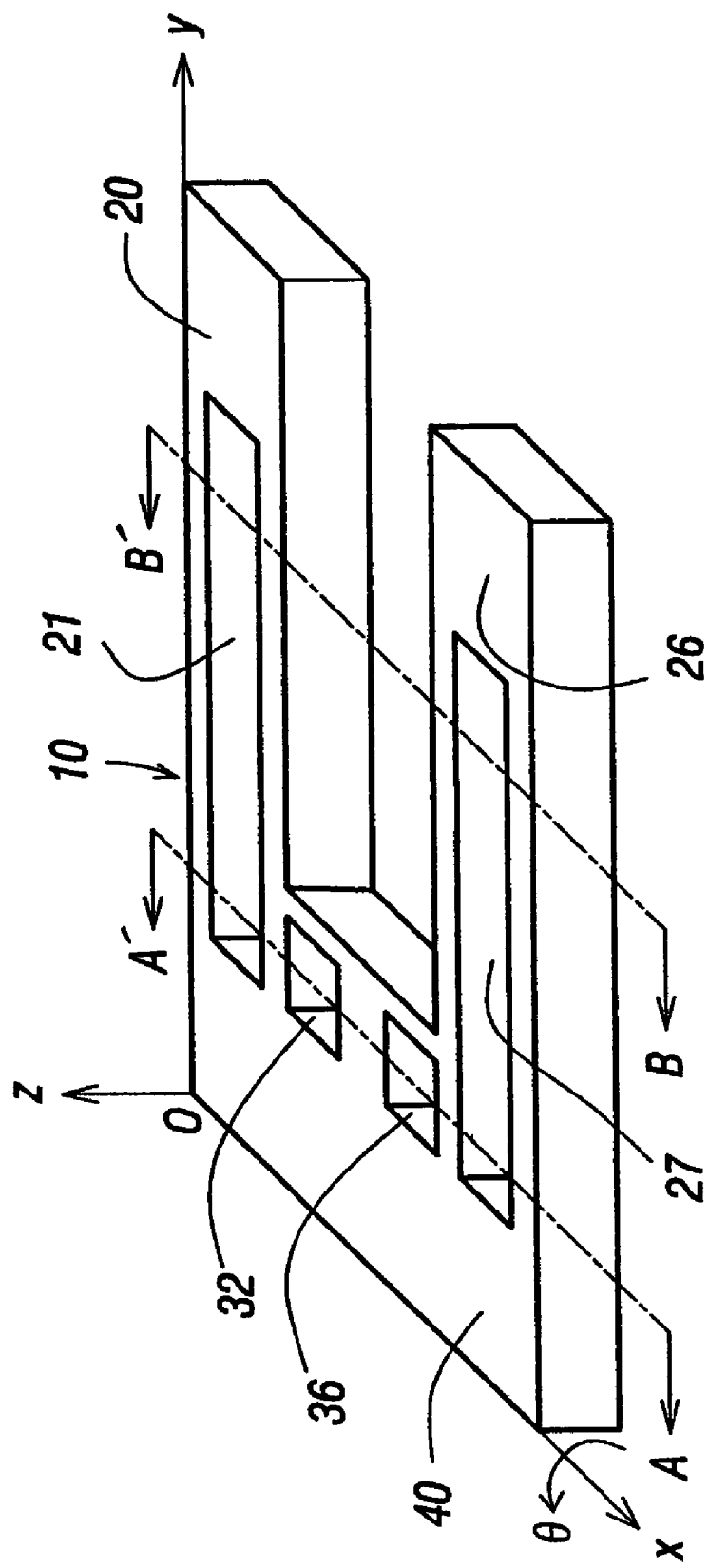
FIG. 4 shows a general view of a flexural mode, quartz crystal tuning fork resonator constructing a quartz crystal oscillator, which constructs an electronic apparatus of the first embodiment of the present invention.

FIG. 4 shows a general view of a flexural mode, quartz crystal tuning fork resonator 10 which is one of a contour mode resonator, constructing a quartz crystal oscillator, which constructs an electronic apparatus of the first embodiment of the present invention and its coordinate system o-xyz. A cut angle θ which has a typical value of 0° to 10° is rotated from a Z-plate perpendicular to the z axis about the x axis. Namely, the flexural mode, quartz crystal tuning fork resonator has the cut angel of ZYw(0° to 10°) according to an expression of the IEEE notation. The resonator 10 comprises two tuning fork tines (vibrating tines) 20 and 26 and a tuning fork base (a base) 40. The tines 20 and 26 have grooves 21 and 27 respectively, with the grooves 21 and 27 extending into the base 40. Also, the base 40 has the additional grooves 32 and 36. In addition, the tines 20 and 26 vibrate in a flexural mode of a fundamental mode and an inverse phase.

Figure 5:
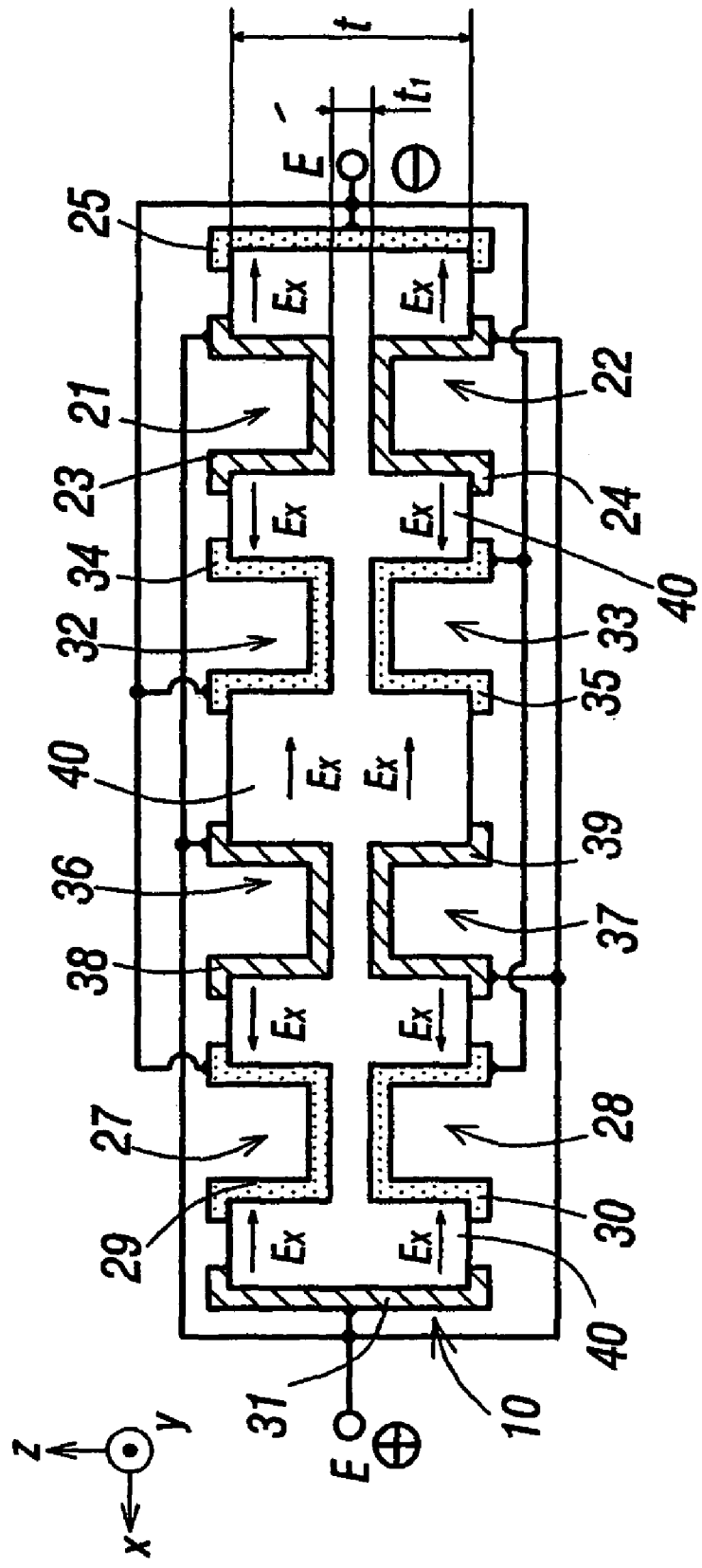
FIG. 5 shows a A-A' cross-sectional view of the tuning fork base of FIG. 4, and illustrating electrode construction.

FIG. 5 shows an A-A' cross-sectional view of the tuning fork base 40 of the quartz crystal resonator 10 in FIG. 4. In FIG. 5, the shape of the electrode construction within the base 40 for the quartz crystal resonator of FIG. 4 is described in detail. The section of the base 40 which couples to the tine 20 has the grooves 21 and 22 cut into the obverse and reverse faces of the base 40. Also, the section of the base 40 which couples to the tine 26 has the grooves 27 and 28 cut into the obverse and reverse faces of the base 40. In addition to these grooves, the base 40 has the grooves 32 and 36 cut between the grooves 21 and 27, and also, the base 40 has the grooves 33 and 37 cut between the grooves 22 and 28.

Furthermore, the grooves 21 and 22 have the first electrodes 23 and 24 both of the same electrical polarity, the grooves 32 and 33 have the second electrodes 34 and 35 both of the same electrical polarity, the grooves 36 and 37 have the third electrodes 38 and 39 both of the same electrical polarity, the grooves 27 and 28 have the fourth electrodes 29 and 30 both of same electrical polarity and the sides of the base 40 have the fifth and sixth electrodes 25 and 31, each of opposite electrical polarity. In more detail, the fifth, fourth, and second electrodes 25, 29, 30, 34 and 35 have the same electrical polarity, while the first, sixth and third electrodes 23, 24, 31, 38 and 39 have the opposite electrical polarity to the others. Two electrode terminals E and E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

Figure 14:
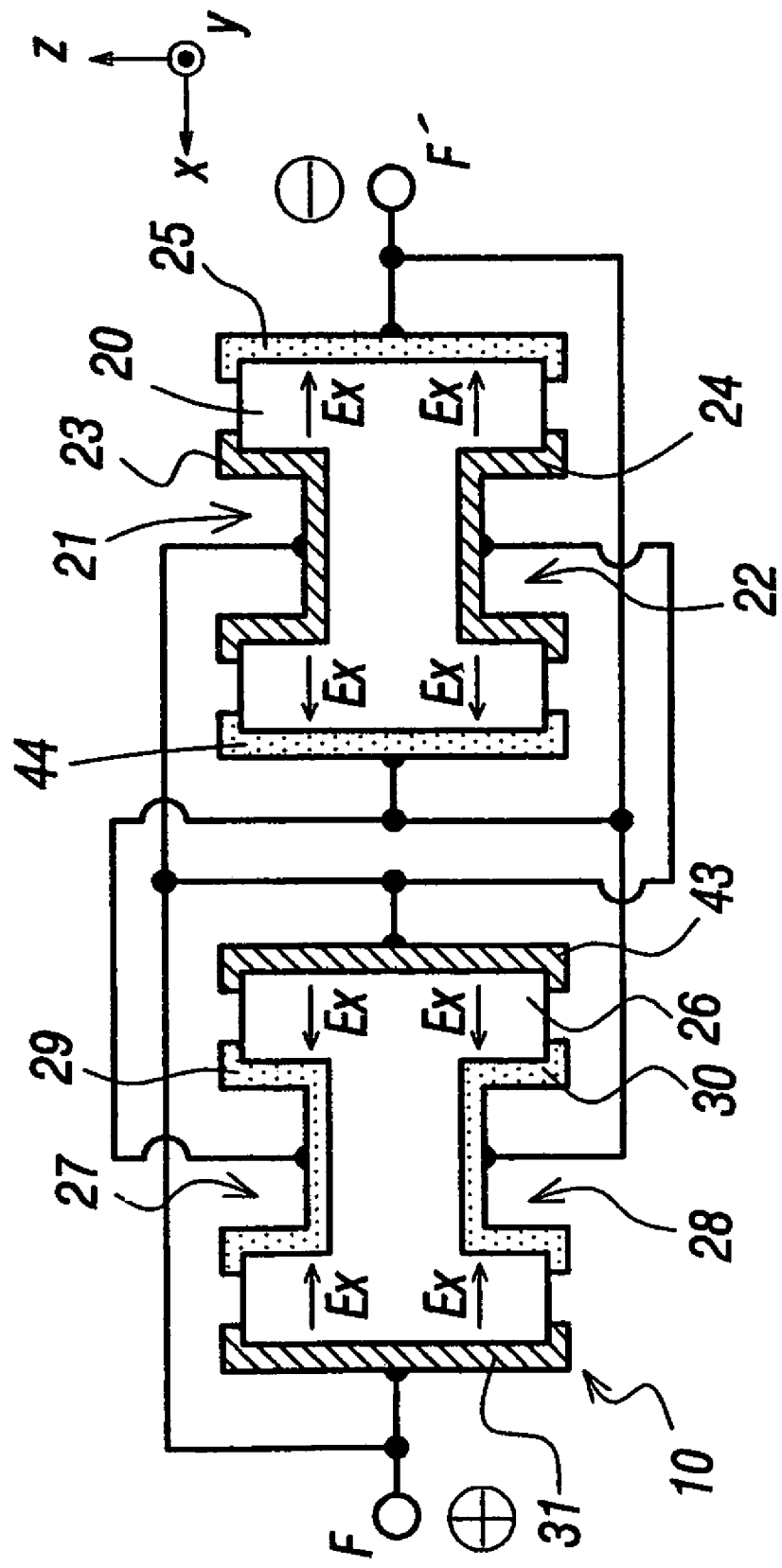
FIG. 14 shows a B-B' cross-sectional view of the tuning fork tines of FIG. 4.

In addition, the resonator has a thickness t of the tines or the tines and the base, and a groove thickness $t_1$. It is needless to say that the electrodes are disposed inside the grooves and on the sides of the tines. In this embodiment, the first electrodes 23 and 24 are disposed at the tine and the base, and also, the fourth electrodes 29 and 30 are disposed at the tine and the base. In addition, the electrodes are disposed on the sides of the tines opposite each other to the electrodes disposed inside the grooves. Namely, the electrodes are disposed opposite each other inside the grooves and on the sides of the tines so that the electrodes disposed opposite each other are of opposite electrical polarity. Additionally, electrodes are disposed facing each other on the sides of the tines so that the electrodes disposed facing each other are of opposite electrical polarity, and the tines are capable of vibrating in inverse phase. In more detail, a first tuning fork tine and a second tuning fork tine, and a tuning fork base are formed integrally, an electrode is disposed on both sides of the first tine and the second tine so that the electrodes disposed (facing each other) on inner sides of the first and second tines are of opposite electrical polarity. Therefore, the disposition of the electrodes disposed inside the grooves and on the sides of the tuning fork tines, described above is the same as that of the electrodes shown in FIG. 14 which shows a B-B' cross-sectional view of the tuning fork tines 20, 26 of the quartz crystal resonator 10 in FIG. 4, namely, the electrodes 23, 24 are connected to the electrodes 31, 43 to define an electrode terminal F, while the electrodes 29, 30 are connected to the electrodes 25, 44 to define an electrode terminal F'. It is needless to say that the electrode terminal F is electrically connected to the electrode terminal E and the electrode terminal F' is electrically connected to the electrode terminal E'.

When a direct current voltage is applied between the electrode terminals E and E' (E terminal: plus, E' terminal: minus), an electric field $E_x$ occurs in the arrow direction as shown in FIG. 5. As the electric field $E_x$ occurs perpendicular to the electrodes disposed on the base, the electric field $E_x$ has a very large value and a large distortion occurs at the base, so that the quartz crystal tuning fork resonator is obtained with a small series resistance $R_1$ and a high quality factor $Q_1$, even if it is miniaturized.

Figure 6:
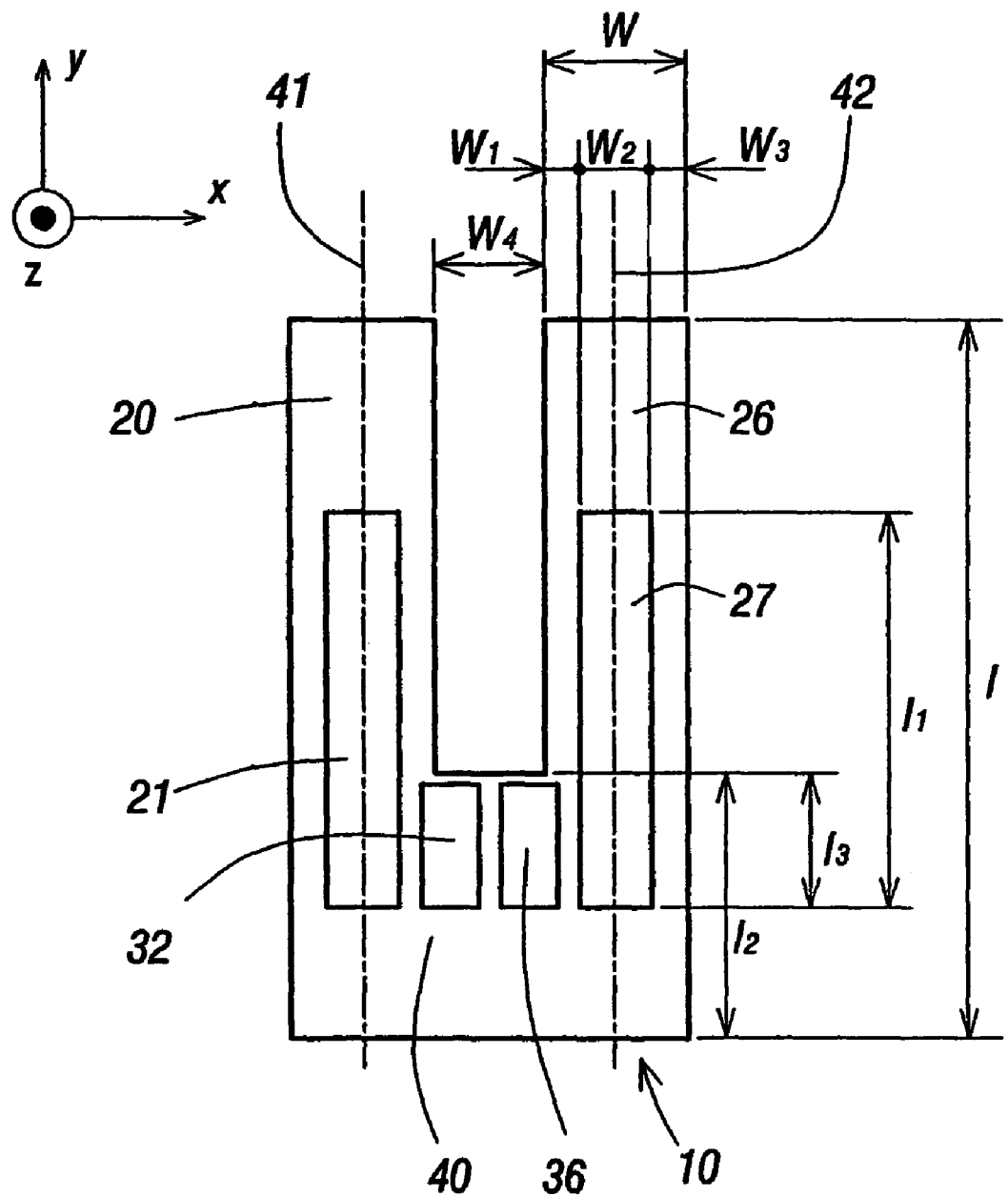
FIG. 6 shows a plan view of a quartz crystal tuning fork resonator of FIG. 4.

FIG. 6 shows a plan view of the resonator 10 of FIG. 4. In FIG. 6, the construction and the dimension of grooves 21, 27, 32 and 36 are described in detail. The groove 21 is constructed to include a portion of the central line 41 of the tine 20, and the groove 27 is similarly constructed to include a portion of the central line 42 of the tine 26. The width $W_2$ of the grooves 21 and 27 (groove width $W_2$) which include a portion of the central lines 41 and 42 respectively, is preferable because moment of inertia of the tines 20 and 26 becomes large and the tines can vibrate in a flexural mode easily. As a result, the quartz crystal tuning fork resonator capable of vibrating in a fundamental mode can be obtained with a small series resistance $R_1$ and a high quality factor $Q_1$.

In more detail, when part widths $W_1$, $W_3$ and a groove width $W_2$ are taken, the tine width W of the tines 20 and 26 has a relationship of $W=W_1+W_2+W_3$, and the part widths $W_1$, $W_3$ are constructed so that $W_1 \geqq W_3$ or $W_1 < W_3$. In addition, the groove width $W_2$ is constructed so that $W_2 \geqq W_1$, $W_3$. In this embodiment, also, the grooves are constructed at the tines so that a ratio ($W_2/W$) of the groove width $W_2$ and the tine width W is larger than 0.35 and less than 1, preferably larger than 0.35 and less than 0.85, and a ratio ($t_1/t$) of the groove thickness $t_1$ and the thickness t of the tines (tine thickness t) is less than 0.79, to obtain very large moment of inertia of the tines. That is, the flexural mode, quartz crystal tuning fork resonator, capable of vibrating in the fundamental mode, and having a good frequency stability can be provided with a small series resistance $R_1$, a high quality factor $Q_1$ and a small capacitance ratio $r_1$ because electromechanical transformation efficiency of the resonator becomes large markedly.

Likewise, a length $l_1$ of the grooves 21, 27 provided at the tines 20, 26 extends into the base 40 in this embodiment (which has a dimension of the length $l_2$ and the length $l_3$ of the grooves). Therefore, a groove length and a length of the tines are given by $(l_1-l_3)$ and $(l-l_2)$, respectively, and a ratio of $(l_1-l_3)$ and $(l-l_2)$ is within a range of 0.3 to 0.8, preferably, 0.4 to 0.8 to get a flexural mode tuning fork resonator with series resistance $R_1$ of a fundamental mode vibration smaller than series resistance $R_2$ of a second overtone mode vibration. In other words, a groove length is within a range of 30% to 80%, preferably, 40% to 80% of a length of each of the tines, so that a flexural mode tuning fork resonator with a reduced series resistance $R_1$ and a small motional inductance $L_1$ of a fundamental mode vibration and having shock proof can be obtained when the flexural mode tuning fork resonator is miniaturized. Also, a length $l_2$ of the base is less than 0.5 mm, preferably, within a range of 0.29 mm to 0.48 mm or within a range of 0.12 mm to 0.255 mm or within a range of 0.264 mm to 0.277 mm, so that a miniaturized flexural mode tuning fork resonator can be obtained with reduced energy losses which are caused by vibration when it is mounted on a mounting portion of a case. As be well known, the resonator can be expressed by an electrical equivalent circuit comprising motional capacitance $C_1$, motional inductance $L_1$, series resistance $R_1$ connected in series, and shunt capacitance $C_0$ connected to $C_1$, $L_1$ and $R_1$ in parallel.

Furthermore, the total length l is determined by the frequency requirement and the size of the housing case. Simultaneously, to get a flexural mode, quartz crystal tuning fork resonator, capable of vibrating in a fundamental mode with suppression of the second overtone mode vibration which is an unwanted mode vibration, there is a close relationship between the groove length $l_1$ and the total length l. Namely, a ratio ($l_1$/l) of the groove length $l_1$ and the total length l is within a range of 0.2 to 0.78 because the quantity of charges which generate within the grooves and on the sides of the tines or the tines and the base can be controlled by the ratio, as a result, the second overtone mode vibration which is an unwanted mode vibration, can be suppressed, and simultaneously, a frequency stability of the fundamental mode vibration gets high. Therefore, the flexural mode, quartz crystal tuning fork resonator, capable of vibrating easily in a fundamental mode and having high frequency stability can be provided. Also, the total length l is less than 2.18 mm, preferably, within a range of 1.2 mm to 2 mm, more preferably, 0.8 mm to 1.2 mm, and groove length $l_1$ is less than 1.29 mm, preferably, within a range of 0.32 mm to 1.1 mm, more preferably, within a range of 0.32 mm to 0.85 mm, to get a smaller-sized tuning fork resonator with about 32.768 kHz and a small motional inductance $L_1$ which vibrates in a flexural mode and a fundamental mode.

In more detail, series resistance $R_1$ of the fundamental mode vibration becomes smaller than series resistance $R_2$ of the second overtone mode vibration. Namely, $R_1 < R_2$, preferably, $R_1 < 0.86 R_2$, therefore, a quartz crystal oscillator comprising an amplifier (CMOS inverter), capacitors, resistors and a quartz crystal unit with the quartz crystal tuning fork resonator of this embodiment can be obtained, which is capable of vibrating in the fundamental mode easily. In addition, in this embodiment the grooves 21 and 27 of the tines 20 and 26 extend into the base 40 in series, but embodiment of the present invention includes a plurality of grooves divided into the length direction of the tines. In addition, the grooves may be constructed only at the tines ($l_3=0$).

In this embodiment, the groove length $l_1$ corresponds to electrode length disposed inside the grooves, though the electrode is not shown in FIG. 6, but, when the electrode length is less than the groove length, the length $l_1$ is of the electrode length. Namely, the ratio ($l_1$/l) in this case is expressed by a ratio of electrode length $l_1$ of the grooves and the total length l. In order to achieve the above-mentioned object, it may be satisfied with at least one groove with the ratio constructed at the obverse and reverse faces of each tine. As a result, the flexural mode, quartz crystal tuning fork resonator, capable of vibrating very easily in the fundamental mode and having the high frequency stability can be realized. Also, a fork portion of this embodiment has a rectangular shape, but this invention is not limited to this, for example, the fork portion may have a U shape.

Figure 20:
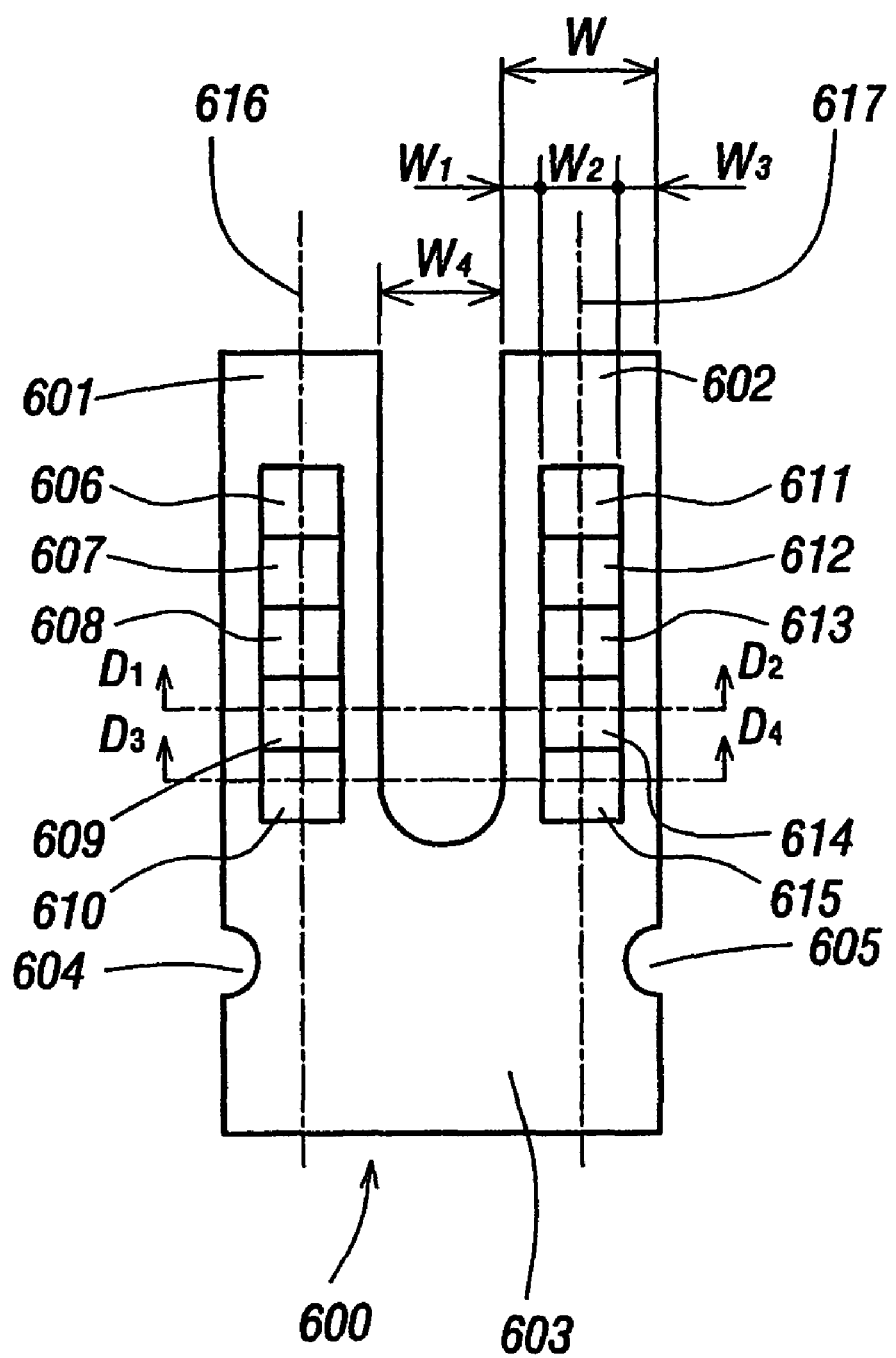
FIG. 20 shows a plan view of a flexural mode, quartz crystal tuning fork resonator of the present invention, and constructing a quartz crystal unit, a quartz crystal oscillator and an electronic apparatus of the present invention.
Figure 21:
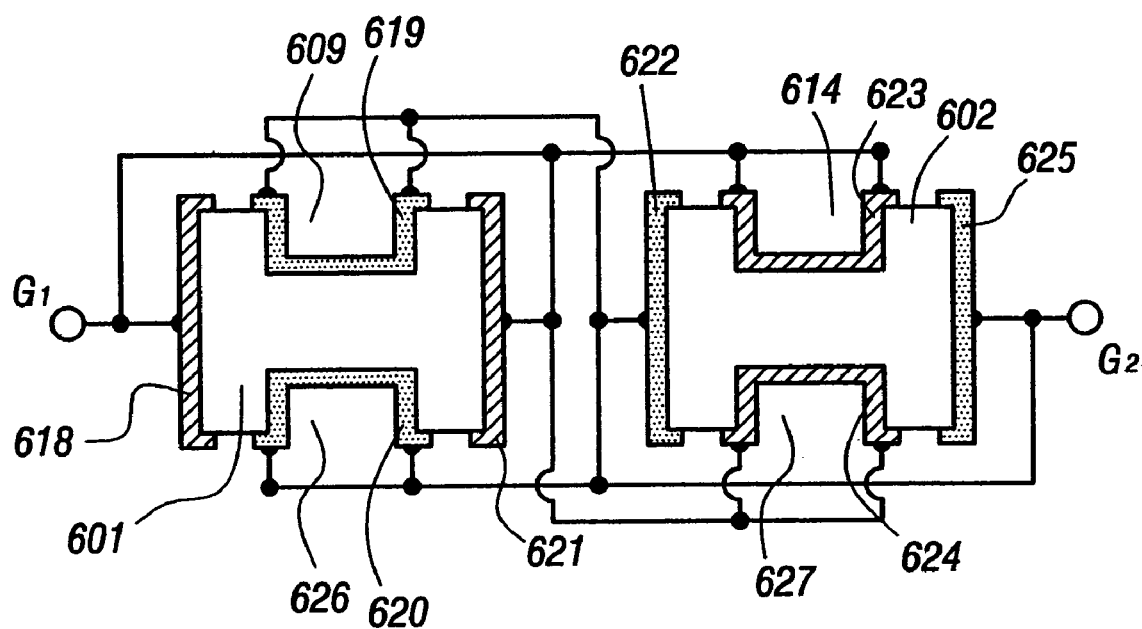
FIG. 21 shows a $D_1$-$D_2$ cross-sectional view of the tuning fork tines of FIG. 20.
Figure 22:
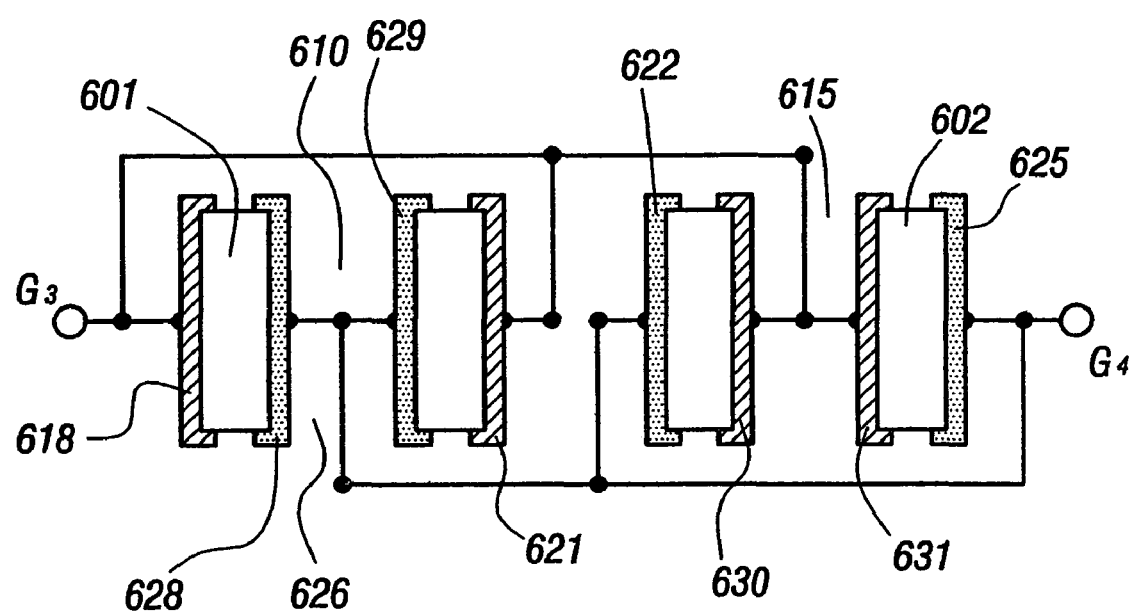
FIG. 22 shows a $D_3$-$D_4$ cross-sectional view of the tuning fork tines of FIG. 20.
Figure 23:
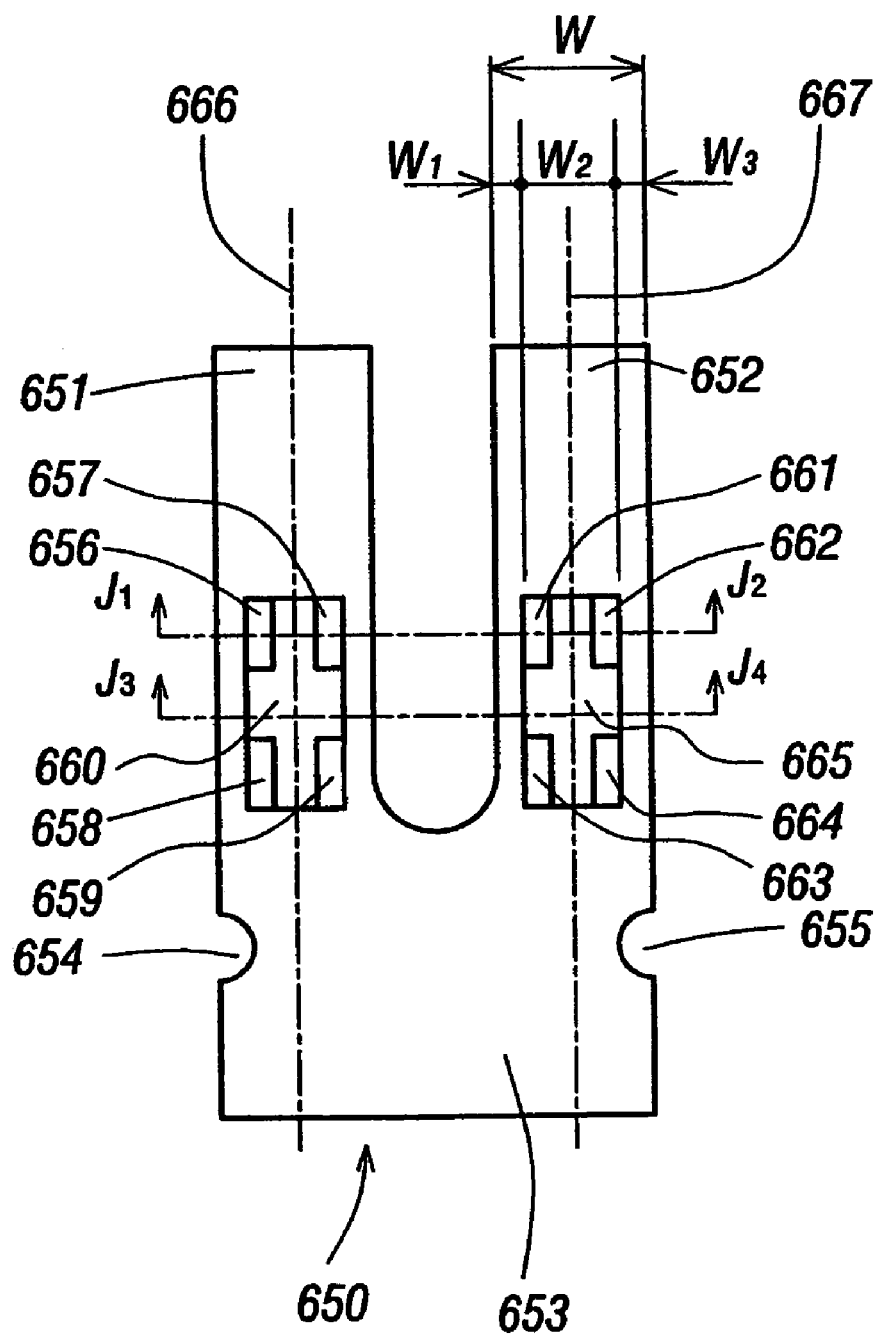
FIG. 23 shows a plan view of a flexural mode, quartz crystal tuning fork resonator of the present invention, and constructing a quartz crystal unit, a quartz crystal oscillator and an electronic apparatus of the present invention.
Figure 24:
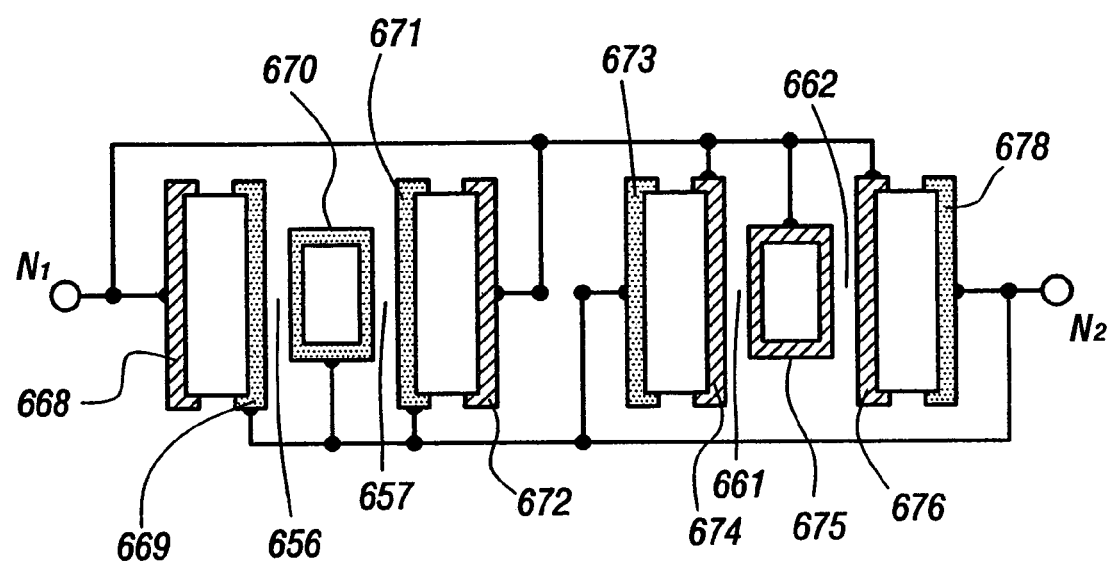
FIG. 24 shows a $J_1$-$J_2$ cross-sectional view of the tuning fork tines of FIG. 23.
Figure 25:
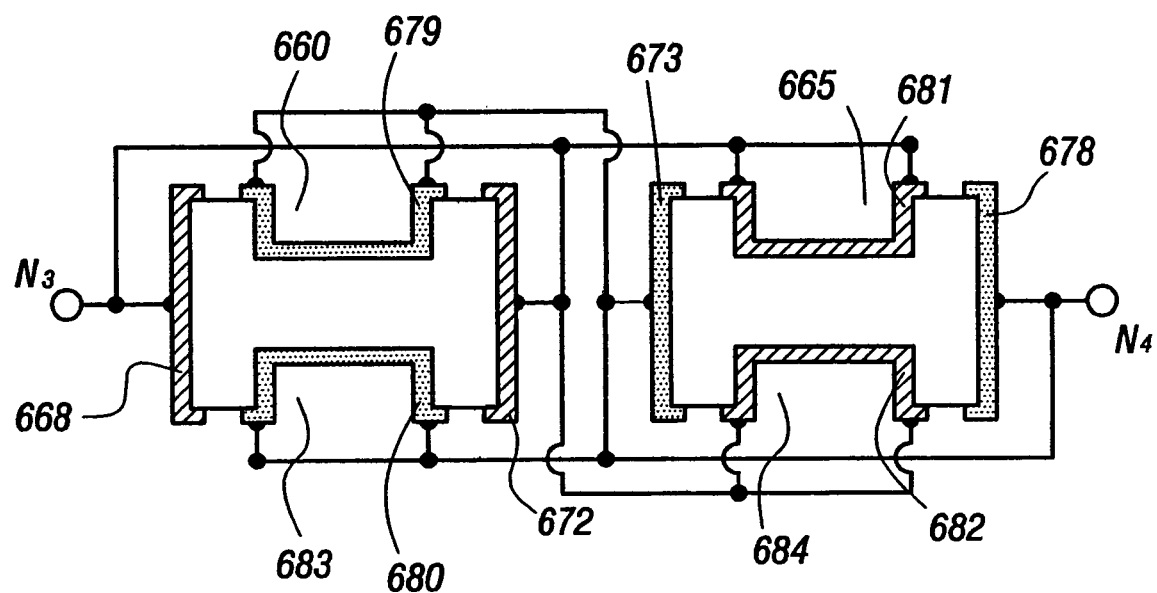
FIG. 25 shows a $J_3$-$J_4$ cross-sectional view of the tuning fork tines of FIG. 23.

In addition, a space of between the tines is given by $W_4$, and in this embodiment, the space $W_4$ and the groove width $W_2$ are constructed so that $W_4 \geq W_2$, and more, the space $W_4$ is within a range of 0.05 mm to 0.35 mm and the groove width $W_2$ is within a range of 0.03 mm to 0.12 mm because it is easy to form a tuning fork shape and grooves of the tuning fork tines separately by a photo-lithographic process and an etching process, consequently, a frequency stability for a fundamental mode vibration gets higher than that for a second overtone mode vibration. In this embodiment, a quartz wafer with the thickness t of 0.05 mm to 0.15 mm is used. In order to get a smaller-sized quartz crystal tuning fork resonator, capable of vibrating in a flexural mode, and a small motional inductance $L_1$, it is necessary that groove width $W_2$ is less than 0.07 mm, preferably, larger than 0.015 mm and less than 0.04 mm and tine width W is less than 0.18 mm, and prefer-ably, the W is larger than 0.05 mm and less than 0.1 mm, more preferably, larger than 0.03 mm and less than 0.075 mm. Also, a groove thickness $t_1$ is within a range of 0.01 mm to 0.085 mm approximately, and part widths $W_1$, $W_3$ are less than 0.021 mm, preferably, less than 0.015 mm. In more detail, a dimension of the part widths $W_1$, $W_3$ is very dependent on a manufacturing technology. Therefore, when the technology is taken into account, $W_1$ and $W_3$ have a value of larger than 0.008 mm and less than 0.015 mm, preferably, larger than 0.01 mm and less than 0.014 mm to get a small motional inductance $L_1$. In addition, the groove provided on at least one of the obverse face and the reverse face of the tuning fork tines of the present invention may be a through hole, namely, the groove thickness $t_1=0$. Moreover, another example of the tuning fork tines having $t_1=0$ is shown in FIG. 20 and which shows a plan view of a flexural mode, quartz crystal tuning fork resonator 600. In detail, the resonator 600 comprises tuning fork tines 601, 602 and tuning fork base 603, the base 603 has cut portions 604, 605, and the tines 601, 602 have central linear portions 616, 617, respectively. The tine 601 has through holes 606, 608, 610 and grooves 607, 609 and the tine 602 has through holes 611, 613, 615 and grooves 612, 614. Each of the tines 601, 602 has a width W, and the through holes and the grooves have a width $W_2$ larger than or equal to part widths $W_1$, $W_3$, where W is given by $W=W_1+W_2+W_3$. Namely, the tuning fork tines have a first tuning fork tine 601 and a second tuning fork tine 602, and three through holes are formed at each of the first and second tuning fork tines so that a width $W_2$ of the through holes is greater than the part widths $W_1$ and/or $W_3$. For example, the width $W_2$ of the through holes has a value lager than 0.02 mm and less than 0.04 mm and the part widths $W_1$ and $W_3$ have a value larger than 0.008 mm and less than 0.014 mm. In this embodiment, the through holes are dived into the length direction of the first and second tuning fork tines. When the first tuning fork tine 601 has three through holes comprising first, second and third through holes 610, 608, 606 divided in the length direction, the groove 609 is formed between the first through 610 and second through hole 608 and the groove 606 is formed between the second through hole 608 and the third through hole 606. Similar to this, when the second tuning fork tine 602 has three through holes comprising first, second and third through holes 615, 613, 611 divided in the length direction, the groove 614 is formed between the first through 615 and second through hole 613 and the groove 612 is formed between the second through hole 613 and the third through hole 611. In other words, each of the first and second tuning fork tines has three through holes divided in the length direction and a groove is formed in at least one or each of the obverse and reverse faces between two through holes. In this embodiment, though a groove is formed between two through holes, but this invention is not limited to this, the groove may be not formed between the two through holes. Namely, a frame portion is formed between the two through holes. In addition, FIG. 21 shows a $D_1$-$D_2$ cross-sectional view of the tuning fork tines 601, 602. The tine 601 has electrodes 618, 621 disposed on side surfaces and electrodes 619, 620 disposed in grooves 609, 626, while the tine 602 has electrodes 622, 625 disposed on side surfaces and electrodes 623, 624 disposed in grooves 614, 627. The electrodes 618, 621, 623, 624 are connected electrically to form an electrode terminal $G_1$, while the electrodes 619, 620, 622, 625 are connected electrically to form an electrode terminal $G_2$. Moreover, FIG. 22 shows a $D_3$-$D_4$ cross-sectional view of the tuning fork tines 601, 602. The tine 601 has electrodes 618, 621 disposed on side surfaces and electrodes 628, 629 disposed in a through hole 610, while the tine 602 has electrodes 622, 625 disposed on side surfaces and electrodes 630, 631 disposed in a through hole 615. The electrodes 618, 621, 630, 631 are connected electrically to form an electrode terminal $G_3$, while the electrodes 628, 629, 622, 625 are connected electrically to form an electrode terminal $G_4$. The electrode terminals $G_1$ and $G_3$ have the same electrical polarity, while the electrode terminals $G_2$ and $G_4$ have the same electrical polarity different from the electrical polarity of the electrode terminals $G_1$ and $G_3$. When an alternating current voltage is applied to the electrode terminals $G_1$, $G_3$ and the electrode terminals $G_2$, $G_4$, the tuning fork resonator vibrates in a flexural mode of an inverse phase. In this embodiment, frame portions are not shown at the tuning fork base 603, but the tuning fork base may have frame portions protruding from the tuning fork base. Moreover, when a length of the grooves and a length of the through holes are defined by $l_m$ and $l_a$, respectively, there are two relationships so that $l_m \geq l_a$ or $l_m < l_a$. In more detail, a length $l_a$ of the through holes in this embodiment is within a range of 0.03 mm to 0.45 mm, preferably, 0.05 mm to 0.3 mm and a length $l_m$ of the grooves is within a range of 0.01 mm to 0.5 mm, preferably, 0.025 mm to 0.35 mm. One of the two relationships is selected so that the tuning fork resonator has a small motional inductance $L_1$. It is needless to say that a relationship of the length $l_a$ and the length $l_m$ can be applied to a tuning fork resonator in FIG. 23. In addition, a further example of the tuning fork tines having $t_1=0$ is shown in FIG. 23 and which shows a plan view of a flexural mode, quartz crystal tuning fork resonator 650. In detail, the resonator 650 comprises tuning fork tines 651, 652 and tuning fork base 653, the base 653 has cut portions 654, 655, and the tines 651, 652 have central linear portions 666, 667, respectively. The tine 651 has through holes 656, 657, 658, 659 and a groove 660 and the tine 652 has through holes 661, 662, 663, 664 and a groove 665. Each of the tines 601, 602 has a width W, and the grooves have a width $W_2$ larger than or equal to part widths $W_1$, $W_3$, where W is given by $W=W_1+W_2+W_3$. Namely, when each of the first and second tuning fork tines has a first side surface and a second side surface opposite the first side surface, and obverse and reverse faces each of which has a central linear portion, a through hole is formed between the first side surface and the central linear portion and/or a through hole is formed between the second side surface and the central linear portion so that the central linear portion is not included in the through hole. Namely, a width of the through hole is less than a half of the tine width W. In this embodiment, the through holes are divided into the width and length directions of the corresponding one of the first and second tuning fork tines. The groove 660 is formed between the through holes 656, 657, between the through holes 658, 659, between 656, 658 and between the through holes 657, 659, while the groove 665 is formed between the through holes 661, 662, between the through holes 663, 664, between 661, 663 and between the through holes 662, 664. Namely, the through holes 656, 657, 658, 659 are formed in the groove 660 and the through holes 661, 662, 663, 664 are formed in the groove 665. In this embodiment, though a groove is formed between the through holes, this invention is not limited to this, but the groove may be not formed between the through holes. In addition, two through holes at each of left and right sides of the central linear portion are formed in the length direction in this embodiment, but the through holes more than two may be formed in the length direction. In addition, two through holes are formed symmetrically in the width direction to the central linear portion in this embodiment, but the two through holes may be formed asymmetrically in the width direction to the central linear portion. Moreover, FIG. 24 shows a $J_1$-$J_2$ cross-sectional view of the tuning fork tines 651, 652. The tine 651 has electrodes 668, 672 disposed on side surfaces and electrodes 669, 670, 671 disposed in through holes 656, 657, while the tine 652 has electrodes 673, 678 disposed on side surfaces and electrodes 674, 675, 676 disposed in through hole 661, 662. The electrodes 668, 672, 674, 675, 676 are connected electrically to form an electrode terminal $N_1$, while the electrodes 669, 670, 671, 673, 678 are connected electrically to form an electrode terminal $N_2$. In addition, FIG. 25 shows a $J_3$-$J_4$ cross-sectional view of the tuning fork tines 651, 652. The tine 651 has electrodes 668, 672 disposed on side surfaces and electrodes 679, 680 disposed in grooves 660, 683, while the tine 652 has electrodes 673, 678 disposed on side surfaces and electrodes 681, 682 disposed in grooves 665, 684. The electrodes 668, 672, 681, 682 are connected electrically to form an electrode terminal $N_3$, while the electrodes 679, 680, 673, 678 are connected electrically to form an electrode terminal $N_4$. The electrode terminals $N_1$ and $N_3$ have the same electrical polarity, while the electrode terminals $N_2$ and $N_4$ have the same electrical polarity different from the electrical polarity of the electrode terminals $N_1$ and $N_3$. When an alternating current voltage is applied to the electrode terminals $N_1$, $N_3$ and the electrode terminals $N_2$, $N_4$, the tuning fork resonator vibrates in a flexural mode of an inverse phase. In this embodiment, frame portions are not shown at the tuning fork base 653, but the tuning fork base may have frame portions protruding from the tuning fork base. Moreover, the through holes are formed at each of first and second tuning fork tines by etching simultaneously with the first and second tuning fork tines. But, at least one through hole may be formed at each of first and second tuning fork tines by etching in a step different from the step of forming the first and second tuning fork tines. In addition, each of the first and second tuning fork tines has a plurality of through holes in the length direction, an overall length of the through holes is within a range of 20% to 80%, preferably, 30% to 70%, of a length of each of the tuning fork tines. Moreover, when a width of the groove formed in the width direction between two through holes and a width of the through holes are defined by $w_m$ and $w_a$, respectively, the groove and the through holes are formed so that $w_m \geq w_a$ or $w_m < w_a$. Namely, they are formed so that the tuning fork resonator has a small motional inductance $L_1$. Also, a width of the through holes in this embodiment is within a range of 0.008 mm to 0.03 mm, preferably, 0.01 mm to 0.02 mm. As a result, the tuning fork resonator can be obtained with a small motional inductance $L_1$, so that an oscillating circuit with the tuning fork resonator can be provided with short rise-time of an output signal when an alternating current voltage is applied to the oscillating circuit.

In more detail, to obtain a flexural mode, quartz crystal tuning fork resonator with a high frequency stability which gives high time accuracy, it is necessary to obtain the resonator whose resonance frequency is not influenced by shunt capacitance because quartz crystal is a piezoelectric material and the frequency stability is very dependent on the shunt capacitance. In order to decrease the influence on the resonance frequency by the shunt capacitance, figure of merit $M_i$ (hereafter a merit value $M_i$) plays an important role. Namely, the merit value $M_i$ that expresses inductive characteristics, electromechanical transformation efficiency and a quality factor of a flexural mode, quartz crystal tuning fork resonator, is defined by a ratio ($Q_i/r_i$) of a quality factor $Q_i$ and capacitance ratio $r_i$, namely, $M_i$ is given by $M_i=Q_i/r_i$, where i shows vibration order of the resonator, and for example, when i=1 and 2, the merit values $M_1$ and $M_2$ are a value for a fundamental mode vibration and a second overtone mode vibration of the flexural mode, quartz crystal tuning fork resonator, respectively.

Also, a frequency difference $\Delta f$ of resonance frequency $f_s$ of mechanical series independent on the shunt capacitance and resonance frequency $f_r$ dependent on the shunt capacitance is inversely proportional to the merit value $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, quartz crystal tuning fork resonator becomes because the resonance frequency $f_r$ of the resonator is almost never dependent on the shunt capacitance. Namely, the quartz crystal tuning fork resonator can be provided with a high time accuracy.

In detail, the flexural mode, quartz crystal tuning fork resonator can be obtained with the merit value $M_1$ of the fundamental mode vibration larger than the merit value $M_2$ of the second overtone mode vibration by the above-described tuning fork shape, grooves and dimensions. That is to say, a relationship of $M_1 > M_2$ is obtained. As an example, when resonance frequency of a flexural mode, quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, the resonator has a value of $M_1 > 65$ and $M_2 < 30$, respectively.

Namely, the flexural mode, quartz crystal tuning fork resonator which vibrates in the fundamental mode can be provided with high inductive characteristics, good electromechanical transformation efficiency (small capacitance ratio $r_1$ and small series resistance $R_1$) and a high quality factor. As a result, a frequency stability of the fundamental mode vibration becomes higher than that of the second overtone mode vibration, and simultaneously, the second overtone mode vibration can be suppressed because capacitance ratio $r_2$ and series resistance $R_2$ of the second overtone mode vibration become larger than capacitance ratio $r_1$ and series resistance $R_1$ of the fundamental mode vibration, respectively. In particular, $r_2$ has a value larger than 1500 in this embodiment.

Therefore, the resonator capable of vibrating in the fundamental mode vibration can be provided with a high time accuracy because it has the high frequency stability. Consequently, a quartz crystal oscillator comprising the flexural mode, quartz crystal tuning fork resonator of this embodiment outputs an oscillation frequency of the fundamental mode vibration as an output signal, and the frequency of the output signal has a very high stability, namely, excellent time accuracy. In other words, the quartz crystal oscillator of this embodiment has a remarkable effect such that a frequency change by ageing becomes extremely small. Also, an oscillation frequency of the resonator of this embodiment is adjusted so that a frequency deviation is within a range of −100 PPM to +100 PPM to a nominal frequency, e.g. 32.768 kHz, after mounting it at a mounting portion of a case or a lid by conductive adhesives or solder.

In addition, the groove thickness $t_1$ of the present invention is the thinnest thickness of the grooves because quartz crystal is an anisotropic material and the groove thickness $t_1$ has a distribution when it is formed by a chemical etching method. In detail, a groove shape of the sectional view of tuning fork tines in FIG. 5 has a rectangular shape, but the groove shape has an about U shape actually. In the above-described embodiments, though the grooves are constructed at the tines, this invention is not limited to this, namely, a relationship of the merit values $M_1$ and $M_2$ can be applied to the conventional flexural mode, quartz crystal tuning fork resonator and a relationship of a quartz crystal oscillating circuit comprising an amplification circuit and a feedback circuit can be also applied to the conventional flexural mode, quartz crystal tuning fork resonator to suppress a second overtone mode vibration and to get a high frequency stability for a fundamental mode vibration of the tuning fork resonator.

Figure 7:
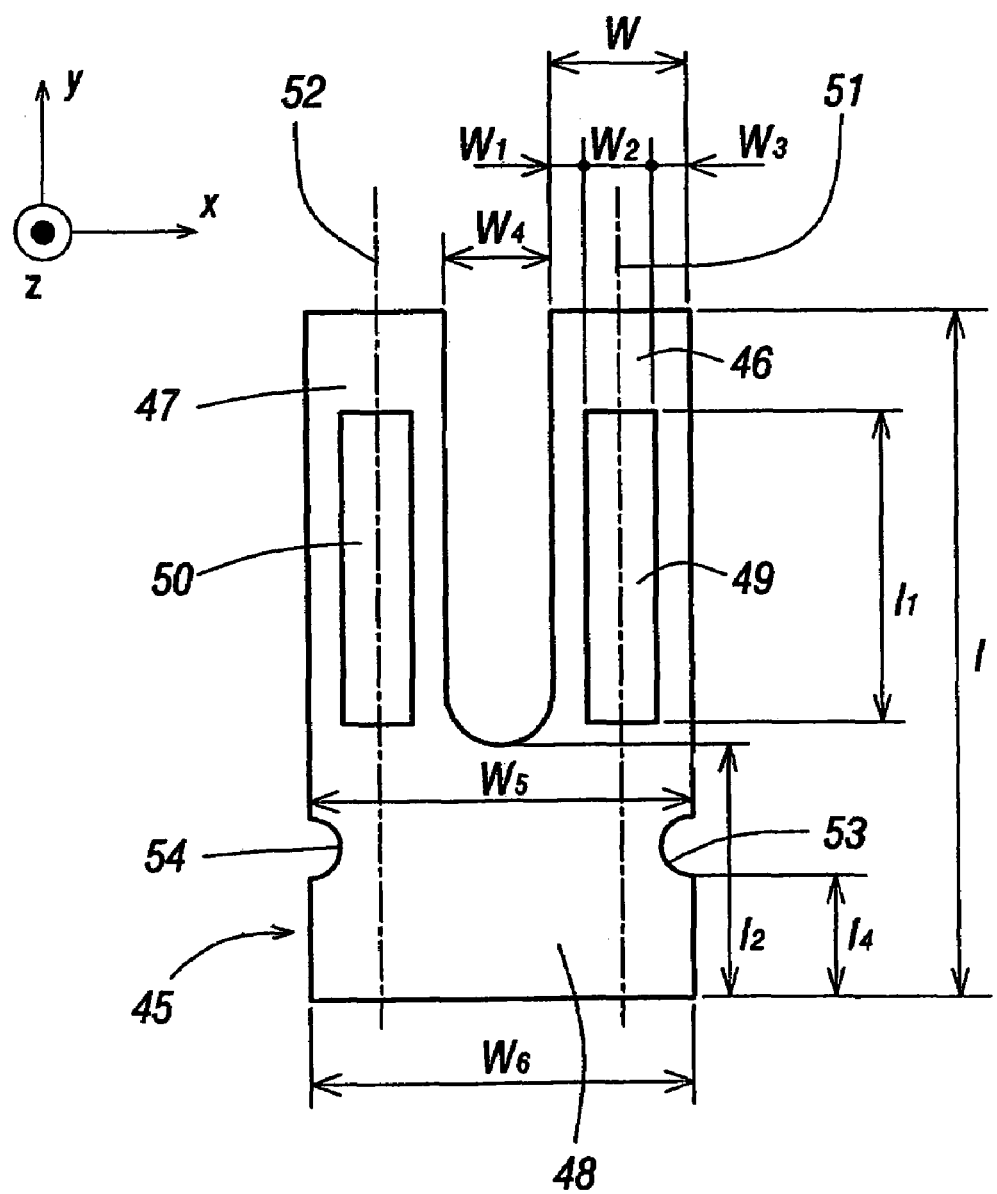
FIG. 7 shows a plan view of a flexural mode, quartz crystal tuning fork resonator constructing a quartz crystal oscillator, which constructs an electronic apparatus of the second embodiment of the present invention.

FIG. 7 shows a plan view of a flexural mode, quartz crystal tuning fork resonator 45 which is one of a contour mode quartz crystal resonator, constructing a quartz crystal oscillator, which constructs an electronic apparatus of the second embodiment of the present invention. The resonator 45 comprises tuning fork tines 46, 47 and a tuning fork base 48. The tines 46, 47 and the base 48 are formed integrally by a chemical etching process. In this embodiment, the base 48 has cut portions 53 and 54. Also, a groove 49 is constructed to include a portion of the central line 51 of the tine 46, and a groove 50 is similarly constructed to include a portion of the central line 52 of the tine 47. In this embodiment, the grooves 49 and 50 are constructed at a part of the tines 46 and 47, and have groove width $W_2$ and groove length $l_1$. In more detail, a groove area $S (=W_2 \times l_1)$ has a value of 0.01 mm² to 0.12 mm², preferably, greater than 0.01 mm² and less than 0.043 mm² because it is very easy to form the grooves by a chemical etching process and the quartz crystal tuning fork resonator can be provided with good electromechanical transformation efficiency by the formation of the grooves.

Namely, the quartz crystal tuning fork resonator, capable of vibrating in a fundamental mode and having a high frequency stability can be provided with a small series resistance $R_1$ and a high quality factor $Q_1$. Therefore, a quartz crystal oscillator having the high frequency stability can be realized with an output signal of a frequency of the fundamental mode vibration. In this embodiment, though electrodes are not shown in FIG. 7, the electrodes are disposed inside the grooves 49, 50 and on sides of the tines 46 and 47, similar to the resonator of FIG. 4. In detail, the electrodes are disposed opposite each other inside the grooves and on the sides of the tines so that the electrodes disposed opposite each other are of opposite electrical polarity. In more detail, a groove is provided on both of an obverse face and a reverse face of tuning fork tines having a first tuning fork tine and a second tuning fork tine, and also, a first electrode is disposed inside the groove and a second electrode is disposed on both sides of the tuning fork tines. In addition, a quartz crystal tuning fork resonator has two electrode terminals, the one of the electrode terminals comprises a first electrode disposed inside a groove provided on both of the obverse face and the reverse face of the first tuning fork tine and a second electrode disposed on the both sides of the second tuning fork tine, such that the first and second electrodes are connected, and the other of the electrode terminals comprises a second electrode disposed on the both sides of the first tuning fork tine and a first electrode disposed inside a groove provided on both of the obverse face and the reverse face of the second tuning fork tine, such that the second and first electrodes are connected. In this embodiment, a groove is provided on both of an obverse face and a reverse face of tuning fork tines, but the present invention in not limited to this, for example, a groove may be provided on at least one of an obverse face and a reverse face of tuning fork tines.

Figure 15:
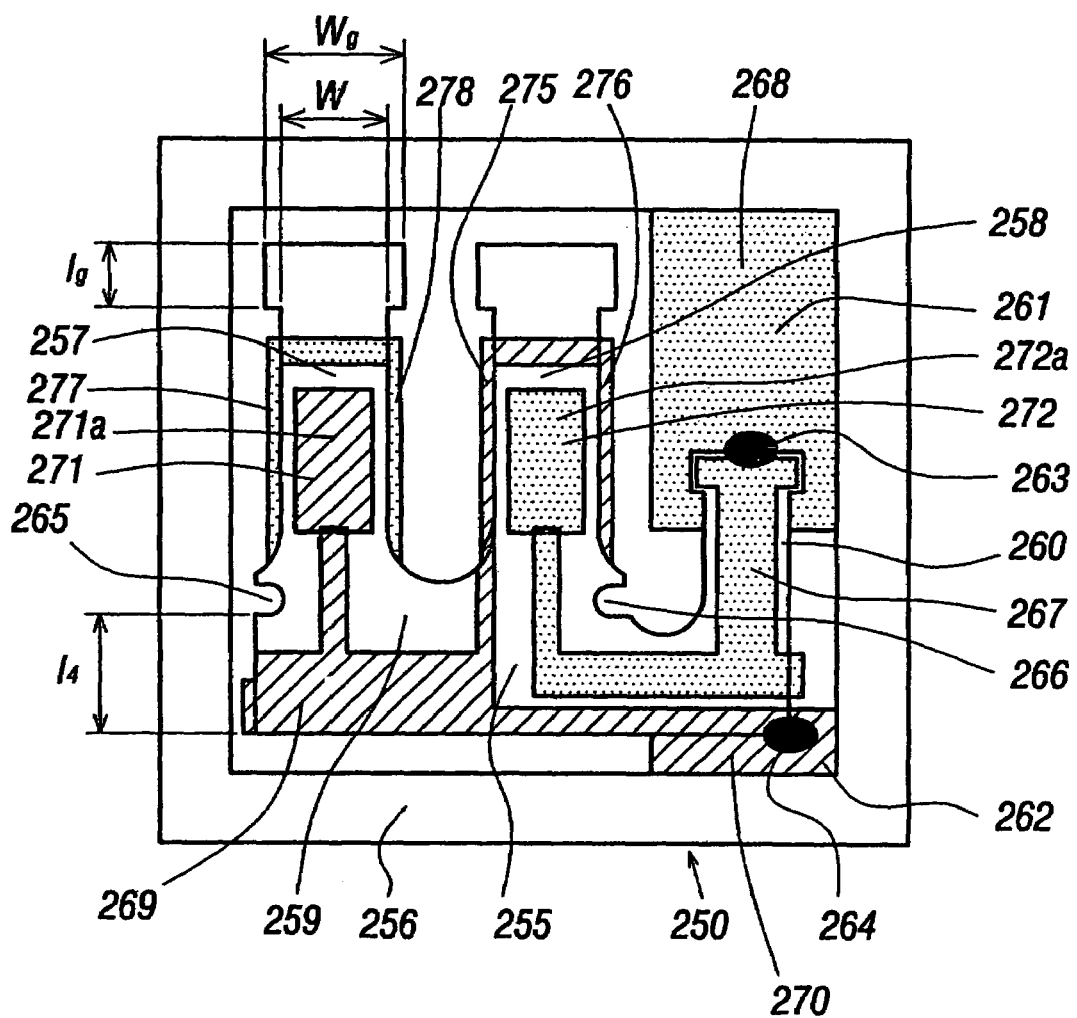
FIG. 15 shows a plan view of a quartz crystal unit of the present invention and omitting a lid, and constructing a quartz crystal oscillator and an electronic apparatus of the present invention.
Figure 16:
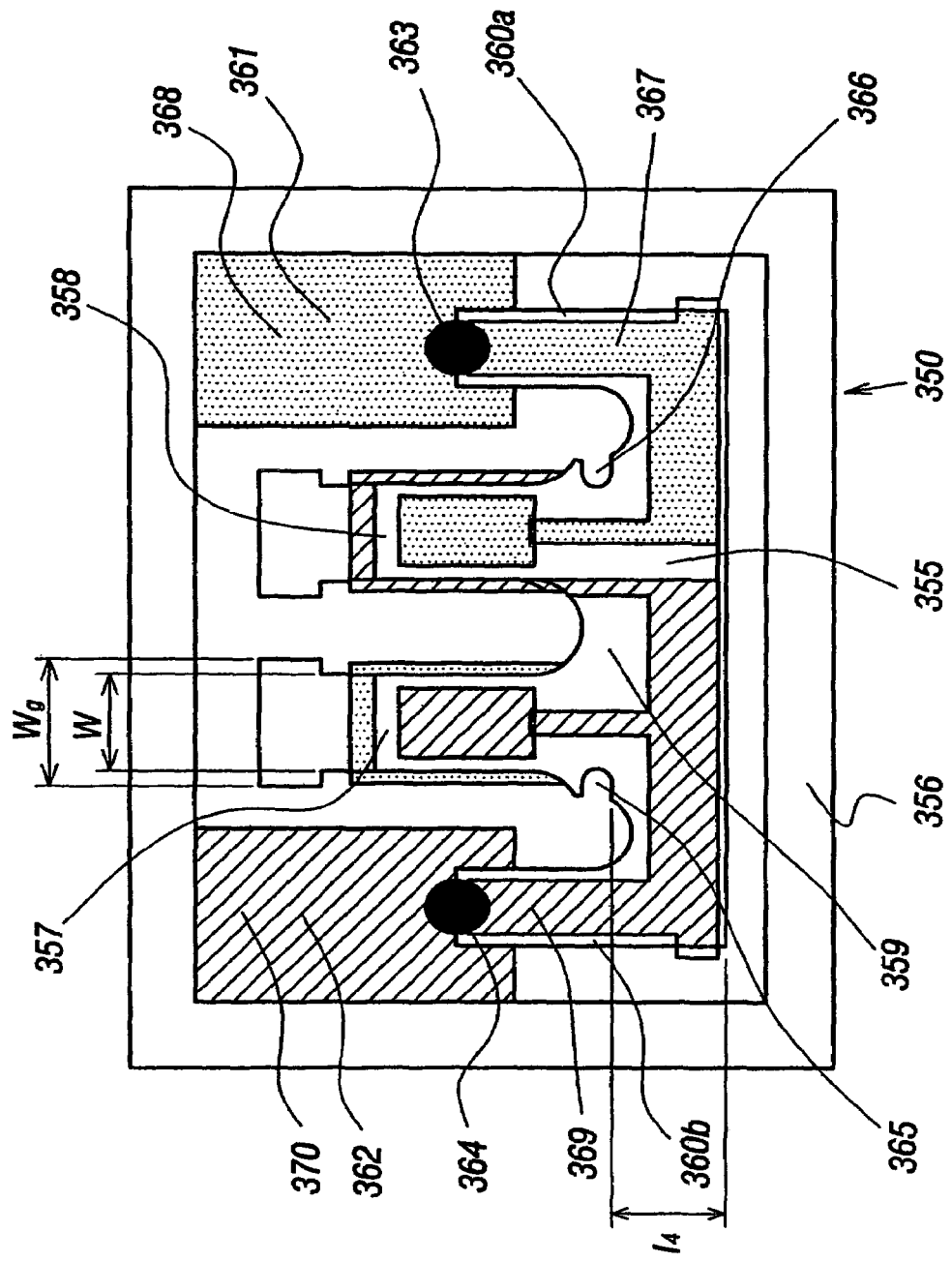
FIG. 16 shows a plan view of a quartz crystal unit of the present invention and omitting a lid, and constructing a quartz crystal oscillator and an electronic apparatus of the present invention.
Figure 17:
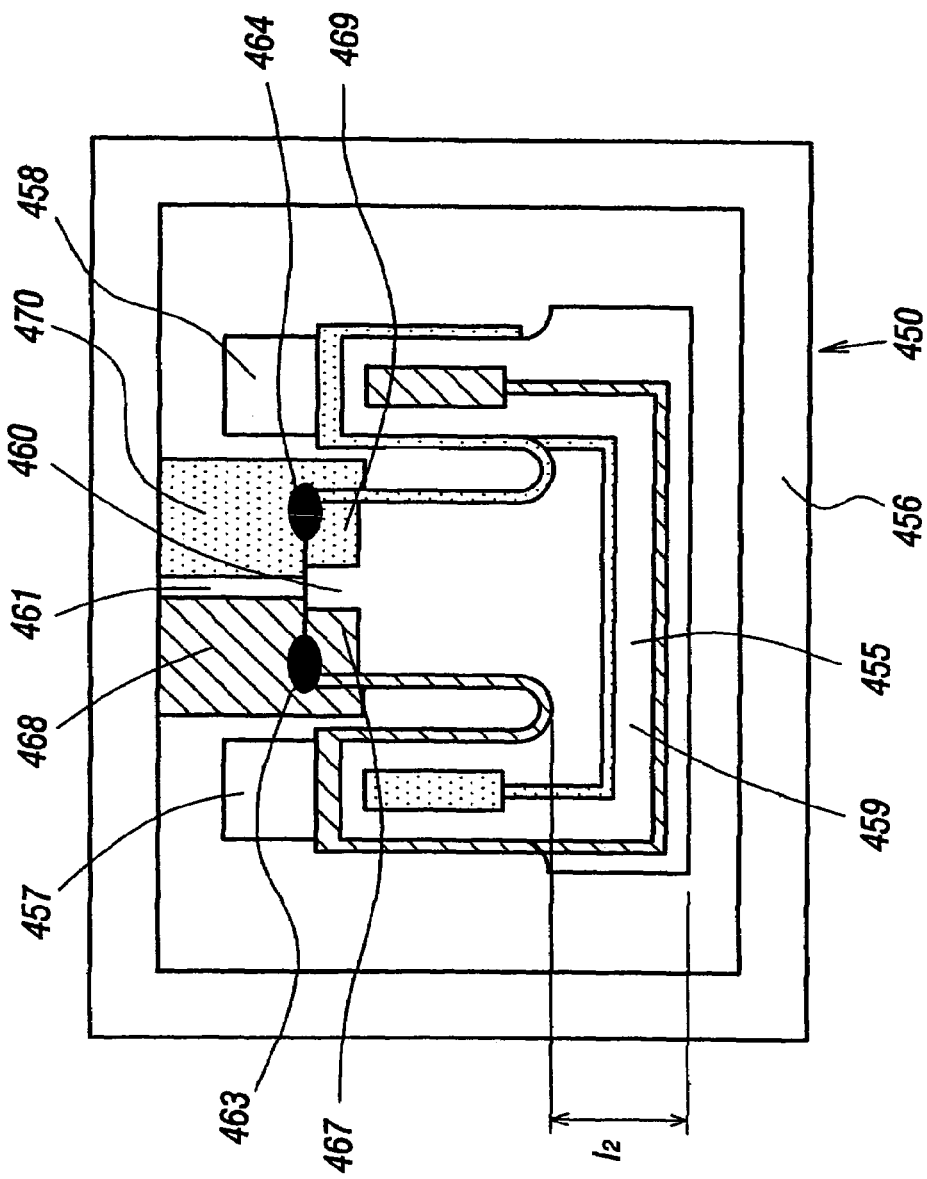
FIG. 17 shows a plan view of a quartz crystal unit of the present invention and omitting a lid, and constructing a quartz crystal oscillator and an electronic apparatus of the present invention.

In addition, the base 48 has cut portions 53 and 54, and the cut base 48 has a dimension of width $W_5$ (tines side) and width $W_6$ (opposite side to the tines side). Also, the cut base 48 has a length $l_4$ between one of the cut portions and the side opposite to the tines side, and the length $l_4$ is within a range of 0.05 mm to 0.3 mm, preferably, 0.12 mm to 0.25 mm to reduce energy losses which are caused by vibration. When the base 48 is mounted at a mounting portion (e.g. on two lead wires for a package of a tubular type) of a case or a lid of a surface mounting type or a tubular type by solder or conductive adhesives, it is necessary to satisfy $W_6 \geqq W_5$ to decrease energy losses by vibration. The cut portions 53 and 54 are very effective to decrease the energy losses. Therefore, the flexural mode, quartz crystal tuning fork resonator, capable of vibrating in the fundamental mode and having the high frequency stability (high time accuracy) can be provided with a small series resistance $R_1$ and a high quality factor $Q_1$. Also, the width dimensions $W=W_1+W_2+W_3$ and $W_4$, and the length dimensions $l_1$, $l_2$ and $l$ are as already described in relation to FIG. 6. In addition, a shape of the tuning fork base according to the present invention is not limited to that of this embodiment, for example, a tuning fork base may have a frame portion protruding from the tuning fork base, and the frame portion is mounted at a mounting portion of a case or a lid of a package. The matter described above implies that, for example, when the tuning fork tines have a first tuning fork tine and a second tuning fork tine, the first tuning fork tine is between the second tuning fork tine and the frame portion protruding from the tuning fork base as shown in FIG. 15 which shows a plan view of a quartz crystal unit and omitting a lid. In more detail, the quartz crystal unit 250 comprises a quartz crystal tuning fork resonator 255 capable of vibrating in a flexural mode of an inverse phase, a case 256 for housing the resonator and a lid for covering an open end of the case (not shown here). Namely, the resonator 255 comprises tuning fork tines 257, 258 and a tuning fork base 259 connected to the tuning fork tines, and the tuning fork base 259 has a frame portion 260 protruding from the tuning fork base. Also, the case 256 has mounting portions 261 and 262, and the frame portion 260 is mounted on the mounting portion 261 of the case 256. In detail, an electrode 267 disposed at the frame portion 260 is connected to an electrode 268 disposed on the mounting portion 261 by adhesives 263 or a metal such as solder, and similarly, an electrode 269 disposed on the tuning fork base 259 is connected to an electrode 270 disposed on the mounting portion 262 by adhesives 264 or a metal such as solder. In addition, the tuning fork tines 257, 258 have grooves 271, 273 (not shown here), 272 and 274 (not shown here), the grooves 271 and 272 are formed opposite to the grooves 273 and 274 in the thickness direction, respectively. The electrodes 271a and 273a disposed inside the grooves 271 and 273 of the tine 257 are connected to the electrodes 275 and 276 disposed on side surfaces of the tine 258 to define a first electrode terminal, while the electrodes 272a and 274a disposed inside the grooves 272 and 274 of the tine 258 are connected to the electrodes 277 and 278 disposed on side surfaces of the tine 257 to define a second electrode terminal. Moreover, each of the tines 257, 258 has a width W and a width $W_g$ greater than the width W, preferably, the width $W_g$ is less than three times of the width W to get a small motional inductance $L_1$. As a result of which the tuning fork resonator can be provided with a smaller size because the width $W_g$ operates as mass and a short length of the tuning fork tines can be obtained for a frequency of oscillation, e.g. 32.768 kHz. For example, when the width W is larger than 0.03 mm and less than 0.075 mm, the width $W_g$ is larger than 0.04 mm and less than 0.23 mm. For example, a difference ($W_g-W$) is within a range of 0.008 mm to 0.1 mm, preferably, 0.01 mm to 0.05 mm to get enough mass effect. Also, each of the tines 257, 258 has a length $l_g$ less than about 80% of a length of each of the tines measured from the free end of each of the tines. This is the reason why when each of the tines has the width W with a frequency, e.g. 32.8 kHz with the length $l_g=0$, about the same frequency can be obtained as the frequency of 32.8 kHz for the width W by forming the length $l_g$ of about 80%. Namely, the tuning fork resonator can be obtained with a small motional inductance $L_1$ because the width of the tines becomes larger actually and the electromechanical transformation efficiency gets larger. In order to get a large mass effect by the length $l_g$, each of the tines, preferably, has the length $l_g$ less than a half of the length of each of the tines measured from the free end of each of the tines. For example, the length $l_g$ is larger than 0.15 mm and less than 1.1 mm, preferably, larger than 0.2 mm and less than 0.7 mm. In general, metal films for adjusting an oscillation frequency of the resonator are formed on main surfaces having the width $W_g$, and the oscillation frequency is adjusted by trimming at least one of the metal films. In addition, the tuning fork base has cut portions 265, 266 and the length $l_4$, and the frame portion is connected to the tuning fork base having the length $l_4$. In addition, another example is shown in FIG. 16 which shows a plan view of a quartz crystal unit and omitting a lid. In more detail, the quartz crystal unit 350 comprises a quartz crystal tuning fork resonator 355 capable of vibrating in a flexural mode of an inverse phase, a case 356 for housing the resonator and a lid for covering an open end of the case (not shown here). Namely, the resonator 355 comprises tuning fork tines 357, 358 and a tuning fork base 359 connected to the tuning fork tines, and the tuning fork base 359 has two frame portions 360a, 360b protruding from the tuning fork base. Also, the case 356 has mounting portions 361 and 362, and the frame portions 360a and 360b is, respectively, mounted on the mounting portion 361 and 362 of the case 356. In detail, an electrode 367 disposed at the frame portion 360a is connected to an electrode 368 disposed on the mounting portion 361 by adhesives 363 or a metal such as solder, and similarly, an electrode 369 disposed at the frame portion 360b is connected to an electrode 370 disposed on the mounting portion 362 by adhesives 364 or a metal such as solder. In addition, the tuning fork base has two cut portions 365 and 366, the tuning fork tines 357, 358 have the same as the grooves, the electrodes and the shape of the tuning fork tines shown in FIG. 15. In addition, a further example is shown in FIG. 17 which shows a plan view of a quartz crystal unit and omitting a lid. In more detail, the quartz crystal unit 450 comprises a quartz crystal tuning fork resonator 455 capable of vibrating in a flexural mode of an inverse phase, a case 456 for housing the resonator and a lid for covering an open end of the case (not shown here). Namely, the resonator 455 comprises tuning fork tines 457, 458 and a tuning fork base 459 connected to the tuning fork tines, and the tuning fork base 459 has a frame portion 460 protruding from the tuning fork base. Also, the case 456 has mounting portions 461, and the frame portion 460 is mounted on the mounting portion 461 of the case 456. In detail, an electrode 467 disposed at the frame portion 460 is connected to an electrode 468 disposed on the mounting portion 461 by adhesives 463 or a metal such as solder, and similarly, an electrode 469 disposed at the frame portion 460 is connected to an electrode 470 disposed on the mounting portion 461 by adhesives 464 or a metal such as solder. In addition, the tuning fork tines 457, 458 have the same as the grooves and the electrodes shown in FIG. 14. Namely, the frame portion protruding from the tuning fork base is between the first tuning fork tine and the second tuning fork tine, and is mounted on the mounting portion of the case. In addition, when each of the first and second tuning fork tines has a mass $M_t$ and the frame portion has a mass $M_f$, a summation of $(2M_t+M_f)$ is greater than a mass $M_b$ of the tuning fork base having a length $l_2$ to get good shock-proof, preferably, a summation of $(2M_t+M_f/2)$ is greater than a mass $M_b$ of the tuning fork base to get further good shock-proof.

FIG. 8a and FIG. 8b are a top view and a side view for a length-extensional mode quartz crystal resonator which is one of a contour mode resonator, constructing a quartz crystal oscillator, which constructs an electronic apparatus of the third embodiment of the present invention. The resonator 62 comprises a vibrational portion 63, connecting portions 66, 69 and supporting portions 67, 80 including respective mounting portions 68, 81. In addition, the supporting portions 67 and 80 have respective holes 67a and 80a. Also, electrodes 64 and 65 are disposed opposite each other on upper and lower faces of the vibrational portion 63, and the electrodes have opposite electrical polarities. Namely, a pair of electrodes is disposed on the vibrational portion. In this case, a fundamental mode vibration can be excited easily. In more detail of this embodiment, the resonator 62 has the vibrational portion 63, first and second supporting portions 67, 80, and first and second connecting portion 66, 69. Namely, the first supporting portion is connected to the vibrational portion through the first connecting portion, and the second supporting portion is connected to the vibrational portion through the second connecting portion, so that two supporting portions are constructed. Therefore, the two supporting portions may have the first supporting portion and the second supporting portion connected each other, namely, it is needless to say that the supporting portions of the present invention include the supporting portions connected each other.

In addition, the electrode 64 extends to the mounting portion 81 through the one connecting portion 69 and the electrode 65 extends to the mounting portion 68 through the other connecting portion 66. In this embodiment, the electrodes 64 and 65 disposed on the vibrational portion 63 extend to the mounting portions of the different direction each other. But, the electrodes may be constructed in the same direction. The resonator in this embodiment is mounted on fixing portions of a case or a lid at the mounting portions 68 and 81 by conductive adhesives or solder.

Here, a cutting angle of the length-extensional mode quartz crystal resonator is shown. First, a quartz crystal plate perpendicular to x axis, so called, X plate quartz crystal is taken. Length $L_0$, width $W_0$ and thickness $T_0$ which are each dimension of the X plate quartz crystal correspond to the respective directions of y, z and x axes.

Next, this X plate quartz crystal is, first, rotated with an angle $\theta_x$ of −30° to +30° about the x axis, and second, rotated with an angle $\theta_y$ of −40° to +40° about y' axis which is the new axis of the y axis. In this case, the new axis of the x axis changes to x' axis and the new axis of the z axis changes to z'' axis because the z axis is rotated twice about two axes. The length-extensional mode quartz crystal resonator of the present invention is formed from the quartz crystal plate with the rotation angles.

In other words, according to an expression of IEEE notation, a cutting angle of the resonator of the present invention can be expressed by XYtl(−30° to +30°)/(−40° to +40°). By choosing a cutting angle of the resonator, a turn over temperature point $T_p$ can be taken at an arbitrary temperature. In this embodiment, length $L_0$, width $W_0$ and thickness $T_0$ correspond to y', z'' and x' axes, respectively. But, when the X plate is rotated once about the x axis, the z'' axis corresponds to the z' axis. In addition, the vibrational portion 63 has a dimension of length $L_0$ greater than width $W_0$ and thickness $T_0$ smaller than the width $W_0$. Namely, a coupling between length-extensional mode and width-extensional mode gets so small as it can be ignored, as a result of which, the quartz crystal resonator can vibrate in a single length-extensional mode.

Figure 18:
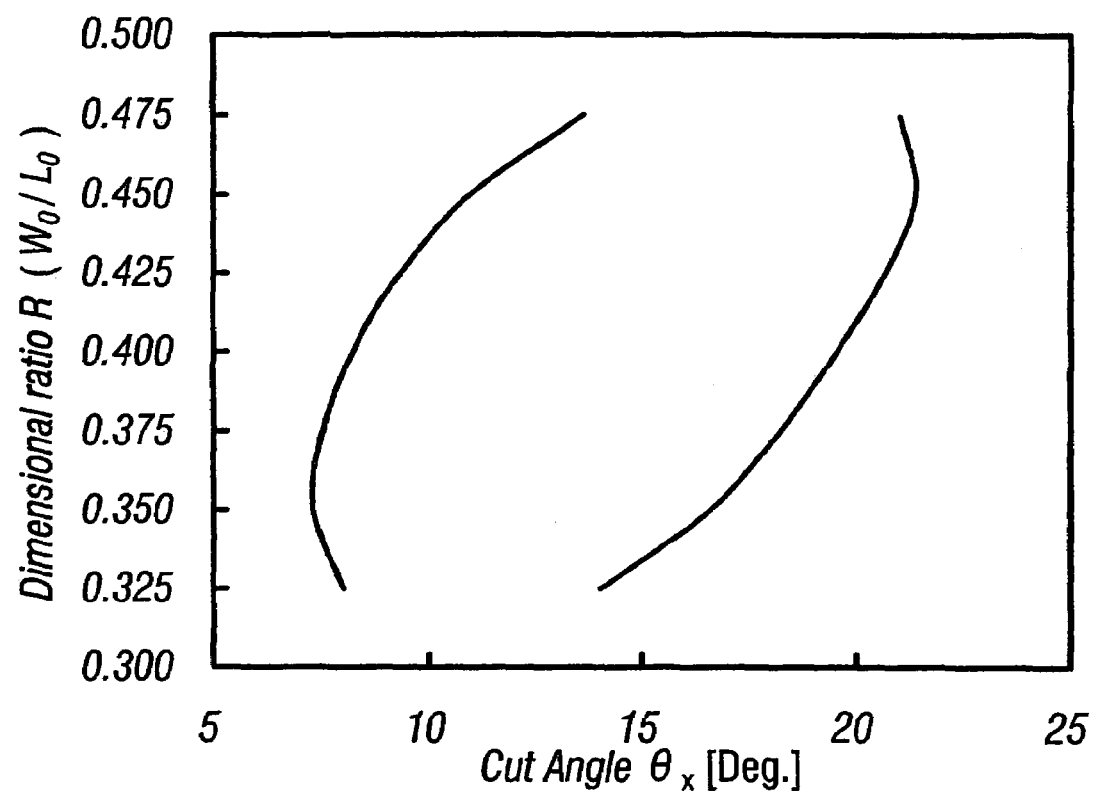
FIG. 18 shows a relationship between a dimensional ratio $R=W_0/L_0$ and a cut angle $\theta_x$ of a length extensional mode quartz crystal resonator to give a zero temperature coefficient.

In more detail, resonance frequency of the length-extensional mode resonator is inversely proportional to length $L_0$, and it is almost independent on such an other dimension as width $W_0$, thickness $T_0$, connecting portions and supporting portions. Also, in order to obtain a length-extensional mode quartz crystal resonator capable of vibrating in a fundamental mode with a frequency of 1 MHz to 10 MHz, the length $L_0$ is within a range of about 0.26 mm to about 2.7 mm. In addition, when a length-extensional mode resonator vibrates in an overtone mode, an odd number (n) pair of electrodes are disposed on a vibrational portion of the resonator, where n has a value of 1, 3, 5, . . . . In this case, the length $L_0$ is within a range of about (0.26 to 2.7)×n mm. Thus, the miniature length-extensional mode resonator can be provided with the frequency of 1 MHz to 10 MHz. In addition, FIG. 18 shows a relationship between a dimensional ratio $R=W_0/L_0$ and a cut angle $\theta_x$ of the length-extensional mode quartz crystal resonator to give a zero temperature coefficient, namely, when the ratio R is in the range of 0.325 to 0.475 and the cut angle $\theta_x$ is in the range of about 7° to about 22°, there are many zero temperature coefficients, where the cut angle $\theta_x$ is defined by XYt($\theta_x$) according to an expression of the IEEE notation. In addition, when the ratio R is in the range of 0.3 to 0.325 and 0.475 to 0.5, and the cut angle $\theta_x$ is in the range of 6° to 7° and 22° to 23°, there is a small first order temperature coefficient. Therefore, in order to get a turn over temperature point over a wide temperature range, the ratio R is in the range of 0.3 to 0.5, the cut angle of the resonator is within a range of XYt(6° to 23°).

Next, a value of a piezoelectric constant $e_{12}$ ($=e'_{12}$) is described, which is of great importance and necessary to excite a flexural mode, quartz crystal resonator and a length-extensional mode quartz crystal resonator of the present invention. The larger a value of the piezoelectric constant $e_{12}$ becomes, the higher electromechanical transformation efficiency becomes. The piezoelectric constant $e_{12}$ of the present invention can be calculated using the piezoelectric constants $e_{11}=0.171$ C/m$^2$ and $e_{14}=-0.0406$ C/m$^2$ of quartz crystal. As a result, the piezoelectric constant $e_{12}$ of the present invention is within a range of 0.095 C/m$^2$ to 0.19 C/m$^2$ approximately in an absolute value. It is, therefore, easily understood that this value is enough large to obtain a flexural mode, quartz crystal tuning fork resonator and a length-extensional mode quartz crystal resonator with a small series resistance $R_1$ and a high quality factor Q. Especially, in order to obtain a flexural mode, quartz crystal tuning fork resonator with a smaller series resistance $R_1$, the $e_{12}$ is within a range of 0.12 C/m$^2$ to 0.19 C/m$^2$ in the absolute value, and also, a groove and electrodes are provided on at least one of an obverse face and a reverse face of tuning fork tines so that when each tuning fork tine is divided into two portions (an inner portion located at a fork side and an outer portion located opposite to the fork side) versus a central line portion thereof, a value of $e_{12}$ of each portion of each tuning fork tine has an opposite sign each other. Namely, when the one of the two portions has $e_{12}$ of a plus sign, the other of the two portions has $e_{12}$ of a minus sign. In more detail, a groove and electrodes are provided at tuning fork tines so that a sign of $e_{12}$ of inner portions of each tuning fork tine is opposite to the sign of $e_{12}$ of outer portions of each tuning fork tine.

When an alternating current voltage is applied between the electrodes 64 and 65 shown in FIG. 8b, an electric field $E_x$ occurs alternately in the thickness direction, as shown by the arrow direction of the solid and broken lines in FIG. 8b. Consequently, the vibrational portion 63 is capable of extending and contracting in the length direction.

Figure 9:
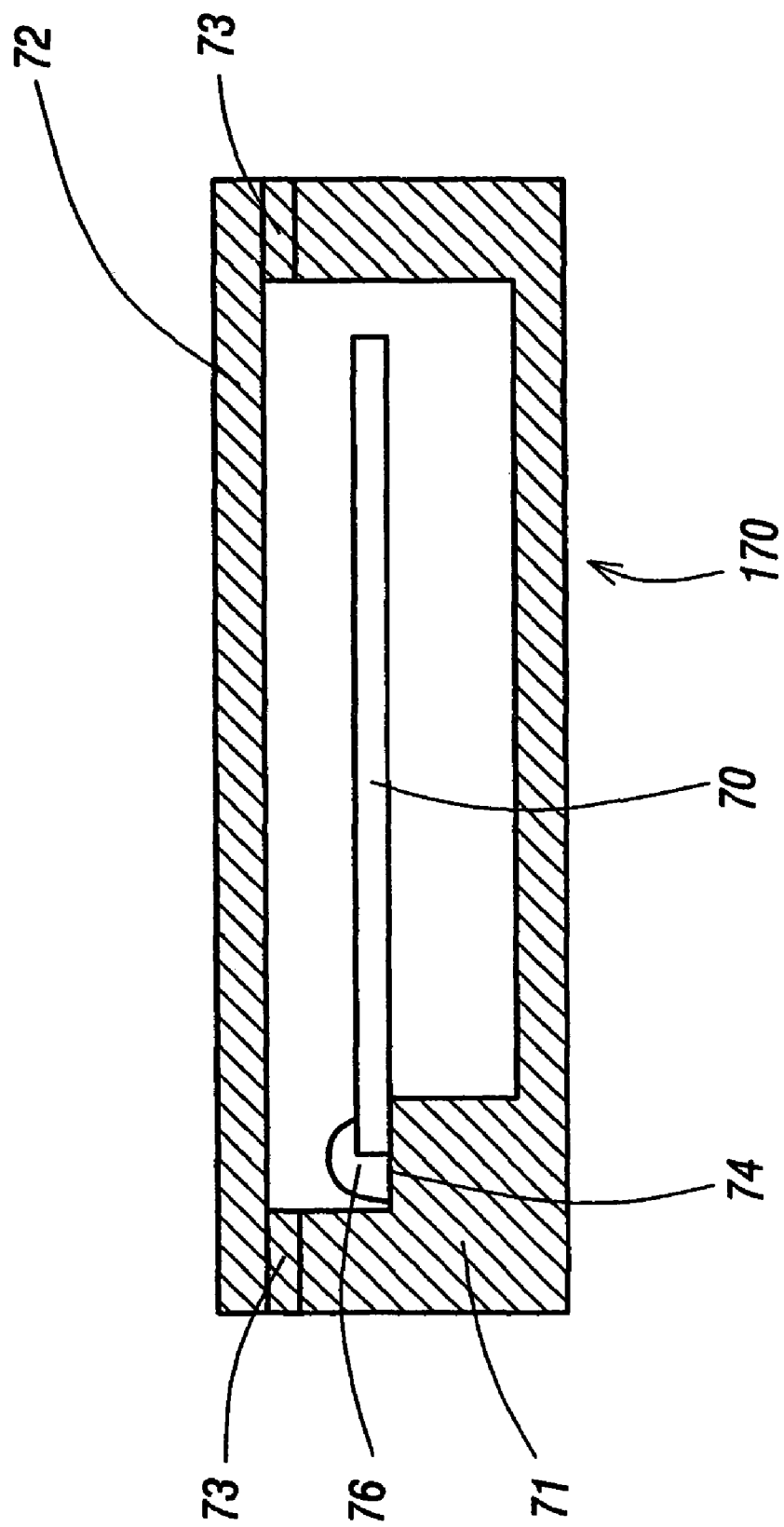
FIG. 9 shows a cross-sectional view of a quartz crystal unit constructing a quartz crystal oscillator, which constructs an electronic apparatus of the fourth embodiment of the present invention.

FIG. 9 shows a cross-sectional view of a quartz crystal unit constructing a quartz crystal oscillator, which constructs an electronic apparatus of the fourth embodiment of the present invention. The quartz crystal unit 170 comprises a contour mode quartz crystal resonator 70 or a thickness shear mode quartz crystal resonator 70, a case 71 and a lid 72. In more detail, the resonator 70 is mounted at a mounting portion 74 of the case 71 by conductive adhesives 76 or solder. Also, the case 71 and the lid 72 are connected through a connecting member 73. For example, the contour mode resonator 70 in this embodiment is the same resonator as one of the flexural mode, quartz crystal tuning fork resonators 10 and 45 described in detail in FIG. 4-FIG. 7. Also, in this embodiment, circuit elements are connected at outside of the quartz crystal unit to get a quartz crystal oscillator. Namely, only the quartz crystal tuning fork resonator is housed in the unit and also, it is housed in the unit in vacuum. In this embodiment, the quartz crystal unit of a surface mounting type is shown, but the quartz crystal tuning fork resonator may be housed in a tubular type, namely a quartz crystal unit of the tubular type. Also, instead of the flexural mode, quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode resonator, respectively, or a SAW (Surface Acoustic Wave) resonator may be housed in the unit. For example, FIG. 19 shows a top view (a) and a C-C' cross-sectional view (b) of a vibrational portion 555 of a thickness shear mode quartz crystal resonator 550. The resonator 550 has a dimension of a length $L_0$, a width $W_0$ and a thickness $T_0$, and the length $L_0$ and the width $W_0$ is less than 2.4 mm and 1.6 mm, respectively, to achieve a smaller quartz crystal unit and to get a small series resistance $R_1$. Also, electrodes 556 and 557 are disposed on upper and lower surfaces so that the electrodes are opposite each other. In order to get a good frequency temperature behaviour at a room temperature at least, the resonator 550 has a cut angle within a range of YXl(34° to 36°) according to an expression of the IEEE notation. In addition, the present invention is not limited to the quartz crystal unit having the contour mode quartz crystal resonator or the thickness shear mode quartz crystal resonator in this embodiment, for example, the present invention also includes a quartz crystal unit having a piezoelectric filter, e.g. a SAW piezoelectric filter or a piezoelectric sensor, e.g. an angular velocity piezoelectric sensor. Namely, the piezoelectric material comprises one of $LiTaO_3$, $LiNbO_3$, $GaPO_4$, and so on which belong to a trigonal system in crystallographic classification.

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 10.

Figure 10:
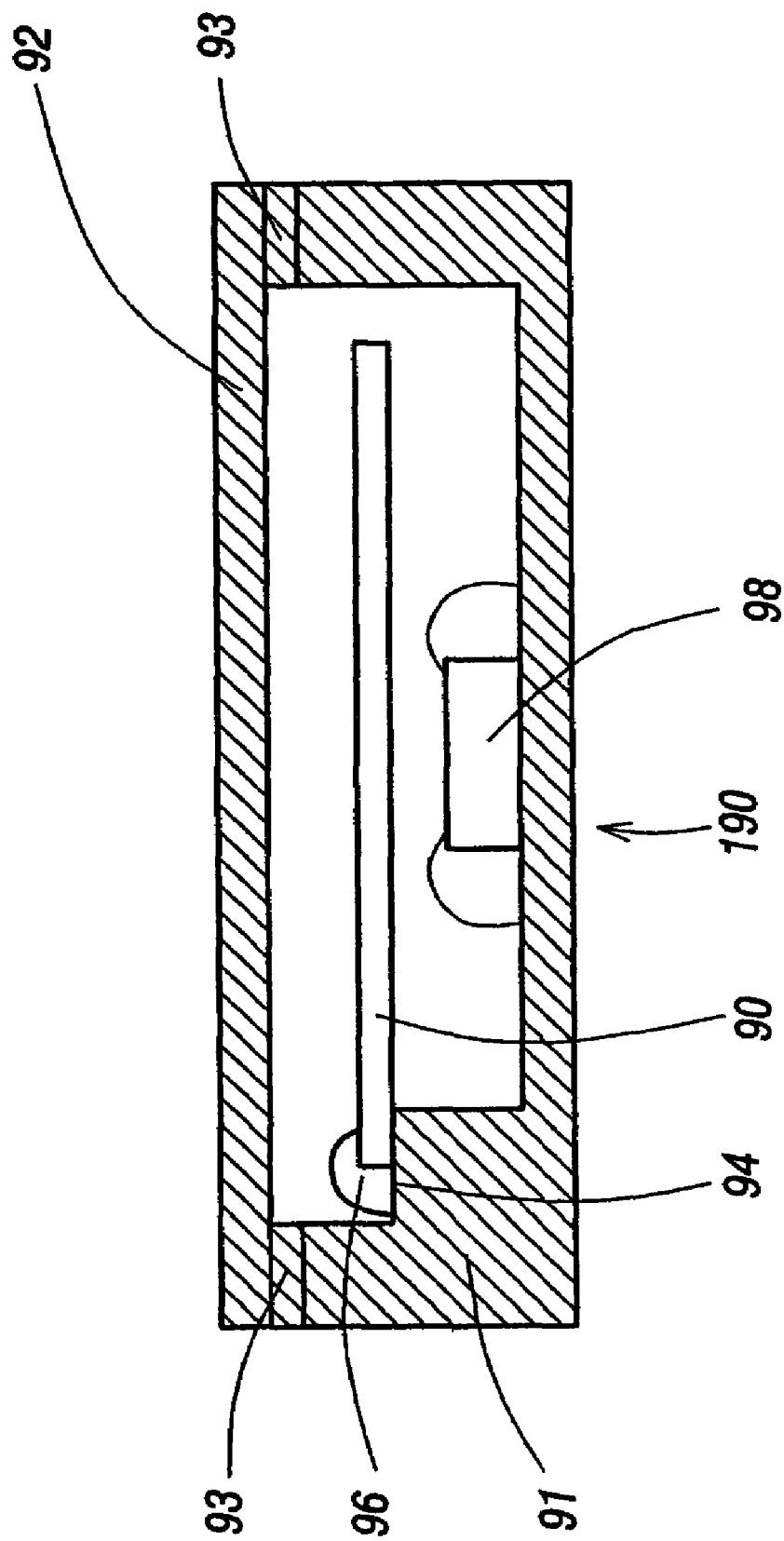
FIG. 10 shows a cross-sectional view of a quartz crystal oscillator, which constructs an electronic apparatus of the fifth embodiment of the present invention.

FIG. 10 shows a cross-sectional view of a quartz crystal oscillator, which constructs an electronic apparatus of the fifth embodiment of the present invention. The quartz crystal oscillator 190 comprises a quartz crystal oscillating circuit, a case 91 and a lid 92. In this embodiment, circuit elements constructing the oscillating circuit are housed in a quartz crystal unit comprising a contour mode quartz crystal resonator 90 or a thickness shear mode quartz crystal resonator 90, the case 91 and the lid 92. Also, the oscillating circuit of this embodiment comprises an amplifier 98 including a feedback resistor, the resonator 90, capacitors (not shown here) and a drain resistor (not shown here), and a CMOS inverter is used as the amplifier 98.

In addition, in this embodiment, the resonator 90 is mounted at a mounting portion 94 of the case 91 by conductive adhesives 96 or solder. As described above, the amplifier 98 is housed in the quartz crystal unit and mounted at the case 91. Also, the case 91 and the lid 92 are connected through a connecting member 93. For example, the contour mode resonator 90 of this embodiment is the same as one of the flexural mode, quartz crystal tuning fork resonators 10 and 45 described in detail in FIG. 4-FIG. 7. Also, instead of the flexural mode, quartz crystal tuning fork resonator and the thickness shear mode quartz crystal resonator, one of a length-extensional mode quartz crystal resonator, a width-extensional mode quartz crystal resonator and a Lame mode quartz crystal resonator which are a contour mode resonator, respectively, or a SAW (Surface Acoustic Wave) resonator, or a torsional mode quartz crystal resonator may be housed in the unit. In addition, the torsional mode resonator has a tuning fork shape with a tuning fork base having cut portions and tuning fork tines connected to the tuning fork base. The tuning fork tines vibrate in a torsional mode of an inverse. In addition, a length of each of the tuning fork tines is within a range of 0.6 mm to 2.1 mm, preferably, 0.65 mm to 1.85 mm, so that the torsional resonator capable of vibrating in a fundamental mode can be obtained with a frequency higher than 150 kHz and less than 750 kHz.

Likewise, in this embodiment, a piece of flexural mode, quartz crystal tuning fork resonator is housed in the unit, but the present invention also includes a quartz crystal unit having a plurality of flexural mode, quartz crystal tuning fork resonators, each of which has tuning fork tines and a tuning fork base, and at least two of the plurality of resonators are connected electrically in parallel. In addition, the at least two resonators may be an individual resonator or may be individual resonators that are formed integrally at each tuning fork base through a connecting portion. For example, the at least two resonators comprises two individual resonators, and the two individual resonators are formed so that one of the two individual resonators has a groove in at least one of upper and lower faces of the tuning fork tines, and the other has no groove in at least one of upper and lower faces of the tuning fork tines to get a different turn over temperature point each other. In addition, a shape and a dimension of the groove and the tuning fork tines may be changed to get the different turn over temperature point each other.

Next, a method for manufacturing a quartz crystal oscillator, which constructs an electronic apparatus of the present invention, is described in detail, according to the manufacturing steps.

Figure 11:
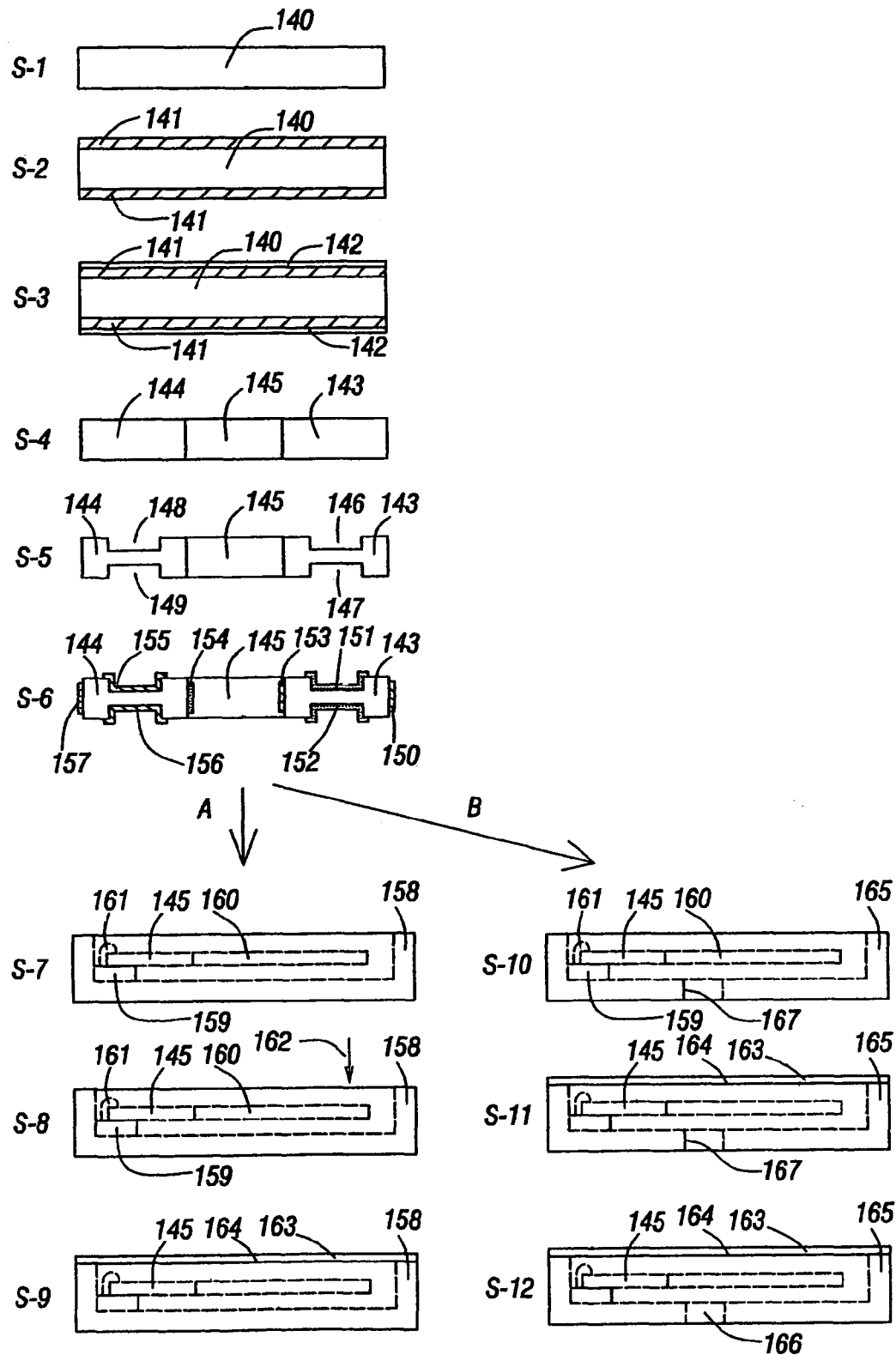
FIG. 11 shows a step diagram of a method for manufacturing a quartz crystal unit constructing a quartz crystal oscillator, which constructs an electronic apparatus of the present invention.
Figure 12:
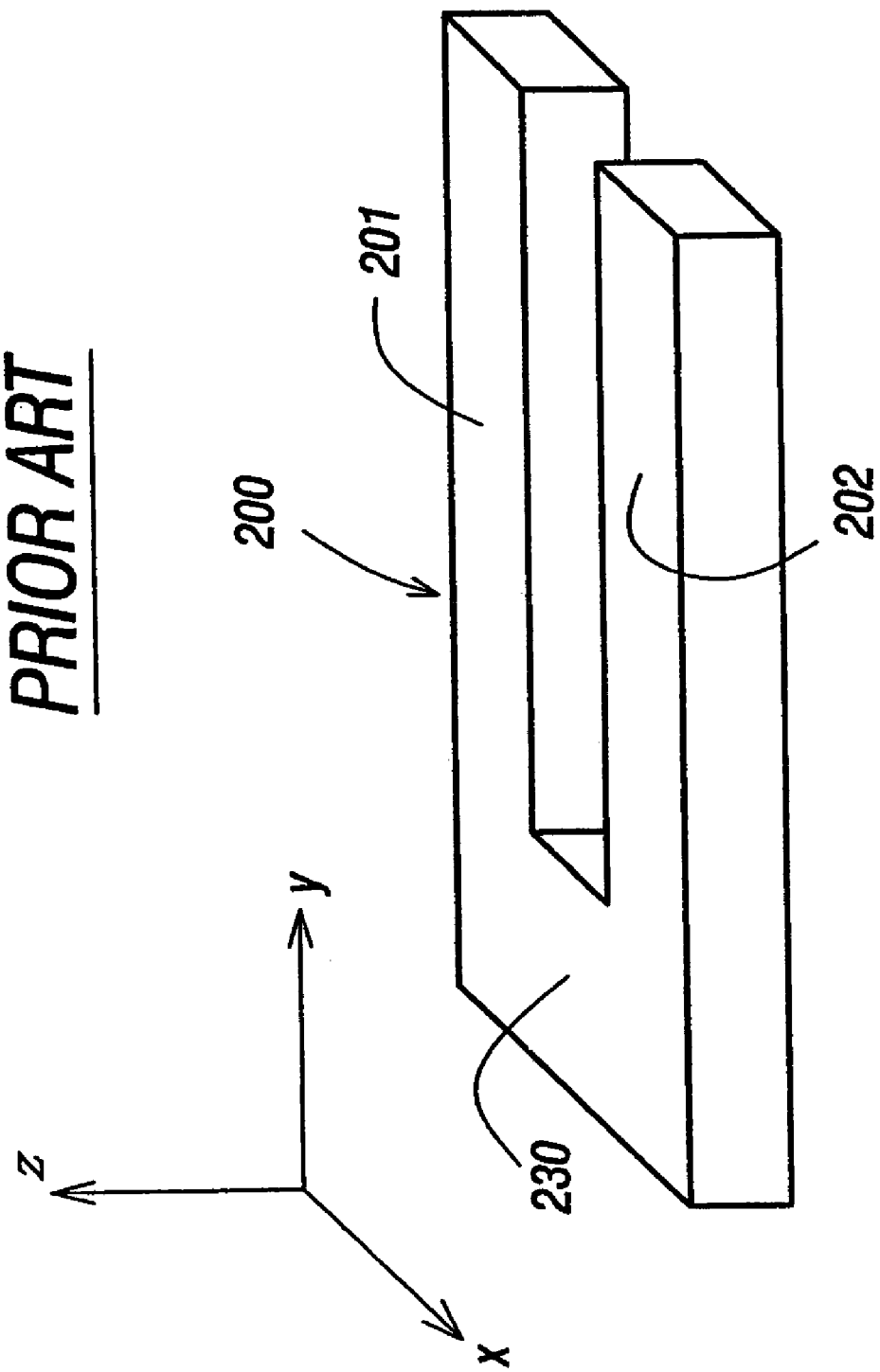
FIG. 12 is a general view of the conventional flexural mode, quartz crystal tuning fork resonator constructing a quartz crystal oscillator of the prior art, which constructs the conventional electronic apparatus.
Figure 13:
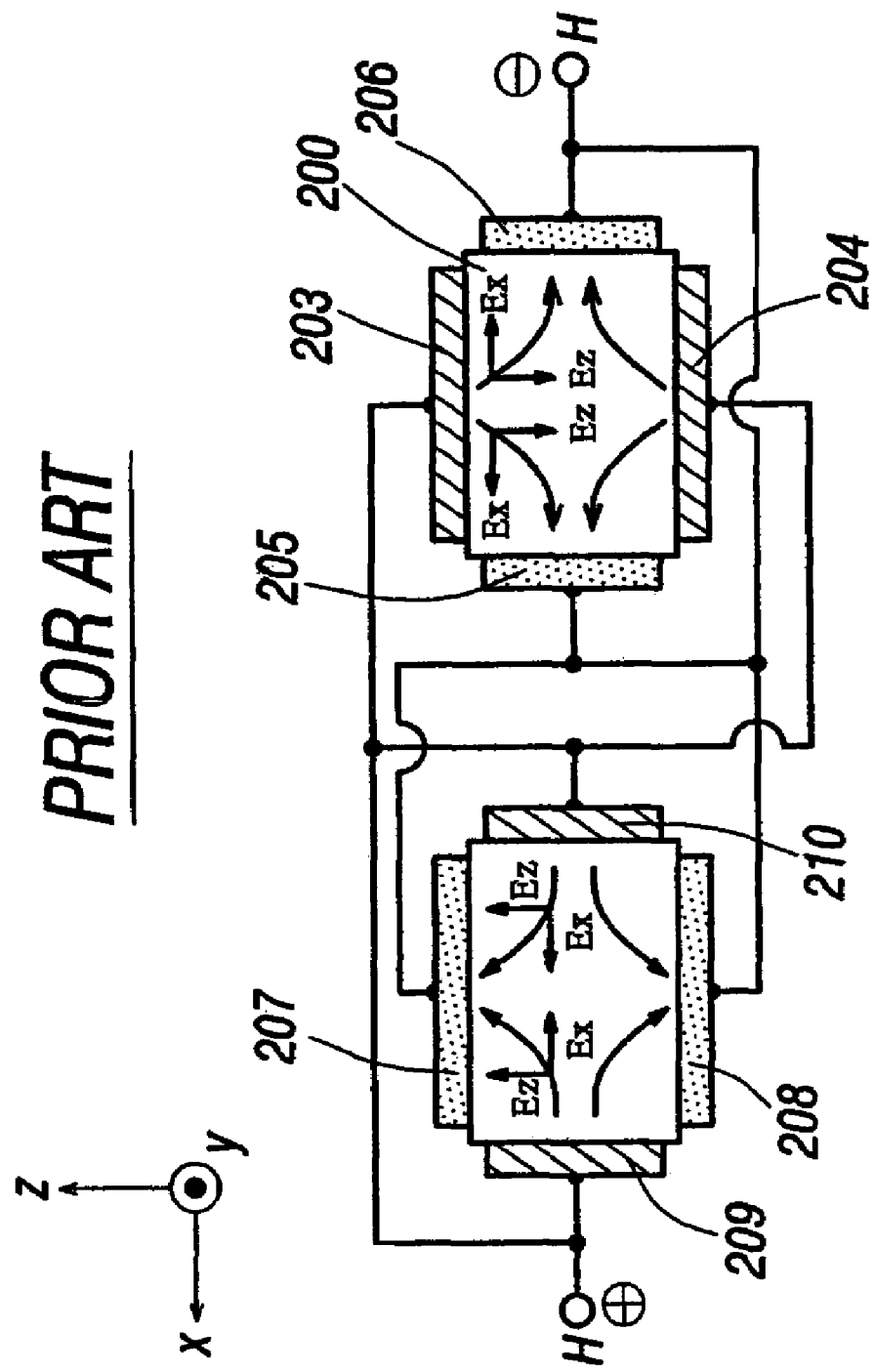
FIG. 13 is a cross-sectional view of the tuning fork tines of FIG. 12, and illustrating electrode construction.

FIG. 11 shows an embodiment of a method for manufacturing a quartz crystal oscillator, which constructs an electronic apparatus of the present invention and a step diagram embodying the present invention. The signs of S-1 to S-12 are the step numbers. First, S-1 shows a cross-sectional view of a quartz crystal wafer 140. Next, in S-2 metal film 141, for example, chromium and gold on the chromium are, respectively, disposed on upper and lower faces of the quartz crystal wafer 140 by an evaporation method or a spattering method. In addition, resist 142 is spread on said metal film 141 in S-3, and after the metal film 141 and the resist 142 were removed except those of tuning fork shape by a photo-lithographic process and an etching process, the tuning fork shape with tuning fork tines 143, 144 and a tuning fork base 145, as be shown in S-4, is integrally formed by a chemical etching process so that an oscillation frequency of a quartz crystal resonator of the tuning fork shape is in the range of 34.1 kHz to 38.7 kHz, preferably, 34.1 kHz to 36.9 kHz. When the tuning fork shape is formed, cut portions may be formed at the tuning fork base. In other words, the tuning fork shape and the cut portions are formed simultaneously. In FIG. 11, the formation of a piece of tuning fork shape is shown, but, a number of tuning fork shapes are actually formed in a piece of quartz crystal wafer.

Similar to the steps of S-2 and S-3, metal film and resist are spread again on the tuning fork shape of S-4 and grooves 146, 147, 148 and 149 each of which has two step difference portions along the length direction of the tuning fork tines, are formed at the tuning fork tines 143, 144 by an photo-lithographic process and an etching process so that the oscillation frequency of the quartz crystal resonator of the tuning fork shape having the grooves is in the range of 32.78 kHz to 34.4 kHz, preferably, 32.78 kHz to 33.85 kHz and a turn over temperature point of (a turning point) the quartz crystal resonator thereof is in the range of 15° C. to 35° C., preferably, 18° C. to 30° C. to get a small frequency deviation in the vicinity of room temperature because the quartz crystal resonator of the tuning fork shape has a parabolic curve in frequency temperature behaviour, and the shape of S-5 is obtained after all of the resist and the metal film are removed. In addition, metal film and resist are spread again on the shape of S-5 and electrodes which are of opposite electrical polarity, are disposed on sides of the tines and inside the grooves thereof, as shown in S-6.

Namely, electrodes 150, 153 disposed on the sides of the tuning fork tine 143 and electrodes 155, 156 disposed inside the grooves 148, 149 of the tuning fork tine 144 have the same electrical polarity. Similarly, electrodes 151, 152 disposed inside the grooves 146, 147 of the tuning fork tine 143 and electrodes 154, 157 disposed on the sides of the tuning fork tine 144 have the same electrical polarity. Two electrode terminals are, therefore, constructed. In more detail, when an alternating current (AC) voltage is applied between the terminals, the tuning fork tines vibrate in a flexural mode of an inverse phase because said electrodes disposed on step difference portions of the grooves and the electrodes disposed opposite to the said electrodes have opposite electrical polarity. In the step of S-6, a piece of quartz crystal tuning fork resonator, capable of vibrating in a flexural mode is shown in the quartz crystal wafer, but a number of quartz crystal tuning fork resonators are actually formed in the wafer. When the grooves are formed at the tuning fork tines, the oscillation frequency of the resonator of the tuning fork shape becomes lower than that of the resonator with no groove, and the quantity of a change of the oscillation frequency is dependent on a number of the grooves, a groove width, a groove length and a groove depth. In this embodiment, the oscillation frequency of the resonator of the tuning fork shape is adjusted in the quartz crystal wafer by forming a metal film on each of at least two of the upper and lower faces of each of the tuning fork tines so that the oscillation frequency is lower than 32.73 kHz, preferably, less than 32.69 kHz, more preferably, greater than 31.6 kHz and less than 32.69 kHz and the metal film is formed after or before the step of S-6, namely, after or before the two electrode terminals are formed to drive the resonator of the tuning fork shape. In more detail, the metal film on each of at least two of the upper and lower faces of each of the tuning fork tines to adjust the oscillation frequency is formed after the tuning fork shape is formed (after the step of S-4) and before the grooves are formed (before the step of S-5) or is formed after the grooves are formed (after the step of S-5) and before the electrodes are disposed (before the step of S-6) or is formed after the electrodes are disposed (after the step of S-6) and before the resonator of the tuning fork shape is mounted on a mounting portion of a case (before the step of S-7 or S-8). Also, when the resonator of the tuning fork shape housed in a unit having a case and a lid has no groove at the tuning fork tines, an oscillation frequency of the resonator of the tuning fork shape formed in a quartz wafer by etching is in the range of 32.78 kHz to 34.4 kHz, preferably, 32.78 kHz to 33.85 kHz. In addition, a metal film on each of at least two of the upper and lower faces of each of the tuning fork tines is formed to adjust the oscillation frequency of the resonator so that the oscillation frequency is lower than 32.73 kHz, preferably, less than 32.69 kHz, more preferably, greater than 31.6 kHz and less than 32.69 kHz, and the metal film is formed after or before the electrodes (two electrode terminals) are formed to drive the resonator of the tuning fork shape. In more detail, the metal film on each of at least two of the upper and lower faces of each of the tuning fork tines is formed after the tuning fork shape is formed and before the electrodes are disposed or is formed after the electrodes are disposed and before the tuning fork shape is mounted on a mounting portion of a case. According to the present invention, the metal film on each of at least two of the upper and lower faces of each of the tuning fork tines may be formed before the tuning fork shape is formed.

In addition, a resonance (oscillation) frequency for said resonators is adjusted by a separate step of at least twice and the first adjustment of resonance frequency for said resonators is performed in the quartz crystal wafer by a laser method or an evaporation method or an ion etching method so that a frequency deviation of said resonators is within a range of −9000 PPM to +5000 PPM (Parts Per Million), preferably, within a range of −9000 PPM to +100 PPM, more preferably, within a range of −2300 PPM to +100 PPM to a nominal frequency of 10 kHz to 200 kHz, e.g. 32.768 kHz. The adjustment of frequency by the laser or ion etching method is performed by trimming mass (at least one of the metal films) disposed on tuning fork tines and the adjustment of frequency by the evaporation method is performed by adding mass (a metal) on tuning fork tines. Namely, those methods can change the resonance (oscillation) frequency of said resonators. Also, the resonators formed in the quartz crystal wafer are inspected therein and when there is a failure resonator, it is removed from the wafer or something is marked on it or it is remembered by a computer.

In this embodiment, the tuning fork shape is formed from the step of S-3 and after that, the grooves are formed at the tuning fork tines, namely, the tuning fork tines are formed before the grooves are formed, but this invention is not limited to said embodiment, for example, the grooves are first formed from the step of S-3 and after that, the tuning fork shape may be formed, namely, the grooves are formed before the tuning fork tines are formed. Also, the tuning fork shape and the grooves may be formed simultaneously, namely, the tuning fork tines and the grooves are formed simultaneously. When the tuning fork tines and the grooves are formed simultaneously, for example, a portion between the tuning fork tines is first etched so that the portion has a groove and a thickness of the portion is less than seven tenths, preferably, one half of a thickness of the quartz crystal wafer to get a required oscillation frequency and a required turn over temperature point, and after that the portion and the groove are formed simultaneously by etching the quartz crystal wafer. For example, when the thickness of the quartz crystal wafer is in the range of 0.07 mm to 0.12 mm, the thickness of the base portion is less than 0.05 mm, preferably, 0.035 mm, more preferably, 0.005 mm. Namely, the portion has the groove as deep as possible to get the required oscillation frequency and the required turn over temperature point. Moreover, when the tuning fork base has cut portions, the portion between the tuning fork tines and the cut portions are formed simultaneously. In addition, when the tuning fork base has a frame portion, the tuning fork shape and the frame portion are formed simultaneously. According to the present invention, when the tuning fork base has at least one of cut portions and a frame portion, the at least one is formed simultaneously with the tuning fork shape. Moreover, for example, when a groove having a plurality of stepped portions is formed in each of upper and lower faces of the tuning fork tines, the groove may be formed simultaneously with at least one of the cut portions and the frame portion. In addition, at least one of the cut portions may be formed in a step different from at least one of the steps of forming the tuning fork tines and forming the grooves at the tuning fork tines. Namely, the at least one of the cut portions is formed before or after at least one of the tuning fork tines and the grooves is formed. Similar to this, the frame portion may be formed in a step different from at least one of the steps of forming the tuning fork tines and forming the grooves at the tuning fork tines. Namely, the frame portion is formed before or after at least one of the tuning fork tines and the grooves is formed. In addition, at least one of the metal films on the upper and lower faces of each of the tuning fork tines to adjust the oscillation frequency of the resonator of the tuning fork shape may be formed before the step of forming the tuning fork tines.

There are two methods of A and B in the following step, as be shown by arrow signs. For the step of A, the tuning fork base 145 of the formed flexural mode, quartz crystal tuning fork resonator 160 is first mounted on mounting portion 159 of a case 158 by conductive adhesives 161 or solder, as be shown in S-7. Next, the second adjustment of resonance (oscillation) frequency for the resonator 160 is performed by laser 162 or evaporation or ion etching method in S-8 so that a frequency deviation is within a range of −100 PPM to +100 PPM to the nominal frequency of 10 kHz to 200 kHz, e.g. 32.768 kHz. Finally, the case 158 and a lid 163 are connected via glass 164 with the low melting point or a metal in S-9. In this case, the connection of the case and the lid is performed in vacuum because the case 158 has no hole to close it in vacuum.

In addition, though it is not visible in FIG. 11, the third frequency adjustment may be performed by laser after the step of the connection of S-9 to get a small frequency deviation to the nominal frequency when a material of the lid is glass. As a result of which it is possible to get the resonator with the frequency deviation which is within a range of −50 PPM to +50 PPM to the nominal frequency of 10 kHz to 200 kHz, e.g. 32.768 kHz. Namely, the nominal frequency, capable of vibrating in a fundamental mode is less than 200 kHz. In this step, when the third frequency adjustment is performed, a/an resonance (oscillation) frequency of said resonators is adjusted so that the frequency deviation by the second frequency adjustment is within a range of −1500 PPM to +1500 PPM, preferably, −950 PPM to +950 PPM to the nominal frequency, e.g. 32.768 kHz.

For the step of B, the tuning fork base 145 of the formed resonator 160 is first mounted on a mounting portion 159 of a case 165 by conductive adhesives 161 or solder in S-10, in addition, in S-11 the case 165 and a lid 163 are connected by the same way as that of S-9, in more detail, after the resonator was mounted on the mounting portion of the case or after the resonator was mounted at the mounting portion, and the case and the lid were connected, the second adjustment of resonance (oscillation) frequency is performed so that a frequency deviation is generally within a range of −100 PPM to +100 PPM to a nominal frequency of 10 kHz to 200 kHz, e.g. 32.768 kHz in vacuum, but, it may be within a wider range, for example, −950 PPM to +950 PPM when the third frequency adjustment as will be shown as follows, is performed.

Finally, a hole 167 constructed at the case 165 is closed in vacuum using such a metal 166 as solder or glass with the low melting point in S-12.

Also, similar to the step of A, the third adjustment of resonance (oscillation) frequency may be performed by laser after the step of S-12 to get a small frequency deviation to the nominal frequency. As a result of which it is possible to get the resonator with the frequency deviation which is within a range of −50 PPM to +50 PPM to the nominal frequency, e.g. 32.768 kHz. Thus, a frequency deviation of the resonators in the case of A and B is finally within a range of −100 PPM to +100 PPM at most. Also, the second frequency adjustment may be performed after the case and the lid were connected and the hole was closed in vacuum. In addition, the hole is constructed at the case, but may be constructed at the lid. Also, the frequency adjustment of the present invention is performed in vacuum or inert gas such as nitrogen gas or atmosphere, and the values described above are values in vacuum.

Therefore, the flexural mode, quartz crystal tuning fork resonators and the quartz crystal units manufactured by the above-described method are miniaturized and realized with a small series resistance $R_1$, a high quality factor $Q_1$ and low price.

Moreover, in the above-described embodiment, though the first frequency adjustment of the resonators is performed in the quartz crystal wafer and at the same time, when there is a failure resonator, something is marked on it or it is removed from the quartz crystal wafer, but the present invention is not limited to this, namely, the present invention may include the step to inspect the flexural mode, quartz crystal tuning fork resonators formed in the quartz crystal wafer therein, in other words, the step to inspect whether there is a failure resonator or not in the quartz crystal wafer. When there is a failure resonator in the wafer, something is marked on it or it is removed from the wafer or it is remembered by a computer. By including the step, it can increase the yield because it is possible to find out the failure resonator in an early step and the failure resonator does not go to the next step. As a result of which low priced flexural mode, quartz crystal tuning fork resonators can be provided with excellent electrical characteristics.

In this embodiment, the frequency adjustment is performed three times by a separate step, but may be performed at least twice by a separate step. For example, the third frequency adjustment may be omitted. In addition, in order to construct a quartz crystal oscillator, two electrode terminals of the resonators are connected electrically to an amplifier, capacitors and resistors. In other words, a quartz crystal oscillating circuit is constructed and connected electrically so that an amplification circuit comprises a CMOS inverter and a feedback resistor and a feedback circuit comprises a flexural mode, quartz crystal tuning fork resonator, a drain resistor, a capacitor of a gate side and a capacitor of a drain side. Also, the third frequency adjustment may be performed after the quartz crystal oscillating circuit was constructed in a quartz crystal unit.

Likewise, the flexural mode quartz crystal resonator of a tuning fork type has two tuning fork tines in the present embodiments, but embodiments of the present invention include tuning fork tines more than two. In addition, the quartz crystal tuning fork resonators of the present embodiments are housed in a package (unit) of a surface mounting type comprising a case and a lid, but may be housed in a package of a tubular type.

In addition, for the tuning fork resonators constructing the quartz crystal oscillators of the first embodiment to the fourth embodiment of the present invention, the resonators are provided so that a capacitance ratio $r_1$ of a fundamental mode vibration gets smaller than a capacitance ratio $r_2$ of a second overtone mode vibration, in order to obtain a frequency change of the fundamental mode vibration larger than that of the second overtone mode vibration, versus the same change of a value of load capacitance $C_L$. Namely, a variable range of a frequency of the fundamental mode vibration gets wider than that of the second overtone mode vibration.

In more detail, for example, when $C_L=18$ pF and the $C_L$ changes in 1 pF, the frequency change of the fundamental mode vibration becomes larger than that of the second overtone mode vibration because the capacitance ratio $r_1$ is smaller than the capacitance ratio $r_2$. Therefore, there is a remarkable effect for the fundamental mode vibration, such that the resonators can be provided with the frequency variable in the wide range, even when the value of load capacitance $C_L$ changes slightly. Accordingly, when a variation of the same frequency is required, the number of capacitors which are used in the quartz crystal oscillators decreases because the frequency change versus load capacitance 1 pF becomes large, as compared with that of the second overtone mode vibration. As a result, the low priced oscillators can be provided.

Moreover, capacitance ratios $r_1$ and $r_2$ of a flexural mode, quartz crystal tuning fork resonator are given by $r_1=C_0/C_1$ and $r_2=C_0/C_2$, respectively, where $C_0$ is shunt capacitance in an electrical equivalent circuit of the resonator, and $C_1$ and $C_2$ are, respectively, motional capacitance of a fundamental mode vibration and a second overtone mode vibration in the electrical equivalent circuit of the resonator. In addition, the flexural mode, quartz crystal tuning fork resonator has a quality factor $Q_1$ for the fundamental mode vibration and a quality factor $Q_2$ for the second overtone mode vibration.

In detail, the tuning fork resonator of this embodiment is provided so that the influence on resonance frequency of the fundamental mode vibration by the shunt capacitance becomes smaller than that of the second overtone mode vibration by the shunt capacitance, namely, so that it satisfies a relationship of $S_1=r_1/2Q_1^2 < S_2=r_2/2Q_2^2$, preferably, $S_1 < S_2/2$. As a result, the tuning fork resonator, capable of vibrating in the fundamental mode and having a high frequency stability can be provided because the influence on the resonance frequency of the fundamental mode vibration by the shunt capacitance becomes so extremely small as it can be ignored. Also, the present invention replaces $r_1/2Q_1^2$ with $S_1$ and $r_2/2Q_2^2$ with $S_2$, respectively, and here, $S_1$ and $S_2$ are called "a stable factor of frequency" of the fundamental mode vibration and the second overtone mode vibration.

In addition, when a power source is applied to the quartz crystal oscillating circuit, at least one oscillation which satisfies an amplitude condition and a phase condition of vibration starts in the circuit, and a spent time to get to about ninety percent of the steady amplitude of the vibration is called "rise time". Namely, the shorter the rise time becomes, the easier the oscillation becomes. When rise time $t_{r1}$ of the fundamental mode vibration and rise time $t_{r2}$ of the second overtone mode vibration in the circuit are taken, $t_{r1}$ and $t_{r2}$ are given by $t_{r1}=kQ_1/(\omega_1(-1+|-RL_1|/R_1))$ and $t_{r2}=kQ_2/(\omega_2(-1+|-RL_2|/R_2))$, respectively, where k is constant and $\omega_1$ and $\omega_2$ are an angular frequency for the fundamental mode vibration and the second overtone mode vibration, respectively.

From the above-described relation, it is possible to obtain the rise time $t_{r1}$ of the fundamental mode vibration less than the rise time $t_{r2}$ of the second overtone mode vibration. As an example, when resonance (oscillation) frequency of a flexural mode, quartz crystal tuning fork resonator is about 32.768 kHz for a fundamental mode vibration and the resonator has a value of $W_2/W=0.5$, $t_1/t=0.34$ and $l_1/=0.48$, though there is a distribution in production, as an example, the resonator has a value of $Q_1=62,000$ and $Q_2=192,000$, respectively. In this embodiment, $Q_2$ has a value of about three times of $Q_1$. Accordingly, to obtain the $t_{r1}$ less than the $t_{r2}$, it is necessary to satisfy a relationship of $|-RL_1|/R_1>2|-RL_2|/R_2-1$ by using a relation of $\omega_2=6\omega_1$ approximately. Also, according to this invention, the relationship is not limited to the quartz crystal oscillating circuit comprising the resonator in this embodiment, but this invention also includes all quartz crystal oscillating circuits to satisfy the relationship. By constructing the oscillating circuit like this, a quartz crystal oscillator with the flexural mode, quartz crystal tuning fork resonator can be provided with a short rise time. In other words, an output signal of the oscillator has an oscillation frequency of the fundamental mode vibration of the resonator and is outputted through a buffer circuit. Namely, the second overtone mode vibration can be suppressed in the oscillating circuit. In this embodiment, the resonator has also a value of $r_1=320$ and $r_2=10,600$ as an example. According to this invention, $r_1$ has a value of 210 to 520.

The above-described quartz crystal resonators are formed by at least one method of chemical, mechanical and physical methods. The mechanical method, for example, uses a particle such as GC#1000 and the physical method, for example, uses atom or molecule. Therefore, these methods are called "a particle method" here. In addition, the present invention is not limited to the resonators described above, but includes such a piezoelectric resonator for sensing pressure as a flexural mode, tuning fork resonator, a torsional mode resonator, a thickness shear mode resonator, SAW resonator and so on. In detail, there is a relationship between the pressure and an oscillation frequency of the resonators or a series resistance $R_1$ thereof. In more detail, the higher the pressure becomes, the lower the oscillation frequency becomes or the higher the series resistance $R_1$ becomes. Namely, since the oscillation frequency of the resonators or the series resistance thereof changes by a change of the pressure, the pressure is measured from the relationship.

Thus, the electronic apparatus of this invention comprising a display portion and a quartz crystal oscillator at least may operate normally because the quartz crystal oscillator comprises the quartz crystal oscillating circuit with a high frequency stability, namely, a high frequency reliability.

As described above, it will be easily understood that the electronic apparatus comprising the quartz crystal oscillator comprising the quartz crystal oscillating circuit having the flexural mode, quartz crystal tuning fork resonator with novel shapes, the novel electrode construction and excellent electrical characteristics, according to the present invention, may have the outstanding effects. Similar to this, it will be easily understood that the electronic apparatus comprising the quartz crystal oscillator comprising the quartz crystal oscillating circuit having the length-extensional mode quartz crystal resonator with the novel cutting angle and the novel shape, according to the present invention, may have also the outstanding effect. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A quartz crystal unit comprising: a quartz crystal resonator; a case having a mounting portion; and a lid;

wherein the quartz crystal resonator comprises a quartz crystal tuning fork resonator having a quartz crystal tuning fork shape including a quartz crystal tuning fork base and first and second quartz crystal tuning fork tines connected to the quartz crystal tuning fork base, each of the first and second quartz crystal tuning fork tines having opposite main surfaces and opposite side surfaces;

wherein at least one groove having at least three surfaces including a first surface opposite at least one of the opposite side surfaces and a second surface connected to the first surface through a third surface is formed in at least one of the opposite main surfaces of each of the first and second quartz crystal tuning fork tines;

wherein an electrode is disposed on at least one of the first and second surfaces of the at least one groove formed in the at least one of the opposite main surfaces of each of the first and second quartz crystal tuning fork tines and on the at least one of the opposite side surfaces of each of the first and second quartz crystal tuning fork tines so that the electrode disposed on the at least one of the opposite side surfaces of the first quartz crystal tuning fork tine has the same electrical polarity as an electrical polarity of the electrode disposed on the at least one of the first and second surfaces of the at least one groove formed in the at least one of the opposite main surfaces of the second quartz crystal tuning fork tine and the electrode disposed on the at least one of the first and second surfaces of the at least one groove formed in the at least one of the opposite main surfaces of the first quartz crystal tuning fork tine has an electrical polarity opposite to the electrical polarity of the electrode disposed on the at least one of the first and second surfaces of the at least one groove formed in the at least one of the opposite main surfaces of the second quartz crystal tuning fork tine, the quartz crystal tuning fork resonator vibrating in a flexural mode of an inverse phase;

wherein the quartz crystal tuning fork resonator has a quality factor $Q_2$, a capacitance ratio $r_2$ and a merit value $M_2$ of a second overtone mode of vibration, the merit value $M_2$ being defined by the ratio $(Q_2/r_2)$, each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines having a dimension;

wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_2$ of the second overtone mode of vibration of the quartz crystal tuning fork resonator is less than 30;

wherein the quartz crystal tuning fork resonator is mounted on the mounting portion of the case; and wherein the lid is connected to the case.

2. A quartz crystal unit according to claim 1; wherein the quartz crystal tuning fork resonator has a quality factor $Q_1$, a capacitance ratio $r_1$ and a merit value $M_1$ of a fundamental mode of vibration, the merit value $M_1$ being defined by the ratio $(Q_2/r_2)$; and wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_1$ of the fundamental mode of vibration of the quartz crystal tuning fork resonator is greater than 65.

3. A quartz crystal unit according to claim 1; wherein the quartz crystal tuning fork resonator has a quality factor $Q_1$, a capacitance ratio $r_1$ and a stable factor $S_1$ of the fundamental mode of vibration, and a stable factor $S_2$ of the second overtone mode of vibration, the stable factor $s_1$ being defined by $r_1/2Q_1^2$ and the stable factor $S_2$ being defined by $r_2/2Q_2^2$; and wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the stable factor $S_1$ of the fundamental mode of vibration of the quartz crystal tuning fork resonator is less than the stable factor $S_2$ of the second overtone mode of vibration thereof and the capacitance ratio $r_1$ of the fundamental mode of vibration of the quartz crystal tuning fork resonator is less than the capacitance ratio $r_2$ of the second overtone mode of vibration thereof.

4. A quartz crystal oscillator comprising: at least one quartz crystal oscillating circuit comprised of an amplifier; at least one resistor; a plurality of capacitors; and a quartz crystal unit according to claim 1;

wherein the quartz crystal tuning fork resonator of the quartz crystal unit is connected to the amplifier, the at least one resistor and the capacitors.

5. A quartz crystal oscillator according to claim 4; wherein the case is a ceramics case having an interior space and a mounting portion in the interior space; wherein the quartz crystal tuning fork resonator is mounted on the mounting portion in the interior space of the ceramics case by a conductive adhesive or a solder; wherein the lid is a metal lid or a glass lid; wherein the metal lid or the glass lid is connected to the ceramics case to cover an open end of the ceramics case; wherein the at least one groove formed in the at least one of the opposite main surfaces of each of the first and second quartz crystal tuning fork tines has a length; wherein the quartz crystal tuning fork resonator has an overall length, and a series resistance $R_1$ of a fundamental mode of vibration and a series resistance $R_2$ of the second overtone mode of vibration; wherein each of the length of the at least one groove formed in the at least one of the opposite main surfaces of each of the first and second quartz crystal tuning fork tines and the overall length of the quartz crystal tuning fork resonator is determined so that $R_1$ is less than $0.86R_2$; wherein the quartz crystal tuning fork resonator has a capacitance ratio $r_1$ of the fundamental mode of vibration; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the quartz crystal unit has the capacitance ratio $r_1$ of the fundamental mode of vibration of the quartz crystal tuning fork resonator in the range of 210 to 520; and wherein the quartz crystal tuning fork resonator is formed in a quartz crystal wafer within a range of 0.05 mm to 0.15 mm.

6. A quartz crystal oscillator according to claim 4; wherein the quartz crystal tuning fork resonator has a quality factor $Q_1$, a capacitance ratio $r_1$ and a stable factor $S_1$ of a fundamental mode of vibration, and a stable factor $S_2$ of the second overtone mode of vibration, the stable factor $S_1$ being defined by $r_1/2Q_1^2$ and the stable factor $S_2$ being defined by $r_2/2Q_2^2$; and wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the stable factor $S_1$ of the fundamental mode of vibration of the quartz crystal tuning fork resonator is less than the stable factor $S_2$ of the second overtone mode of vibration thereof and the capacitance ratio $r_2$ of the second overtone mode of vibration thereof is greater than 1500.

7. A quartz crystal oscillator according to claim 4; wherein the opposite main surfaces have a first main surface and a second main surface; wherein the quartz crystal tuning fork resonator has an oscillation frequency; and wherein the at least one groove comprises a groove having a base portion and a length less than 1.29 mm formed in each of the first and second main surfaces of each of the first and second quartz crystal tuning fork tines so that a width of the groove formed in each of the first and second main surfaces of each of the first and second quartz crystal tuning fork tines is greater than or equal to a distance in the width direction of the groove measured from an outer edge of the groove to an outer edge of the corresponding one of the first and second quartz crystal tuning fork tines, and a thickness of the base portion of the groove formed in each of the first and second main surfaces of each of the first and second quartz crystal tuning fork tines is less than 0.05 mm and the oscillation frequency of the quartz crystal tuning fork resonator is in the range of 32.78 kHz to 34.4 kHz.

8. An electronic apparatus comprising: at least one quartz crystal oscillating circuit comprised of an amplifier; at least one resistor; a plurality of capacitors; and a quartz crystal unit according to claim 1;
wherein the quartz crystal tuning fork resonator of the quartz crystal unit is connected to the amplifier, the at least one resistor and the capacitors; and
wherein an output signal of the at least one quartz crystal oscillating circuit comprised of the quartz crystal unit is a clock signal for use in operation of the electronic apparatus.

9. An electronic apparatus according to claim 8; further comprising a display portion; wherein the at least one quartz crystal oscillating circuit has a first quartz crystal oscillating circuit comprised of a first amplifier, at least one first resistor, a plurality of first capacitors and a first quartz crystal unit having the quartz crystal tuning fork resonator; wherein the quartz crystal tuning fork resonator of the first quartz crystal unit is connected to the first amplifier, the at least one first resistor and the first capacitors; wherein the quartz crystal tuning fork resonator has a shunt capacitance and a fundamental mode of vibration; wherein a frequency difference of a mechanical resonance frequency independent on the shunt capacitance of the fundamental mode of vibration of the quartz crystal tuning fork resonator and a resonance frequency dependent on the shunt capacitance of the fundamental mode of vibration thereof is defined by $\Delta f_1$; wherein a frequency difference of a mechanical resonance frequency independent on the shunt capacitance of the second overtone mode of vibration of the quartz crystal tuning fork resonator and a resonance frequency dependent on the shunt capacitance of the second overtone mode of vibration thereof is defined by $\Delta f_2$; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the frequency differences $\Delta f_t$ of the fundamental mode of vibration of the quartz crystal tuning fork resonator is less than the frequency difference $\Delta f_2$ of the second overtone mode of vibration thereof, and the capacitance ratio $r_1$ of the fundamental mode of vibration of the quartz crystal tuning fork resonator is less than the capacitance ratio $r_2$ of the second overtone mode of vibration thereof; wherein an output signal of the first quartz crystal oscillating circuit comprised of the first quartz crystal unit is a clock signal for use in operation of the electronic apparatus to display time information at the display portion, the clock signal having an oscillation frequency of the fundamental mode of vibration of the quartz crystal tuning fork resonator and the oscillation frequency of the fundamental mode of vibration thereof being about 32.768 kHz with a frequency deviation within a range of −100 ppm to +100 ppm; wherein the at least one quartz crystal oscillating circuit has a second quartz crystal oscillating circuit comprised of a second amplifier, at least one second resistor, a plurality of second capacitors and a second quartz crystal unit having a thickness shear mode quartz crystal resonator; wherein the thickness shear mode quartz crystal resonator of the second quartz crystal unit is connected to the second amplifier, the at least one second resistor and the second capacitors; and wherein an output signal of the second quartz crystal oscillating circuit comprised of the second quartz crystal unit is a clock signal for use in operation of the electronic apparatus.

10. An electronic apparatus according to claim 8; further comprising a display portion; wherein the at least one quartz crystal oscillating circuit has a first quartz crystal oscillating circuit comprised of a first amplifier, at least one first resistor, a plurality of first capacitors and a first quartz crystal unit having the quartz crystal tuning fork resonator; wherein the quartz crystal tuning fork resonator of the first quartz crystal unit is connected to the first amplifier, the at least one first resistor and the first capacitors; wherein the quartz crystal tuning fork resonator has a quality factor $Q_1$, a capacitance ratio $r_1$ and a stable factor $S_1$ of a fundamental mode of vibration and a stable factor $S_2$ of the second overtone mode of vibration, the stable factor $S_1$ being defined by $r_1/2Q_1^2$ and the stable factor $S_2$ being defined by $r_2/2Q_2^2$; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the stable factor $S_1$ of the fundamental mode of vibration of the quartz crystal tuning fork resonator is less than the stable factor $S_2$ of the second overtone mode of vibration thereof; and wherein an output signal of the first quartz crystal oscillating circuit comprised of the first quartz crystal unit is a clock signal for use in operation of the electronic apparatus to display time information at the display portion.

11. An electronic apparatus according to claim 10; wherein the at least one quartz crystal oscillating circuit has a second quartz crystal oscillating circuit comprised of a second amplifier, at least one second resistor, a plurality of second capacitors and a second quartz crystal unit having a thickness shear mode quartz crystal resonator; wherein the thickness shear mode quartz crystal resonator of the second quartz crystal unit is connected to the second amplifier, the at least one second resistor and the second capacitors; wherein an output signal of the second quartz crystal oscillating circuit comprised of the second quartz crystal unit is a clock signal for use in operation of the electronic apparatus; and wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the capacitance ratio $r_1$ of the fundamental mode of vibration of the quartz crystal tuning fork resonator is less than the capacitance ratio $r_2$ of the second overtone mode of vibration thereof.

12. An electronic apparatus according to claim 11; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the capacitance ratio $r_2$ of the second overtone mode of vibration of the quartz crystal tuning fork resonator is greater than 1500; wherein the opposite main surfaces have a first main surface and a second main surface; wherein the at least one groove comprises a groove having a length formed in each of the first and second main surfaces of each of the first and second quartz crystal tuning fork tines so that a width of the groove formed in each of the first and second main surfaces of each of the first and second quartz crystal tuning fork tines is greater than or equal to a distance in the width direction of the groove measured from an outer edge of the groove to an outer edge of the corresponding one of the first and second quartz crystal tuning fork tines and less than a spaced-apart distance between the first and second quartz crystal tuning fork tines, and a length of the groove formed in each of the first and second main surfaces of each of the first and second quartz crystal tuning fork tines is within a range of 40% to 80% of a length of each of the first and second quartz crystal tuning fork tines and less than 1.29 mm; wherein the quartz crystal tuning fork resonator has an overall length, and a series resistance $R_1$ of the fundamental mode of vibration and a series resistance $R_2$ of the second overtone mode of vibration; wherein each of the length of the groove formed in each of the first and second main surfaces of each of the first and second quartz crystal tuning fork tines and the overall length of the quartz crystal tuning fork resonator is determined so that $R_1$ is less than $0.86R_2$; wherein the case is a ceramics case having an interior space and a mounting portion in the interior space, and a through-hole; wherein the lid is a metal lid or a glass lid; wherein the quartz crystal tuning fork base has a first base portion including a first width $W_5$ and a second base portion including a second width $W_6$ greater than or equal to the first width $W_5$ so that two cut portions are formed between the first and second base portions of the quartz crystal tuning fork base, each of the first and second quartz crystal tuning fork tines being connected to the first base portion of the quartz crystal tuning fork base; wherein the second base portion of the quartz crystal tuning fork base is mounted on the mounting portion in the interior space of the ceramics case by a conductive adhesive or a solder; wherein the metal lid or the glass lid is connected to the ceramics case to cover an open end of the ceramics case; wherein a metal or a glass is disposed in the through-hole of the ceramics case to close the through-hole thereof in a vacuum; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

13. An electronic apparatus according to claim 11; wherein the quartz crystal tuning fork resonator has a merit value $M_1$ of the fundamental mode of vibration, the merit value M, being defined by the ratio $(Q_1/r_1)$; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_1$ of the fundamental mode of vibration of the quartz crystal tuning fork resonator is greater than the merit value $M_2$ of the second overtone mode of vibration thereof, and the capacitance ratio $r_2$ of the second overtone mode of vibration thereof is greater than 1500; wherein the opposite main surfaces have a first main surface and a second main surface; and wherein the at least one groove comprises a groove formed in at least one of the first and second main surfaces of each of the first and second quartz crystal tuning fork tines so that a width of the groove formed in the at least one of the first and second main surfaces of each of the first and second quartz crystal tuning fork tines is less than a spaced-apart distance between the first and second quartz crystal tuning fork tines, and a length of the groove formed in the at least one of the first and second main surfaces of each of the first and second quartz crystal tuning fork tines is less than 1.29 mm.

14. An electronic apparatus according to claim 13; wherein each of the first and second quartz crystal tuning fork tines has a width; wherein the width of each of the first and second quartz crystal tuning fork tines is greater than 0.05 mm and less than 0.1 mm; wherein a distance in the width direction of the groove measured from an outer edge of the groove to an outer edge of the corresponding one of the first and second quartz crystal tuning fork tines is less than 0.015 mm; wherein the quartz crystal tuning fork resonator has an overall length within a range of 1.2 mm to 2 mm; and wherein the quartz crystal tuning fork base has a length less than 0.5 mm.

15. An electronic apparatus according to claim 14; wherein the quartz crystal tuning fork base has a first base portion including a first width $W_5$ and a second base portion including a second width $W_6$ so that two cut portions are formed between the first and second base portions of the quartz crystal tuning fork base, each of the first and second quartz crystal tuning fork tines being connected to the first base portion of the quartz crystal tuning fork base; wherein the second base portion of the quartz crystal tuning fork base has a length $l_4$ within a range of 0.05 mm to 0.3 mm, and a first side surface and a second side surface opposite the first side surface; wherein a first frame is connected to the first side surface of the second base portion of the quartz crystal tuning fork base and a second frame is connected to the second side surface of the second base portion of the quartz crystal tuning fork base so that each of the first and second frames extends in a common direction with the first and second quartz crystal tuning fork tines outside the first and second quartz crystal tuning fork tines; wherein the case is a ceramics case having an interior space and first and second mounting portions in the interior space; wherein the first frame is mounted on the first mounting portion in the interior space of the ceramics case by a first adhesive and the second frame is mounted on the second mounting portion in the interior space of the ceramics case by a second adhesive; wherein a first electrode is disposed on a surface of each of the first and second frames and a second electrode is disposed on a surface of each of the first and second mounting portions in the interior space of the ceramics case; wherein the first electrode disposed on the surface of the first frame is connected to the second electrode disposed on the surface of the first mounting portion in the interior space of the ceramics case through the first adhesive and the first electrode disposed on the surface of the second frame is connected to the second electrode disposed on the surface of the second mounting portion in the interior space of the ceramics case through the second adhesive; wherein the lid is a metal lid or a glass lid; wherein the metal lid or the glass lid is connected to the ceramics case to cover an open end of the ceramics case; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

16. An electronic apparatus according to claim 11; wherein the quartz crystal tuning fork resonator has a merit value $M_1$ of the fundamental mode of vibration, the merit value $M_1$ being defined by the ratio $(Q_1/r_1)$; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_f$ of the fundamental mode of vibration of the quartz crystal tuning fork resonator is greater than 65 and the capacitance ratio $r_2$ of the second overtone mode of vibration thereof is greater than 1500, and the quality factor $Q_1$ of the fundamental mode of vibration of the quartz crystal tuning fork resonator is less than the quality factor $Q_2$ of the second overtone mode of vibration thereof; wherein the opposite main surfaces have a first main surface and a second main surface; wherein the at least one groove comprises a groove formed in at least one of the first and second main surfaces of each of the first and second quartz crystal tuning fork tines so that a width of the groove formed in the at least one of the first and second main surfaces of each of the first and second quartz crystal tuning fork tines is less than a spaced-apart distance between the first and second quartz crystal tuning fork tines and a length of the groove formed in the at least one of the first and second main surfaces of each of the first and second quartz crystal tuning fork tines is less than 1.29 mm; wherein the case has an interior space and a mounting portion in the interior space; wherein the lid is a metal lid or a glass lid; wherein the metal lid or the glass lid is connected to the case to cover an open end of the case; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

17. An electronic apparatus according to claim 11; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the quality factor $Q_1$ of the fundamental mode of vibration of the quartz crystal tuning fork resonator is less than the quality factor $Q_2$ of the second overtone mode of vibration thereof; wherein the opposite main surfaces have a first main surface and a second main surface; wherein the at least one groove comprises a groove formed in at least one of the first and second main surfaces of each of the first and second quartz crystal tuning fork tines so that a width of the groove formed in the at least one of the first and second main surfaces of each of the first and second quartz crystal tuning fork tines is less than a spaced-apart distance between the first and second quartz crystal tuning fork tines, and a length of the groove formed in the at least one of the first and second main surfaces of each of the first and second quartz crystal tuning fork tines is less than 1.29 mm; wherein the case has an interior space and a mounting portion in the interior space; wherein the lid is a metal lid or a glass lid; wherein the quartz crystal tuning fork resonator is mounted on the mounting portion in the interior space of the case; wherein the metal lid or the glass lid is connected to the case to cover an open end of the case in a vacuum; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

18. An electronic apparatus according to claim 11; wherein the first quartz crystal oscillating circuit comprises an amplification circuit having the first amplifier and a feedback circuit having the first capacitors and the first quartz crystal unit including the quartz crystal tuning fork resonator; wherein the amplification circuit of the first quartz crystal oscillating circuit has a negative resistance $-RL_1$ of the fundamental mode of vibration of the quartz crystal tuning fork resonator and a negative resistance $-RL_2$ of the second overtone mode of vibration thereof, $|-RL_1|$ representing the absolute value of the negative resistance $-RL_1$ and $|-RL_2|$ representing the absolute value of the negative resistance $-RL_2$; wherein the quartz crystal tuning fork resonator has an angular frequency $\omega_1$ of the fundamental mode of vibration and an angular frequency $\omega_2$ of the second overtone mode of vibration; wherein a rise time $t_{r1}$ of the fundamental mode of vibration of the quartz crystal tuning fork resonator in the first quartz crystal oscillating circuit is defined by $t_{r1}=kQ_1/(\omega_1(-1+|-RL_1|/R_1))$ and a rise time $t_{r2}$ of the second overtone mode of vibration of the quartz crystal tuning fork resonator therein is defined by $t_{r2}=kQ_2/(\omega_2(-1+|RL_2|/R_2))$, where k is a constant value; and wherein each of $|-RL_1|$, $|RL_2|$ and the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the rise time $t_{r1}$ of the fundamental mode of vibration of the quartz crystal tuning fork resonator is less than the rise time $t_{r2}$ of the second overtone mode of vibration thereof.

19. An electronic apparatus according to claim 10; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the capacitance ratio $r_1$ of the fundamental mode of vibration of the quartz crystal tuning fork resonator is less than the capacitance ratio $r_2$ of the second overtone mode of vibration thereof.

20. An electronic apparatus according to claim 19; wherein the quartz crystal tuning fork resonator has a merit value $M_1$ of the fundamental mode of vibration, the merit value $M_1$ being defined by the ratio $(Q_1/r_1)$; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_1$ of the fundamental mode of vibration of the quartz crystal tuning fork resonator is greater than 65 and the capacitance ratio $r_2$ of the second overtone mode of vibration thereof is greater than 1500; wherein a spaced-apart distance between the first and second quartz crystal tuning fork tines is in the range of 0.05 mm to 0.35 mm; wherein the opposite main surfaces have a first main surface and a second main surface, each of the first and second main surfaces of each of the first and second quartz crystal tuning fork tines having a central linear portion; wherein the quartz crystal tuning fork resonator has an overall length, and a series resistance $R_1$ of the fundamental mode of vibration and a series resistance $R_2$ of the second overtone mode of vibration; wherein the at least one groove comprises a groove having a length formed in the central linear portion of each of the first and second main surfaces of each of the first and second quartz crystal tuning fork tines so that a width of the groove formed in the central linear portion of each of the first and second main surfaces of each of the first and second quartz crystal tuning fork tines is in the range of 0.03 mm to 0.12 mm and less than the spaced-apart distance between the first and second quartz crystal tuning fork tines, and a length of the groove formed in the central linear portion of each of the first and second main surfaces of each of the first and second quartz crystal tuning fork tines is within a range of 20% to 78% of the overall length of the quartz crystal tuning fork resonator and less than 1.29 mm; wherein each of the length of the groove formed in the central linear portion of each of the first and second main surfaces of each of the first and second quartz crystal tuning fork tines and the overall length of the quartz crystal tuning fork resonator is determined so that $R_1$ is less than 0.86$R_2$; wherein the case is a ceramics case having an interior space and a mounting portion in the interior space, and a through-hole; wherein the lid is a metal lid or a glass lid; wherein the quartz crystal tuning fork base has a first base portion including a first width $W_5$ and a second base portion including a second width $W_6$ greater than or equal to the first width $W_5$ so that two cut portions are formed between the first and second base portions of the quartz crystal tuning fork base, each of the first and second quartz crystal tuning fork tines being connected to the first base portion of the quartz crystal tuning fork base; wherein the second base portion of the quartz crystal tuning fork base is mounted on the mounting portion in the interior space of the ceramics case by a conductive adhesive; wherein the metal lid or the glass lid is connected to the ceramics case to cover an open end of the ceramics case; wherein a metal or a glass is disposed in the through-hole of the ceramics case to close the through-hole thereof in a vacuum; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

21. An electronic apparatus according to claim 20; wherein the groove is formed in the central linear portion of each of the first and second main surfaces of each of the first and second quartz crystal tuning fork tines so that the oscillation frequency of the fundamental mode of vibration of the quartz crystal tuning fork resonator comprises a first preselected oscillation frequency and a turning point of the quartz crystal tuning fork resonator is in the range of 15° C. to 35° C.; wherein a metal film is formed on at least one of the opposite main surfaces of each of the first and second quartz crystal tuning fork tines so that the oscillation frequency of the fundamental mode of vibration of the quartz crystal tuning fork resonator comprises a second preselected oscillation frequency; wherein the metal film formed on the at least one of the opposite main surfaces of each of the first and second quartz crystal tuning fork tines is trimmed so that the oscillation frequency of the fundamental mode of vibration of the quartz crystal tuning fork resonator comprises a third preselected oscillation frequency; and wherein the oscillation frequency of the fundamental mode of vibration of the quartz crystal tuning fork resonator is adjusted so that the oscillation frequency of the fundamental mode of vibration thereof comprises a fourth preselected oscillation frequency.

22. An electronic apparatus according to claim 21; wherein the groove formed in the central linear portion of each of the first and second main surfaces of each of the first and second quartz crystal tuning fork tines has a base portion; wherein the groove is formed in the central linear portion of each of the first and second main surfaces of each of the first and second quartz crystal tuning fork tines so that a thickness of the base portion of the groove formed in the central linear portion of each of the first and second main surfaces of each of the first and second quartz crystal tuning fork tines is less than 0.05 mm and the first preselected oscillation frequency is in the range of 32.78 kHz to 34.4 kHz; wherein the second preselected oscillation frequency is lower than 32.73 kHz; wherein the third preselected oscillation frequency is about 32.768 kHz with a frequency deviation within a range of −9000 ppm to +5000 ppm; and wherein the fourth preselected oscillation frequency is about 32.768 kHz with a frequency deviation within a range of −100 ppm to +100 ppm.

23. An electronic apparatus according to claim 22; wherein the metal film formed on the at least one of the opposite main surfaces of each of the first and second quartz crystal tuning fork tines is trimmed in a quartz crystal wafer using a laser so that the oscillation frequency of the fundamental mode of vibration of the quartz crystal tuning fork resonator comprises a fifth preselected oscillation frequency; and wherein the fifth preselected oscillation frequency is about 32.768 kHz with a frequency deviation within a range of −9000 ppm to +100 ppm.

24. An electronic apparatus according to claim 19; wherein the quartz crystal tuning fork resonator has a merit value $M_1$ of the fundamental mode of vibration, the merit value $M_1$ being defined by the ratio ($Q_1/r_1$); wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value M, of the fundamental mode of vibration of the quartz crystal tuning fork resonator is greater than the merit value $M_2$ of the second overtone mode of vibration thereof; wherein the opposite main surfaces have a first main surface and a second main surfaces; wherein the at least one groove comprises a groove formed in at least one of the first and second main surfaces of each of the first and second quartz crystal tuning fork tines so that a length of the groove formed in the at least one of the first and second main surfaces of each of the first and second quartz crystal tuning fork tines is less than 1.29 mm; wherein the case is a ceramics case having an interior space and a mounting portion in the interior space; wherein the lid is a metal lid or a glass lid; wherein the quartz crystal tuning fork resonator is mounted on the mounting portion in the interior space of the ceramics case; wherein the metal lid or the glass lid is connected to the ceramics case to cover an open end of the ceramics case; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

25. An electronic apparatus according to claim 24; wherein a metal film is formed on at least one of the opposite main surfaces of each of the first and second quartz crystal tuning fork tines so that the oscillation frequency of the fundamental mode of vibration of the quartz crystal tuning fork resonator comprises a first preselected oscillation frequency; wherein the metal film formed on the at least one of the opposite main surfaces of each of the first and second quartz crystal tuning fork tines is trimmed so that the oscillation frequency of the fundamental mode of vibration of the quartz crystal tuning fork resonator comprises a second preselected oscillation frequency; wherein the oscillation frequency of the fundamental mode of vibration of the quartz crystal tuning fork resonator is adjusted so that the oscillation frequency of the fundamental mode of vibration thereof comprises a third preselected oscillation frequency; and wherein the groove is formed in each of the first and second main surfaces of each of the first and second quartz crystal tuning fork tines so that the oscillation frequency of the fundamental mode of vibration of the quartz crystal tuning fork resonator comprises a fourth preselected oscillation frequency.

26. An electronic apparatus according to claim 25; wherein the first preselected oscillation frequency is lower than 32.73 kHz; wherein the second preselected oscillation frequency is about 32.768 kHz with a frequency deviation within a range of −9000 ppm to +5000 ppm; and wherein the third preselected oscillation frequency is about 32.768 kHz with a frequency deviation within a range of −100 ppm to +100 ppm.

27. An electronic apparatus according to claim 26; wherein the groove formed in each of the first and second main surfaces of each of the first and second quartz crystal tuning fork tines has a base portion; and wherein the groove is formed in each of the first and second main surfaces of each of the first and second quartz crystal tuning fork tines so that a thickness of the base portion of the groove formed in each of the first and second main surfaces of each of the first and second quartz crystal tuning fork tines is less than 0.05 mm and the fourth preselected oscillation frequency is in the range of 32.78 kHz to 34.4 kHz, and a turning point of the quartz crystal tuning fork resonator is in the range of 15° C. to 35° C.

28. An electronic apparatus according to claim 24; wherein the quartz crystal tuning fork resonator is formed in a quartz crystal wafer and has a metal film formed on at least one of the opposite main surfaces of each of the first and second quartz crystal tuning fork tines so that the oscillation frequency of the fundamental mode of vibration of the quartz crystal tuning fork resonator is greater than 31.6 kHz and less than 32.69 kHz; and wherein the metal film formed on the at least one of the opposite main surfaces of each of the first and second quartz crystal tuning fork tines is trimmed in the quartz crystal wafer using a laser so that the oscillation frequency of the fundamental mode of vibration of the quartz crystal tuning fork resonator is about 32.768 kHz with a frequency deviation within a range of −9000 ppm to +5000 ppm.

29. An electronic apparatus according to claim 10; wherein the quartz crystal tuning fork resonator has a merit value $M_1$ of the fundamental mode of vibration, the merit value $M_1$ being defined by the ratio ($Q_1/r_1$); wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_1$ of the fundamental mode of vibration of the quartz crystal tuning fork resonator is greater than the merit value $M_2$ of the second overtone mode of vibration thereof, and the capacitance ratio $r_1$ of the fundamental mode of vibration of the quartz crystal tuning fork resonator is less than the capacitance ratio $r_2$ of the second overtone mode of vibration thereof and the capacitance ratio $r_2$ of the second overtone mode of vibration thereof is greater than 1500; wherein the opposite main surfaces have a first main surface and a second main surfaces; wherein the at least one groove comprises a groove formed in at least one of the first and second main surfaces of each of the first and second quartz crystal tuning fork tines so that a length of the groove formed in the at least one of the first and second main surfaces of each of the first and second quartz crystal tuning fork tines is less than 1.29 mm; wherein the case is a tubular case having two lead wires; wherein the lid is a metal lid; wherein the quartz crystal tuning fork base is mounted on the two lead wires of the tubular case by a solder or a conductive adhesive; wherein the tubular case is covered by the metal lid in a vacuum; and wherein the clock signal for use in operation of the electronic apparatus to display time information at the display portion has an oscillation frequency of the fundamental mode of vibration of the quartz crystal tuning fork resonator and the oscillation frequency of the fundamental mode of vibration thereof is about 32.768 kHz with a frequency deviation within a range of −100 ppm to +100 ppm.

30. An electronic apparatus according to claim 10; wherein the quartz crystal tuning fork resonator has a merit value $M_1$ of the fundamental mode of vibration, the merit value $M_1$ being defined by ($Q_1/r_1$); wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_1$ of the fundamental mode of vibration of the quartz crystal tuning fork resonator is greater than 65 and the capacitance ratio $r_2$ of the second overtone mode of vibration thereof is greater than 1500; wherein the opposite main surfaces have a first main surface and a second main surfaces; and wherein the at least one groove comprises a groove formed in at least one of the first and second main surfaces of each of the first and second quartz crystal tuning fork tines so that a length of the groove formed in the at least one of the first and second main surfaces of each of the first and second quartz crystal tuning fork tines is less than 1.29 mm.

31. An electronic apparatus according to claim 10; wherein the quartz crystal tuning fork resonator has a cutting angle and a piezoelectric constant $e'_{12}$ to drive the quartz crystal tuning fork resonator; and wherein each of the cutting angle of the quartz crystal tuning fork resonator and the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the piezoelectric constant $e'_{12}$ of the quartz crystal tuning fork resonator is in the range of 0.12 C/m$^2$ to 0.19 C/m$^2$ in the absolute value.

32. An electronic apparatus according to claim 10; wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the capacitance ratio $r_2$ of the second overtone mode of vibration of the quartz crystal tuning fork resonator is greater than 1500; and wherein the at least one groove is formed in the at least one of the opposite main surfaces of each of the first and second quartz crystal tuning fork tines so that a width of the at least one groove formed in the at least one of the opposite main surfaces of each of the first and second quartz crystal tuning fork tines is greater than or equal to a distance in the width direction of the at least one groove measured from an outer edge of the first surface of the at least one groove to an outer edge of the at least one side surface of the corresponding one of the first and second quartz crystal tuning fork tines and a length of the at least one groove formed in the at least one of the opposite main surfaces of each of the first and second quartz crystal tuning fork tines is less than 1.29 mm.

33. An electronic apparatus according to claim 32; wherein the quartz crystal tuning fork resonator has an oscillation frequency of the fundamental mode of vibration; wherein the at least one groove formed in the at least one of the opposite main surfaces of each of the first and second quartz crystal tuning fork tines has a base portion; wherein the at least one groove is formed in the at least one of the opposite main surfaces of each of the first and second quartz crystal tuning fork tines so that a thickness of the base portion of the at least one groove formed in the at least one of the opposite main surfaces of each of the first and second quartz crystal tuning fork tines is less than 0.05 mm and the oscillation frequency of the fundamental mode of vibration of the quartz crystal tuning fork resonator is in the range of 32.78 kHz to 34.4 kHz, and a turning point of the quartz crystal tuning fork resonator is in the range of 15° C. to 35° C.; wherein a metal film is formed on at least one of the opposite main surfaces of each of the first and second quartz crystal tuning fork tines so that the oscillation frequency of the fundamental mode of vibration of the quartz crystal tuning fork resonator is lower than 32.73 kHz; and wherein the metal film formed on the at least one of the opposite main surfaces of each of the first and second quartz crystal tuning fork tines is trimmed so that the oscillation frequency of the fundamental mode of vibration of the quartz crystal tuning fork resonator is about 32.768 kHz with a frequency deviation within a range of −9000 ppm to +5000 ppm.

34. An electronic apparatus according to claim 10; wherein the opposite main surfaces have a first main surface and a second main surface; wherein the at least one groove comprises a groove formed in at least one of the first and second main surfaces of each of the first and second quartz crystal tuning fork tines so that a distance in the width direction of the groove measured from an outer edge of the groove to an outer edge of the corresponding one of the first and second quartz crystal tuning fork tines is less than 0.015 mm; wherein a length of the groove formed in the at least one of the first and second main surfaces of each of the first and second quartz crystal tuning fork tines is less than 1.29 mm; wherein the quartz crystal tuning fork resonator has an overall length less than 2.18 mm; and wherein the quartz crystal tuning fork base has a length less than 0.5 mm.

35. An electronic apparatus according to claim 34; wherein the length of the quartz crystal tuning fork base is within a range of 0.12 mm to 0.255 mm or within a range of 0.264 mm to 0.277 mm or within a range of 0.29 mm to 0.48 mm.

36. An electronic apparatus according to claim 10; wherein the quartz crystal tuning fork resonator has a merit value $M_1$ of the fundamental mode of vibration, the merit value $M_1$ being defined by the ratio ($Q_1/r_1$); wherein the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the merit value $M_1$ of the fundamental mode of vibration of the quartz crystal tuning fork resonator is greater than 65, and the capacitance ratio $r_1$ of the fundamental mode of vibration of the quartz crystal tuning fork resonator is less than the capacitance ratio $r_2$ of the second overtone mode of vibration thereof; wherein the first quartz crystal oscillating circuit comprises an amplification circuit having the first amplifier and a feedback circuit having the first capacitors and the first quartz crystal unit including the quartz crystal tuning fork resonator; wherein the amplification circuit of the first quartz crystal oscillating circuit has a negative resistance $-RL_1$ of the fundamental mode of vibration of the quartz crystal tuning fork resonator and a negative resistance $-RL_2$ of the second overtone mode of vibration thereof, $|-RL_1|$ representing the absolute value of the negative resistance $-RL_1$ and $|-RL_2|$ representing the absolute value of the negative resistance $-RL_2$; wherein the quartz crystal tuning fork resonator has an angular frequency $\omega_1$ of the fundamental mode of vibration and an angular frequency $\omega_2$ of the second overtone mode of vibration; wherein a rise time $t_{r1}$ of the fundamental mode of vibration of the quartz crystal tuning fork resonator in the first quartz crystal oscillating circuit is defined by $t_{r1}=kQ_1/(\omega_1(-1+|-RL_1|/R_1))$ and a rise time $t_{r2}$ of the second overtone mode of vibration of the quartz crystal tuning fork resonator therein is defined by $t_{r2}=kQ_2/(\omega_2(-1+|-RL_2|/R_2))$, where k is a constant value; and wherein each of $|-RL_1|$, $|RL_2|$ and the dimension of each of the quartz crystal tuning fork shape, the at least one groove formed in the at least one of the opposite main surfaces of each of the first and second quartz crystal tuning fork tines and the electrode disposed on the at least one of the first and second surfaces of the at least one groove formed in the at least one of the opposite main surfaces of each of the first and second quartz crystal tuning fork tines is determined so that the rise time $t_{r1}$ of the fundamental mode of vibration of the quartz crystal tuning fork resonator is less than the rise time $t_{r2}$ of the second overtone mode of vibration thereof.

37. An electronic apparatus according to claim 36; wherein the quartz crystal tuning fork base has a first base portion including a first width $W_5$ and a second base portion including a second width $W_6$ greater than or equal to the first width $W_5$ so that two cut portions are formed between the first and second base portions of the quartz crystal tuning fork base, each of the first and second quartz crystal tuning fork tines being connected to the first base portion of the quartz crystal tuning fork base; wherein a spaced-apart distance between the first and second quartz crystal tuning fork tines is in the range of 0.05 mm to 0.35 mm; wherein the quartz crystal tuning fork resonator has an oscillation frequency of the fundamental mode of vibration; wherein the opposite main surfaces have a first main surface and a second main surface, each of the first and second main surfaces of each of the first and second quartz crystal tuning fork tines having a central linear portion; wherein the at least one groove comprises a groove having a base portion formed in the central linear portion of each of the first and second main surfaces of each of the first and second quartz crystal tuning fork tines so that a width of the groove formed in the central linear portion of each of the first and second main surfaces of each of the first and second quartz crystal tuning fork tines is in the range of 0.03 mm to 0.12 mm and less than the spaced-apart distance between the first and second quartz crystal tuning fork tines, a length of the groove formed in the central linear portion of each of the first and second main surfaces of each of the first and second quartz crystal tuning fork tines is within a range of 40% to 80% of a length of each of the first and second quartz crystal tuning fork tines and less than 1.29 mm, a turning point of the quartz crystal tuning fork resonator is in the range of 15° C. to 35° C., a thickness of the base portion of the groove formed in the central linear portion of each of the first and second main surfaces of each of the first and second quartz crystal tuning fork tines is less than 0.05 mm and the oscillation frequency of the fundamental mode of vibration of the quartz crystal tuning fork resonator is in the range of 32.78 kHz to 34.4 kHz; wherein a metal film is formed on at least one of the opposite main surfaces of each of the first and second quartz crystal tuning fork tines so that the oscillation frequency of the fundamental mode of vibration of the quartz crystal tuning fork resonator comprises a first preselected oscillation frequency; wherein the first preselected oscillation frequency is greater than 31.6 kHz and less than 32.69 kHz; wherein the metal film formed on the at least one of the opposite main surfaces of each of the first and second quartz crystal tuning fork tines is trimmed in a quartz crystal wafer so that the oscillation frequency of the fundamental mode of vibration of the quartz crystal tuning fork resonator comprises a second preselected oscillation frequency; wherein the second preselected oscillation frequency is about 32.768 kHz with a frequency deviation within a range of −9000 ppm to +5000 ppm; wherein the oscillation frequency of the fundamental mode of vibration of the quartz crystal tuning fork resonator is adjusted so that the oscillation frequency of the fundamental mode of vibration thereof comprises a third preselected oscillation frequency; wherein the third preselected oscillation frequency is about 32.768 kHz with a frequency deviation within a range of −100 ppm to +100 ppm; wherein the case is a ceramics case having an interior space and a mounting portion in the interior space, and a through-hole; wherein the quartz crystal tuning fork resonator is mounted on the mounting portion in the interior space of the ceramics case; wherein the lid is a metal lid or a glass lid; wherein the metal lid or the glass lid is connected to the ceramics case to cover an open end of the ceramics case; wherein a metal or a glass is disposed in the through-hole of the ceramics case to close the through-hole thereof in a vacuum; and wherein the clock signal for use in operation of the electronic apparatus to display time information at the display portion has the third preselected oscillation frequency of about 32.768 kHz with the frequency deviation within the range of −100 ppm to +100 ppm.

38. An electronic apparatus according to claim 36; wherein a spaced-apart distance between the first and second quartz crystal tuning fork tines is in the range of 0.05 mm to 0.35 mm; wherein the quartz crystal tuning fork resonator has an oscillation frequency of the fundamental mode of vibration; wherein the opposite main surfaces have a first main surface and a second main surface; wherein the at least one groove comprises a groove having a base portion formed in each of the first and second main surfaces of each of the first and second quartz crystal tuning fork tines so that a width of the groove formed in each of the first and second main surfaces of each of the first and second quartz crystal tuning fork tines is in the range of 0.03 mm to 0.12 mm and less than the spaced-apart distance between the first and second quartz crystal tuning fork tines, a length of the groove formed in each of the first and second main surfaces of each of the first and second quartz crystal tuning fork tines is within a range of 30% to 80% of a length of each of the first and second quartz crystal tuning fork tines and less than 1.29 mm, a turning point of the quartz crystal tuning fork resonator is in the range of 15° C. to 35° C., a thickness of the base portion of the groove formed in each of the first and second main surfaces of each of the first and second quartz crystal tuning fork tines is less than 0.05 mm and the oscillation, frequency of the fundamental mode of vibration of the quartz crystal tuning fork resonator is in the range of 32.78 kHz to 34.4 kHz; wherein a metal film is formed on at least one of the opposite main surfaces of each of the first and second quartz crystal tuning fork tines so that the oscillation frequency of the fundamental mode of vibration of the quartz crystal tuning fork resonator comprises a first preselected oscillation frequency; wherein the first preselected oscillation frequency is lower than 32.73 kHz; wherein the metal film formed on the at least one of the opposite main surfaces of each of the first and second quartz crystal tuning fork tines is trimmed so that the oscillation frequency of the fundamental mode of vibration of the quartz crystal tuning fork resonator comprises a second preselected oscillation frequency; wherein the second preselected oscillation frequency is about 32.768 kHz with a frequency deviation within a range of −9000 ppm to +100 ppm; wherein the oscillation frequency of the fundamental mode of vibration of the quartz crystal tuning fork resonator is adjusted so that the oscillation frequency of the fundamental mode of vibration thereof comprises a third preselected oscillation frequency; wherein the third preselected oscillation frequency is about 32.768 kHz with a frequency deviation within a range of −100 ppm to +100 ppm; wherein the case is a ceramics case having an interior space and a mounting portion in the interior space; wherein the quartz crystal tuning fork resonator is mounted on the mounting portion in the interior space of the ceramics case; wherein the lid is a metal lid or a glass lid; wherein the metal lid or the glass lid is connected to the ceramics case to cover an open end of the ceramics case; and wherein the clock signal for use in operation of the electronic apparatus to display time information at the display portion has the third preselected oscillation frequency of about 32.768 kHz with the frequency deviation within the range of −100 ppm to +100 ppm.

* * * * *